United States Patent [19]

Hileman et al.

[11] Patent Number: 5,605,487
[45] Date of Patent: Feb. 25, 1997

[54] SEMICONDUCTOR WAFER POLISHING APPARTUS AND METHOD

[75] Inventors: Harold J. Hileman, Kirkwood; Robert J. Walsh, Ballwin, both of Mo.; Thomas A. Walsh, Templeton, Calif.

[73] Assignee: MEMC Electric Materials, Inc., St. Peters, Mo.

[21] Appl. No.: 242,560

[22] Filed: May 13, 1994

[51] Int. Cl.$^6$ ................................................. B24B 49/00
[52] U.S. Cl. ................... 451/5; 451/11; 451/41; 451/53; 451/54; 451/56; 451/289
[58] Field of Search ........................ 451/5, 7, 8, 11, 451/41, 53, 54–57, 67, 285, 287, 288, 289, 460; 437/225, 233, 974; 29/33 P

[56] References Cited

U.S. PATENT DOCUMENTS

| | | | |
|---|---|---|---|
| 3,170,273 | 2/1965 | Walsh et al. | 51/281 |
| 3,475,867 | 11/1969 | Walsh | 51/281 |
| 3,492,763 | 2/1970 | Walsh | 51/277 |
| 3,841,031 | 10/1974 | Walsh | 51/283 |
| 3,857,123 | 12/1974 | Walsh | 51/131 |
| 4,141,180 | 2/1979 | Gill, Jr. et al. | 451/289 |
| 4,313,284 | 2/1982 | Walsh | 51/131.4 |
| 4,316,757 | 2/1982 | Walsh | 156/286 |
| 4,450,652 | 5/1984 | Walsh | 51/131.4 |
| 5,256,599 | 10/1993 | Asetta et al. | 451/460 |
| 5,329,732 | 7/1994 | Karlsand et al. | 451/289 |
| 5,361,545 | 11/1994 | Nakamura | 451/287 |

OTHER PUBLICATIONS

Written description of an MEMC automated polishing line first operated in 1980.

"Method of Mounting Wafers" Western Electric Technical digest No. 44, Oct. 1976.

*Primary Examiner*—Maurina T. Rachuba
*Attorney, Agent, or Firm*—Senninger, Powers, Leavitt & Roedel

[57] ABSTRACT

Apparatus for polishing semiconductor wafers comprises a housing, a mounting apparatus within the housing for wax mounting a first face of a semiconductor wafer to a first face of a polishing block, and a first semiconductor wafer polisher within the housing for polishing a second face of the semiconductor wafer. The second face of the semiconductor wafer is opposite the first face of the semiconductor wafer. A first transfer mechanism is within the housing for delivering the polishing block and semiconductor wafer from the mounting apparatus to adjacent the first semiconductor wafer polisher. A controller controls operation of the mounting apparatus, the first semiconductor wafer polisher, and the first transfer mechanism.

67 Claims, 37 Drawing Sheets

SEMICONDUCTOR WAFER POLISHING APPARTUS AND METHOD

BACKGROUND OF THE INVENTION

This invention relates to semiconductor wafer polishers for polishing faces of semiconductor wafers.

The final step in a conventional semiconductor wafer shaping process is a polishing step to produce a highly reflective and damage-free surface on one face of the semiconductor wafer. Polishing of the semiconductor wafer is accomplished by a mechanochemical process in which a rotating polishing pad rubs a polishing slurry against the wafer. In a conventional semiconductor wafer polisher, the wafer is bonded with wax to a polishing block and then held against the rotating polishing pad by a polishing arm.

Semiconductor wafers must be polished particularly flat in preparation for printing circuits on the wafers by an electron beam-lithographic or photolithographic process. Flatness of the wafer surface on which circuits are to be printed is critical in order to maintain resolution of the lines, which can be as thin as 1 micron or less.

Flatness is quantified in part by a Total Thickness Variation measurement (TTV) and Site Total Indicated Reading (STIR). TTV is the difference between the maximum and minimum thicknesses of the wafer. STIR is the sum of the maximum positive and negative deviations of the surface in a small area of the wafer from a reference plane which is parallel to the back surface of the wafer and intersects the front surface at the center of the local site. Total thickness variation in the wafer is a critical indicator of the quality of the polish of the wafer. Preferably, a polished semiconductor wafer will have a TTV of less than one micron and a STIR of less than one-half micron for any 20 mm×20 mm local site.

In conventional wafer polishing some of the frictional heat generated by the rubbing action of the wafer, polishing pad and slurry is transferred to the polishing block and the polishing turntable. This heat transfer induces temperature gradients through the polishing block and turntable which cause thermal expansion of the polishing block and turntable. The thermal expansion adversely affects the flatness of the polishing block and turntable and therefore adversely affects the flatness of polished wafers, particularly if the thermal expansion is uncontrolled and varies from polishing cycle to polishing cycle. For example, in the idle time between polishing cycles, the induced distortion in the turntable begins to dissipate as its temperature equalizes. If this idle time varies, successively polished wafers may show significant flatness variations.

SUMMARY OF THE INVENTION

Among the several objects of this invention may be noted the provision of an improved apparatus and method for polishing semiconductor wafers; the provision of such an apparatus and method for serially polishing semiconductor wafers in which each semiconductor wafer is wax mounted on a polishing block, polished by a polishing apparatus, and then separated from the polishing block; the provision of such an apparatus and method in which the temperature of each polishing block at the initiation of the polishing step is substantially identical; the provision of such an apparatus and method for minimizing operating variables in the wax mounting and polishing steps so that successive wafers are polished under substantially uniform operating conditions; the provision of such an apparatus and method for minimizing variances in flatness from one polished semiconductor wafer to another; the provision of such an apparatus and method in which temperatures of components of a block-wafer mounting apparatus and polishing apparatus may be controlled during the block-wafer mounting and polishing steps so that deformities of the components caused by thermal expansion do not vary from one mounting/polishing cycle to another; the provision of such an apparatus and method in which the temperatures of the polishing blocks to which the semiconductor wafers are mounted are substantially the same at corresponding points in time during polishing of the wafers; the provision of such an apparatus and method for wax mounting semiconductor wafers on polishing blocks and polishing the wafers in a controlled environment; the provision of such an apparatus and method in which the polishing apparatus is configured for limiting canting of a semiconductor wafer relative to a rotating polishing pad when the wafer is pressed against the pad; the provision of such an apparatus and method in which a component of the polishing apparatus may be altered to increase the flatness of subsequently polished wafers; the provision of such an apparatus and method in which the shape of a polishing pad of the polishing apparatus may be altered to increase the flatness of subsequently polished wafers; and the provision of such an apparatus and method in which unpolished semiconductor wafers are automatically removed from a first cassette, polished, and then inserting into a second cassette.

Generally, apparatus of the present invention for polishing semiconductor wafers comprises a housing, a mounting apparatus within the housing for wax mounting a first face of a semiconductor wafer to a first face of a polishing block, and a first semiconductor wafer polisher within the housing for polishing a second face of the semiconductor wafer. The second face of the semiconductor wafer is opposite the first face of the semiconductor wafer. A first transfer mechanism is within the housing for delivering the polishing block and semiconductor wafer from the mounting apparatus to adjacent the first semiconductor wafer polisher. A controller controls operation of the mounting apparatus, the first semiconductor wafer polisher, and the first transfer mechanism.

In another aspect of the present invention, apparatus for wax mounting a first face of a semiconductor wafer to a first face of a polishing block comprises a semiconductor wafer holder for holding the semiconductor wafer, a wax applicator for applying wax to the first face of the polishing block, and a press for pressing the first face of the semiconductor wafer against the first face of the polishing block. The transfer mechanism is adapted for delivering the polishing block to the wax applicator, for delivering the polishing block to the press after wax is applied to the first face of the polishing block, and for delivering the semiconductor wafer from the wafer holder to the press. A controller controls operation of the transfer mechanism. The wafer holder, wax applicator, and press are circumferentially arranged about the transfer mechanism.

In another aspect of the present invention, apparatus for polishing a semiconductor wafer mounted to a polishing block comprises first and second semiconductor wafer polishers for polishing the semiconductor wafer, and first, second, and third stations adapted for holding the semiconductor wafer and polishing block. The first station is adjacent the first semiconductor wafer polisher. The second station is adjacent both the first and second semiconductor wafer polishers. The third station is adjacent the second semiconductor wafer polisher. The first semiconductor wafer polisher includes a first polishing arm and a first rotatable polishing member adjacent the first polishing arm. The first polishing arm is adapted for drawing the semiconductor wafer and polishing block from the first station and holding the semiconductor wafer against the first polishing member during polishing of the semiconductor wafer by the first polishing member and for thereafter delivering the semiconductor wafer and polishing block to the second station. The second semiconductor wafer polisher includes a second polishing arm and a second rotatable polishing member adjacent the second polishing arm. The second polishing arm is adapted for drawing the semiconductor wafer and polishing block from the second station and holding the semiconductor wafer against the second polishing member during polishing of the semiconductor wafer by the second polishing member and for thereafter delivering the semiconductor wafer and polishing block to the third station.

In another aspect of the present invention, apparatus for polishing semiconductor wafers comprises a polishing member rotatable about a first axis, a chuck adapted to releasably hold a polishing block, and a polishing arm supporting the chuck. A semiconductor wafer is bonded to one face of the polishing block. The polishing arm is adapted to press a polish surface of the semiconductor wafer against the polishing member as the polishing member is rotated for polishing the semiconductor wafer. The chuck has a spindle connected to the polishing arm, a platen, and a bearing assembly operatively connecting the platen to the chuck for rotation of the platen about a second axis. The chuck is adapted to releasably grip the polishing block with a second face of the polishing block opposing the platen. During polishing, the second axis is generally parallel with the first axis and the polishing block and semiconductor wafer rotate with the platen about the second axis. The chuck is configured for holding the polishing block such that an axial distance $D_1$ from an axial midpoint of the bearing assembly to the polish surface of the semiconductor wafer is less than approximately one-third the diameter of the semiconductor wafer.

In another aspect of the present invention, a method of wax mounting a semiconductor wafer to a polishing block having first and second opposite faces comprises applying a wax coating to the first face of the polishing block, heating the second face of the polishing block with steam to thereby heat the wax coating on the first face of the polishing block, vaporizing condensation formed on the second face of the polishing block, and bringing the semiconductor wafer into contact with the wax coating on the first face of the polishing block whereby the semiconductor wafer is bonded to the polishing block by the wax coating.

In another aspect of the present invention, a method of polishing semiconductor wafers comprises securing a semiconductor wafer to a polishing block so that a first face of the semiconductor wafer opposes a first face of the polishing block, polishing a second face of the semiconductor wafer with a rotating polishing member wherein the polishing block presses the semiconductor wafer against the polishing member during polishing, controlling the temperature of the polishing block at least immediately prior to initiation of the polishing step so that the polishing block temperature at the onset of polishing is approximately equal to a temperature $T_{P1}$, and serially repeating the above steps for a plurality of semiconductor wafers so that the semiconductor wafers are polished one after the other by the polishing member.

In another aspect of the present invention, a method of polishing semiconductor wafers comprises heating a polishing block to a temperature approximately equal to a temperature $T_h$, securing a semiconductor wafer to the polishing block so that a first face of the semiconductor wafer opposes a first face of the polishing block, polishing a second face of the semiconductor wafer with a rotating polishing member whereby the polishing of the semiconductor wafer by the rotating polishing member is initiated a fixed duration $t_{b-p}$ after the semiconductor wafer is secured to the polishing block, and removing the semiconductor wafer from the block. These steps are serially repeated for each of a plurality of semiconductor wafers so that the semiconductor wafers are polished one after the other by the polishing member.

In another aspect of the present invention, a method of polishing a plurality of semiconductor wafers comprises applying a coat of bonding agent to a first face of a first polishing block, bonding a first semiconductor wafer to the first polishing block whereby a first face of the first semiconductor wafer opposes the first face of the first polishing block, polishing a second face of the first semiconductor wafer with a rotating polishing member, and removing the first semiconductor wafer from the first polishing block after completion of polishing of the second face of the first semiconductor wafer by the polishing member. A coat of bonding agent is applied to a first face of a second polishing block before completion of polishing of the second face of the first semiconductor wafer by the polishing member. A second semiconductor wafer is bonded to the second polishing block before completion of polishing of the second face of the first semiconductor wafer by the polishing member. A first face of the second semiconductor wafer opposes the first face of the second polishing block. A second face of the second semiconductor wafer is polished with the rotating polishing member. The second semiconductor wafer is removed from the second polishing block after completion of polishing of the second face of the second semiconductor wafer by the polishing member. A coat of bonding agent is applied to a first face of a third polishing block before completion of polishing of the second face of the first semiconductor wafer by the polishing member, and a third semiconductor wafer is bonded to the third polishing block before completion of polishing of the second face of the second semiconductor wafer by the polishing member, a first face of the third semiconductor wafer opposing the first face of the third polishing block. A second face of the third semiconductor wafer is polished with the rotating polishing member, and the second semiconductor wafer is removed from the second polishing block after completion of polishing of the second face of the second semiconductor wafer by the polishing member. The coat of bonding agent is removed from the first face of the first polishing block and then a second coat of bonding agent is applied to the first face of the first polishing block before completion of polishing of the second face of the third semiconductor wafer by the polishing member. A fourth semiconductor wafer is bonded to the first polishing block before completion of polishing of the second face of the third semiconductor wafer by the polishing member, a first face of the fourth semiconductor wafer opposing the first face of the first polishing member. A second face of the fourth semiconductor wafer is polished with the rotating polishing member.

Other objects and features will be in part apparent and in part pointed out hereinafter.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
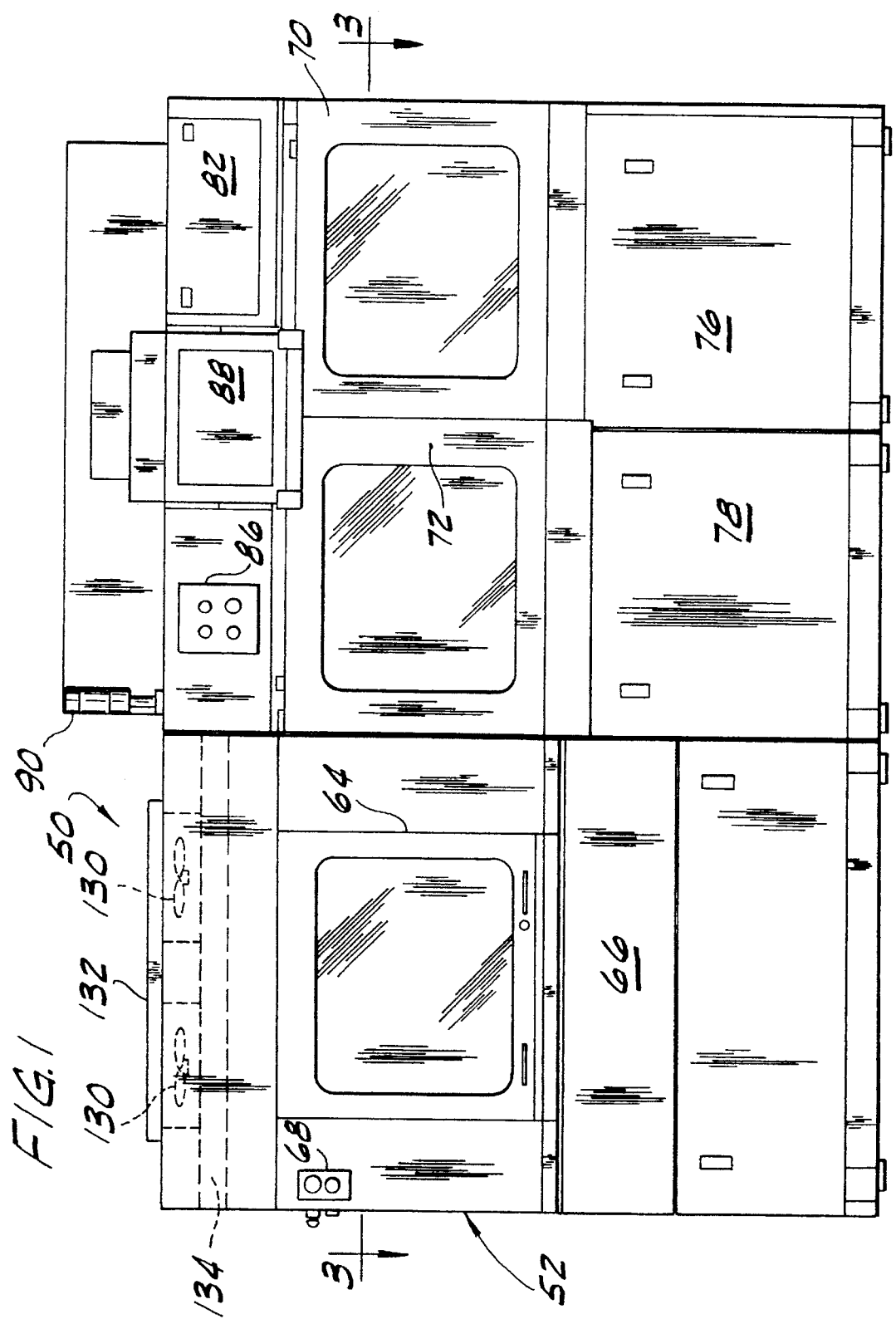
FIG. 1 is a front elevational view of a semiconductor wafer polishing apparatus of this invention.
Figure 2:
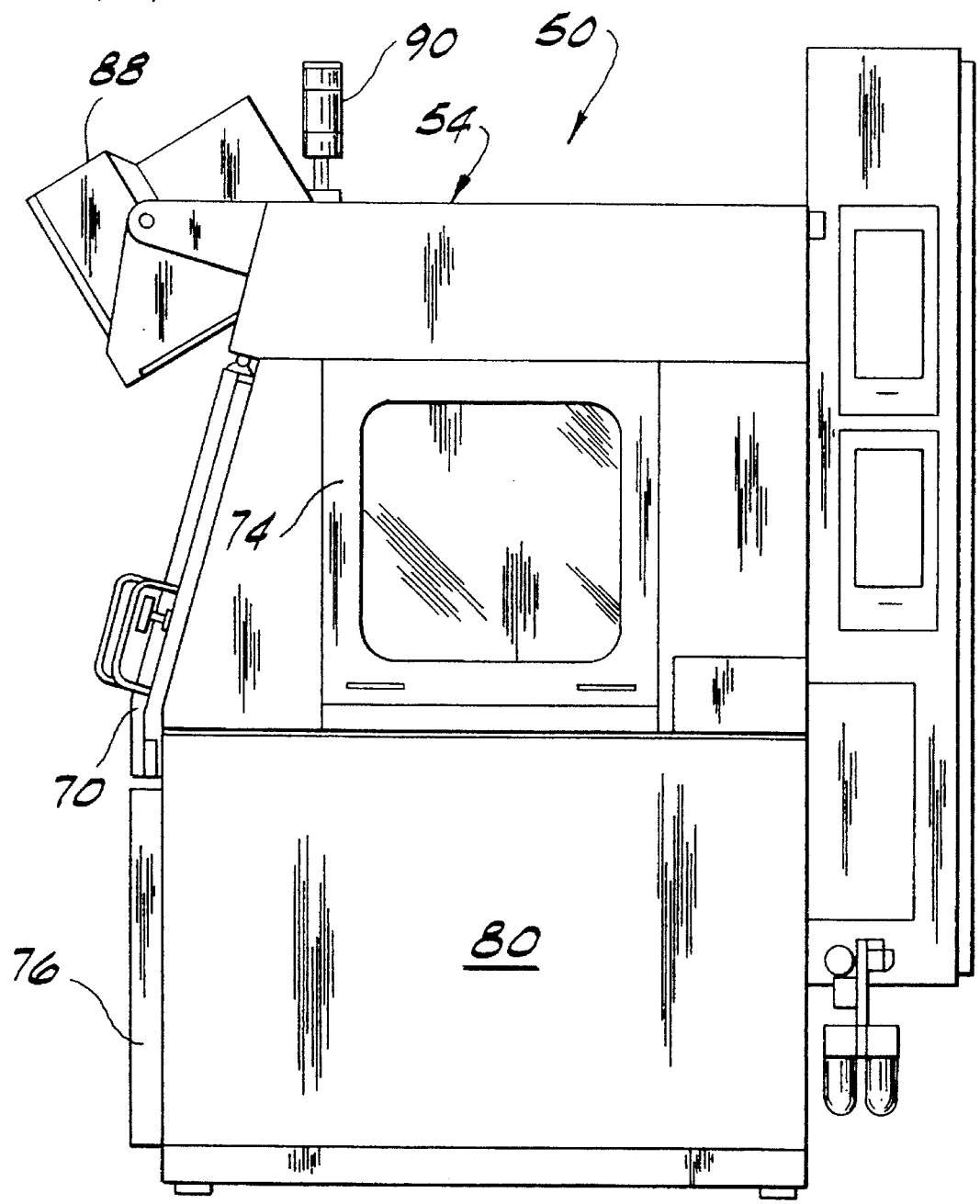
FIG. 2 is a side elevational view of the wafer polishing apparatus of FIG. 1.

Referring now to the drawings, and first more particularly to FIGS. 1–4, a machine of the present invention for mounting and polishing semiconductor wafers is indicated in its entirety by the reference numeral 50. The machine has a first cabinet, generally indicated at 52, and a second cabinet, generally indicated at 54, adjacent to and secured to the first cabinet. The first cabinet 52 houses a semiconductor wafer mounting apparatus, generally indicated at 56 (FIG. 3), for wax mounting semiconductor wafers to ceramic polishing blocks. The second cabinet 54 houses first and second semiconductor wafer polishers, generally indicated at 58 and 60 respectively, for polishing the semiconductor wafers after they are mounted to the polishing blocks, and a linear robot 62 (constituting a first transfer mechanism) for delivering mounted wafers from the mounting apparatus 56 to adjacent the first semiconductor wafer polisher 58. The first and second cabinets 52, 54 combine to form a housing for the components of the machine 50.

The first cabinet 52 has a front operator door 64 (FIG. 1), a side operator door (not shown), a front service door 66 below the front operator door, and a side service door (not shown) below the side operator door. The operator and service doors provides access to the semiconductor wafer mounting apparatus 56. An emergency off-button 68 is at the front of the first cabinet 52 for halting operation of the machine 50.

Figure 4:
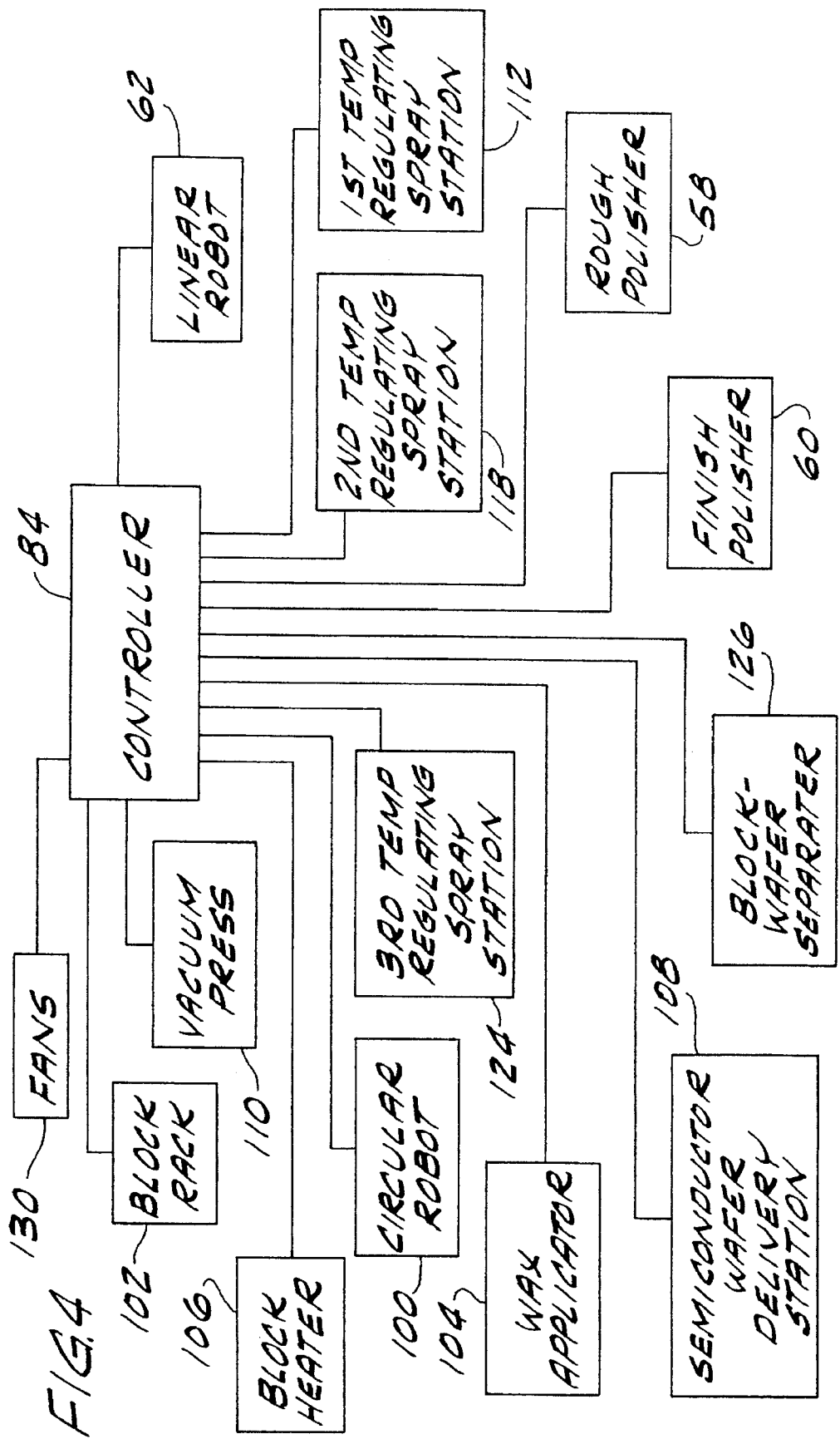
FIG. 4 is a block diagram of the wafer polishing apparatus of FIG. 1.

The second cabinet 54 has first and second front operator doors 70, 72, a side operator door 74, first and second front service doors 76, 78 below the first and second front operator doors, a side service door 80 below the side operator door, and a controller access door 82. The first front operator and service doors 70, 76 and the side operator and service doors 74, 80 provide access to the first (rough) semiconductor wafer polisher 58. The second front operator and service doors 72, 78 provide access to the second (finish) semiconductor wafer polisher 60. The controller access door 82 provides access to a controller 84 (FIG. 4). Preferably, the controller 84 comprises one or more high performance processors, such as an Intel 486® processor for controlling the components of the machine 50. A control panel 86 is at the front of the second cabinet 54 for operating the machine 50 and a video monitor 88 is adjacent the control panel for monitoring operation of the machine. A status light 90 on top of the second cabinet 54 indicates the status of the machine 50 (e.g., a need to insert unpolished wafers or remove polished wafers).

Figure 3:
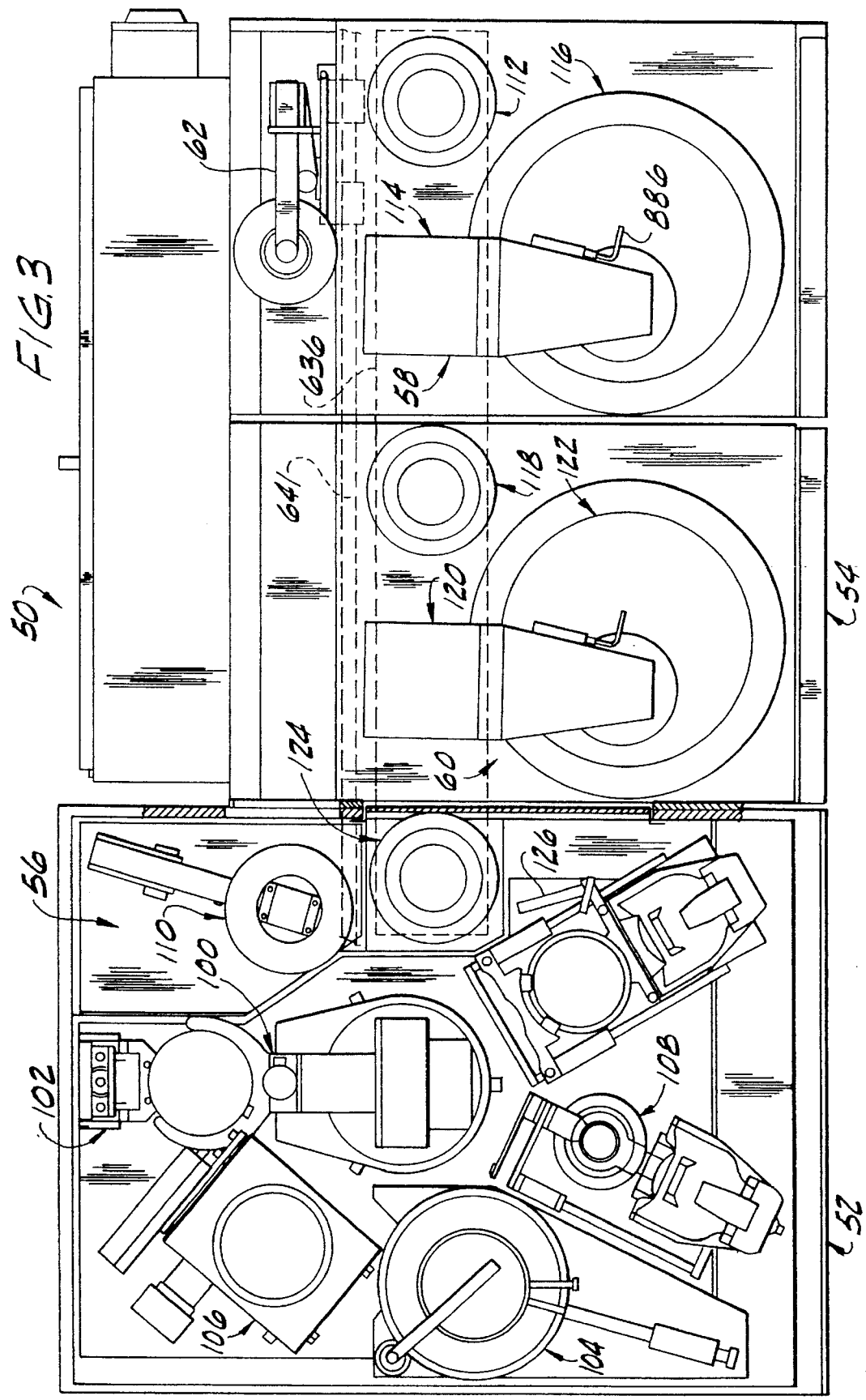
FIG. 3 is a sectional view taken along the plane of line 3—3 of FIG. 1.

Referring now to FIGS. 3 and 4, the semiconductor wafer mounting apparatus 56 is controlled by the controller 84 and comprises a circular robot 100 (constituting a second transfer mechanism), a polishing block rack 102, a wax applicator 104, a polishing block heater 106, a semiconductor wafer delivery station 108, and a vacuum press 110. The block rack 102, wax applicator 104, block heater 106, wafer delivery station 108, and vacuum press 110 are circumferentially arranged about the circular robot 100.

The machine 50 has many sensors (not described in detail) throughout its stations which are coupled to the controller 84. The controller 84 uses the sensors to determine whether various tasks or operations of the stations have been performed. Upon completion of a task, the controller may initiate another.

In general, the controller 84 is operable to activate the circular robot 100 to perform a sequence of steps in which the polishing blocks and semiconductor wafers are moved between the various stations within the first cabinet 52 to effect mounting of the semiconductor wafers to the polishing blocks. More specifically, the circular robot 100 picks up a polishing block from the block rack 102 and places it on the wax applicator 104. The wax applicator 104 is controlled by the controller 84 to apply a wax coating to the polishing block. The circular robot 100 then moves the polishing block to the block heater 106 which is operated by the controller 84 to heat the block and wax. The circular robot 100 picks up a semiconductor wafer from the wafer delivery station 108 and delivers it to the vacuum press 110. After the block heater 106 heats the block, the controller 84 signals the circular robot 100 which then grasps the block and delivers it wax side down to the vacuum press 110. The vacuum press 110 is then operated by the controller 84 to press the waxed surface of the polishing block down against the semiconductor wafer. The heated wax bonds the semiconductor wafer to the polishing block.

The linear robot 62, controlled by the controller 84, moves from right to left as viewed in FIG. 3 to pick up the polishing block and semiconductor wafer from the vacuum press 110 and deliver it to a first temperature regulating spray station 112 adjacent the first semiconductor wafer polisher 58. The first semiconductor wafer polisher 58 constitutes a rough polisher having a first (rough) polishing arm 114 and a first (rough) rotatable polishing table 116. The rough polishing arm 114 is operable via the controller 84 for moving the polishing block and semiconductor wafer from the first temperature regulating spray station 112 to the rough polishing table 116, pressing the semiconductor wafer against the rotating rough polishing table, and then delivering the polishing block and semiconductor wafer to a second temperature regulating spray station 118 adjacent both the first and second semiconductor wafer polishers 58, 60. The second semiconductor wafer polisher 60 constitutes a finish polisher having a second polishing arm 120 and a second polishing table 122. The finish polishing arm 120 is operable via the controller 84 for moving the polishing block and semiconductor wafer from the second temperature regulating spray station 118 to the finish polishing table 122, pressing the semiconductor wafer against the rotating finish polishing table 122, and thereafter delivering the polishing block and semiconductor wafer to a third temperature regulating spray station 124 in the first cabinet 52. The circular robot 100 is adapted for picking up the polishing block and semiconductor wafer from the third temperature regulating spray station 124, inverting them, and placing them on a block-wafer separator 126. The block-wafer separator 126 is operable via the controller 84 for separating the semiconductor wafer from the polishing block.

Preferably, intake fans 130 (FIG. 1) are positioned within the first cabinet 52 above the front operator door 64. The fans 130 are operable via the controller 84 for drawing outside air into the first cabinet 52. A lint collector 132 is positioned above the fans 130 to capture large particles of dust and other debris. An absolute (HEPA) filter 134, extending the full width and depth of the first cabinet 52, is positioned below the fans 130 for capturing small particles of dust and other debris. Because of the fans 130, the ambient air pressure in the first cabinet 52 is greater than the ambient air pressure in the second cabinet 54. Because of this pressure differential, air flows from the wafer mounting region of the machine to the wafer polishing region of the machine and then out openings (e.g., gaps between the doors) in the second cabinet 54 to minimize debris in the polishing region from entering into the wafer mounting region.

Also preferably, the machine has partitions (not shown) for separating the wafer mounting region from the wafer polishing region. These partitions may have openings therein for passage of polishing blocks and semiconductor wafers between the mounting and polishing regions. Alternatively or additionally, the partitions may include a controller controlled door (not shown) movable within one of the cabinets from a closed position to an open position. In the closed position, the door covers a passageway between the mounting and polishing regions. In the open position, the door is swung away from the passageway to permit passage of polishing blocks and semiconductor wafers between the mounting and polishing regions.

Figure 5:
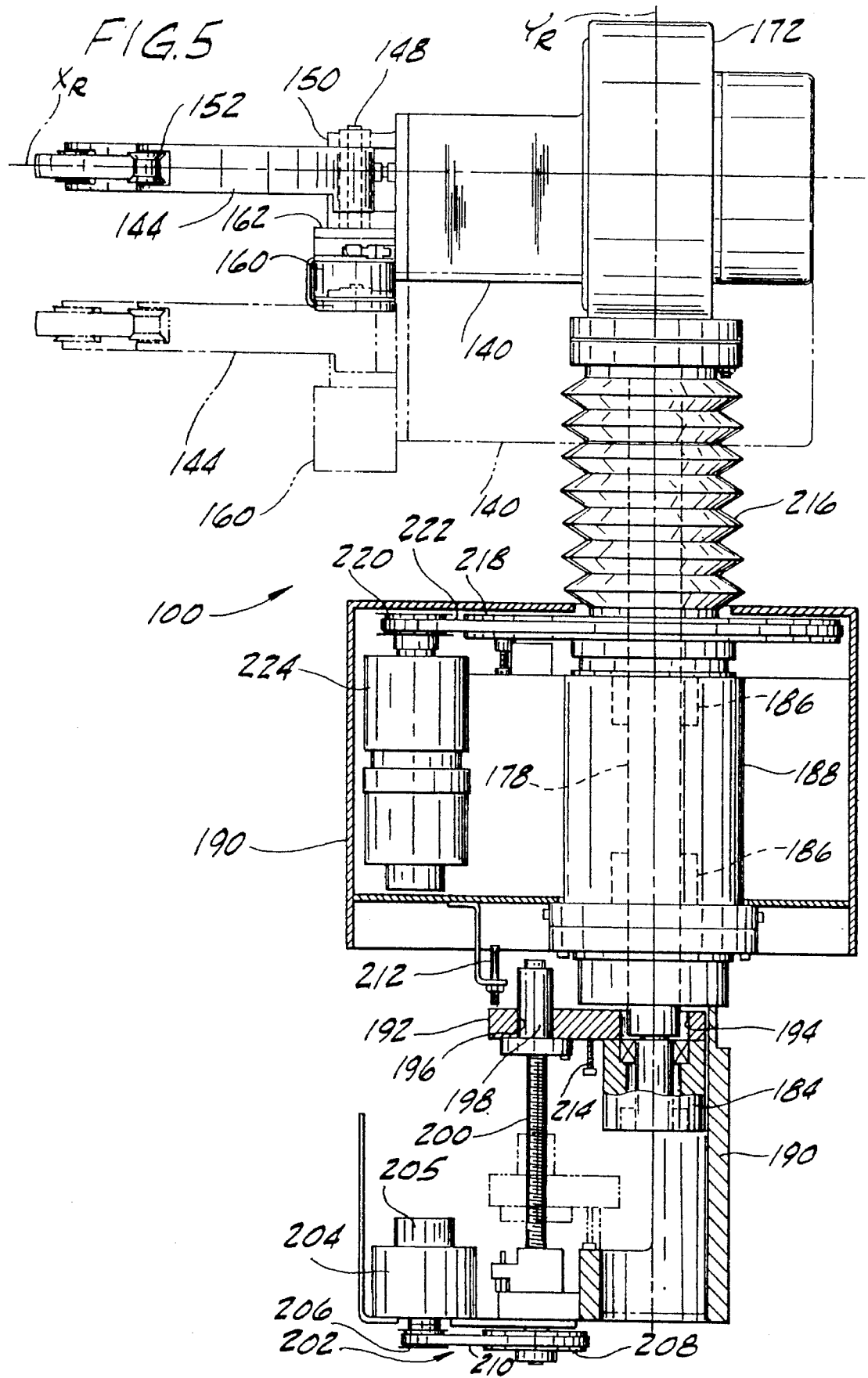
FIG. 5 is a side elevational view of a circular robot of the polishing apparatus of FIG. 1.
Figure 6:
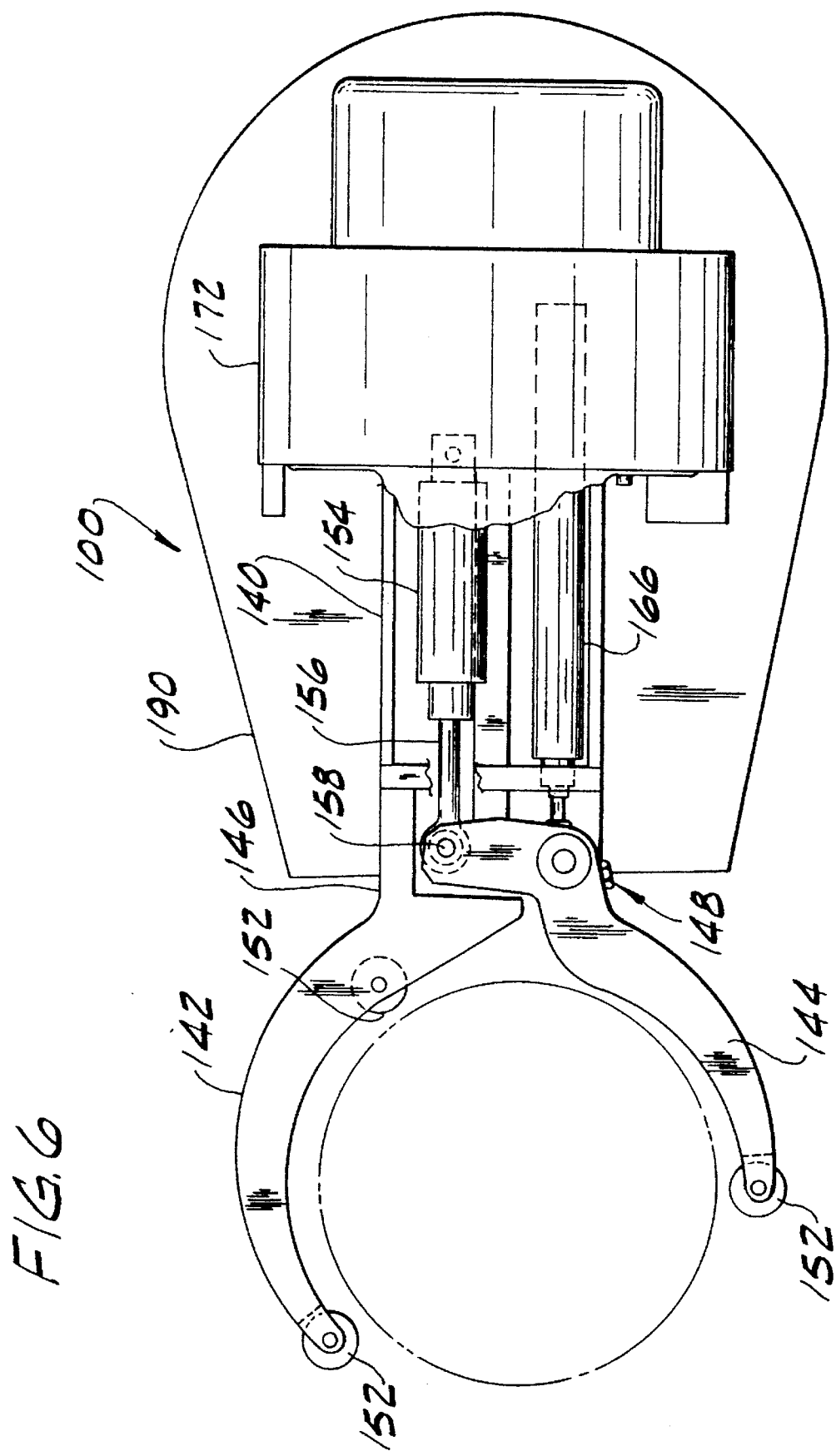
FIG. 6 is a plan view of the circular robot of FIG. 5 showing jaws of the robot in an open position.
Figure 7:
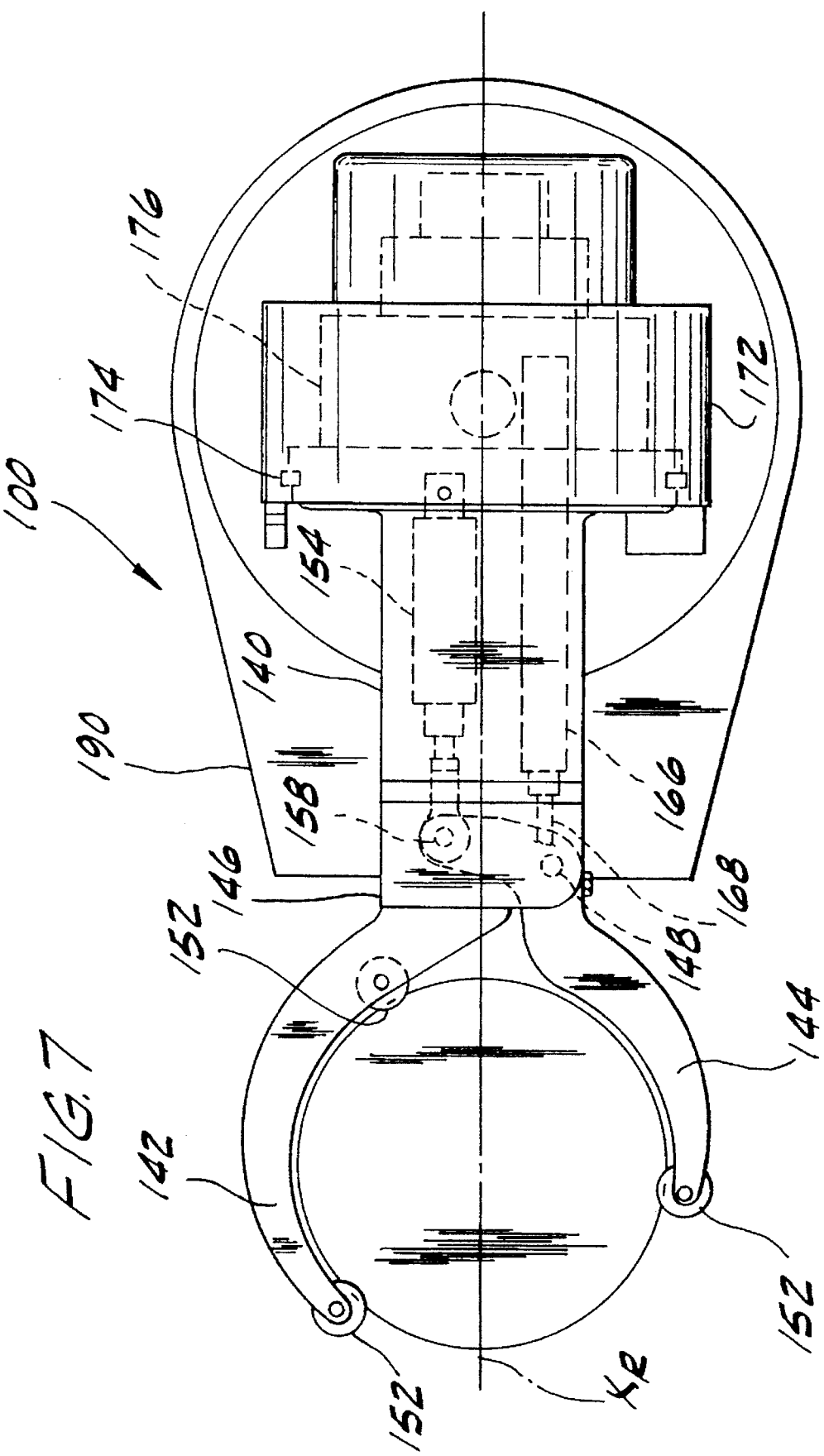
FIG. 7 is a plan view of the circular robot of FIG. 5 showing the jaws in a closed position holding a polishing block.

Referring to FIGS. 5–8, the circular robot 100 has a generally horizontal (robot) arm 140 and first and second jaws 142, 144 on the robot arm for grasping polishing blocks. The first jaw 142 is fixed to an outer end 146 of the robot arm 140. The second jaw 144 is connected to the robot arm 140 by a pin 148 and clevis 150 (FIG. 5). Rollers 152 are pinned to the jaws 142, 144 and are adapted to engage the periphery of a polishing block when the jaws are moved from an open position (FIG. 6) to a closed position (FIG. 7).

Figure 8:
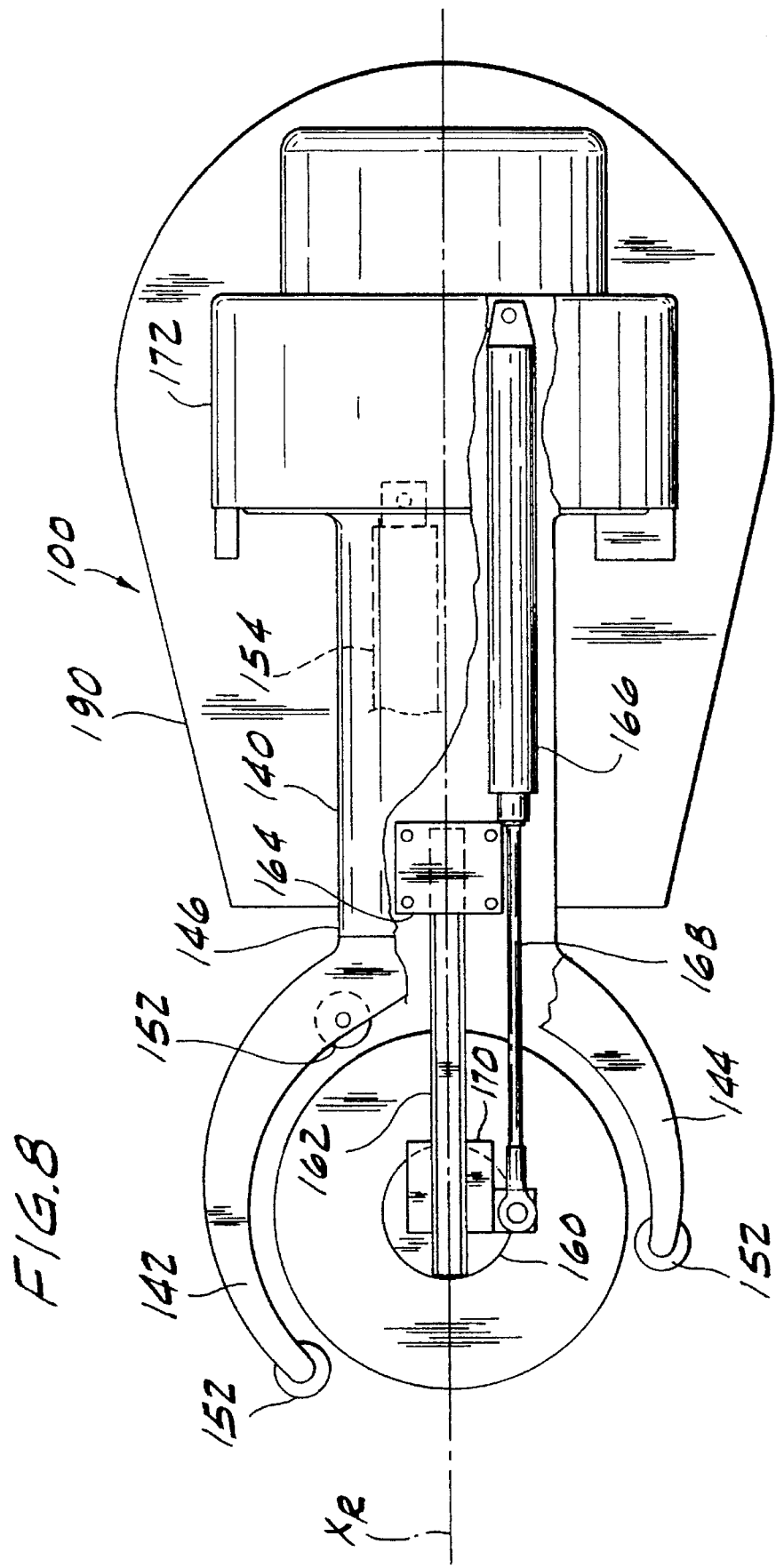
FIG. 8 is a plan view of the circular robot of FIG. 5 showing a vacuum chuck of the robot holding a semiconductor wafer.

Movement of the jaws 142, 144 between their open and closed positions is effected by a first pneumatic cylinder 154 (or jaw cylinder) pivotally mounted within the robot arm 140. The extensible and retractable rod 156 of the jaw cylinder 154 is pin-connected at 158 to the second jaw 144 so that retraction of the rod closes the jaws and extension of the rod opens the jaws. The circular robot 100 has a vacuum chuck 160 (vacuum gripper) for picking up semiconductor wafers. The vacuum chuck 160 is secured to a movable rail 162 (FIG. 8) which mates with a guide 164 securely fixed to the robot arm 140. A second pneumatic cylinder 166 (or vacuum chuck cylinder) within the robot arm 140 has a piston rod 168 connected to the vacuum chuck 160 by a bracket 170 (FIG. 8). In and out movement of the piston rod 168 slides the rail 162 in the guide 164 to axially move the vacuum chuck 160 from a retracted position (FIG. 5) to an extended position (FIG. 8).

The robot arm 140 is mounted to a robot arm support 172 by suitable bearings 174 (FIG. 7) for rotation of the robot arm 140 about a generally horizontal axis $X_R$. A pneumatic rotary actuator 176 (shown in phantom in FIG. 7) within the robot arm support 172 is coupled to the robot arm 140 via a suitable drive mechanism (not shown) to rotate the robot arm about the axis $X_R$. The controller 84 in combination with a suitable positioning sensor determines the position of the robot arm 140 as it rotates about the axis $X_R$.

A generally vertical shaft 178 is secured at its upper end to the robot arm support 172 and is journaled at its lower end in a bearing block 184. The shaft 178 is further journaled via bearings 186 (shown in phantom in FIG. 5) in a hollow cylinder 188 secured to a stationary housing 190. A generally horizontal plate 192, secured to an upper portion of the bearing block 184, has a first opening 194 therein for passage of the shaft 178 and a second opening 196 containing a nut 198. A generally vertical screw 200 is journaled at its lower end in the housing 190 and threaded into the nut 198. The shaft 178 is raised or lowered along a vertical axis $Y_R$ by turning the screw 200 in the nut 198. The screw 200 is turned by a drive mechanism, generally indicated 202, comprising a servomotor 204 (level positioning servomotor) mounted to the housing 190, a drive pulley 206 turned by the servomotor, a driven pulley 208 keyed to the screw 200, and a belt 210 trained around the pulleys. Operation of the level positioning servomotor 204 turns the screw 200 to move the robot arm 140 vertically between a lowered position (shown in phantom in FIG. 5) and a raised position (shown in solid in FIG. 5). A sensor is employed to directly or indirectly sense the vertical position of the robot arm 140. Preferably, the sensor comprises a shaft encoder 205 (e.g., a 4000 count/revolution shaft encoder) on the shaft of the level positioning servomotor 204. The controller 84 counts pulses from the encoder responsive to rotation of the shaft of the servomotor 204 to determine the vertical position of the robot arm 140. A positioning sensor 212 electrically coupled to the controller 84 detects the position of the plate 192 to establish a reference elevation of the robot arm 140. Preferably, a bellows-shaped boot 216 surrounding an upper portion of the shaft 178 is adapted to compress when the shaft is lowered and expand when the shaft is raised.

The shaft 178 and robot arm 140 may also be rotated about the axis $Y_R$ to move wafers and blocks to and from the circumferentially arranged stations. A shaft pulley 218 surrounds the shaft 178. The pulley 218 has a central opening (not shown) through which the shaft 178 passes. The pulley 218 is splined to the shaft 178 so that the shaft rotates with the shaft pulley but is able to move relative to the shaft pulley along the axis $Y_R$. The shaft pulley 218 is coupled to a drive pulley 220 by a belt 222 and the drive pulley is turned by a servomotor 224 (circumferential positioning servomotor) secured to the housing 190. A sensor (not shown) is employed to determine the rotational position of the robot arm 140. Preferably, the sensor comprises a shaft encoder coupled to the shaft of the circumferential positioning servomotor 224. The controller 84 counts pulses from the encoder to determine the rotational position of the robot arm.

To pick up a polishing block B from a first station and move it to a second station, the controller 84 energizes the level positioning servomotor 204 to raise the robot arm 140 of the circular robot 100 and energizes the circumferential positioning servomotor 224 to position the jaws 142, 144 over the first station. The controller 84 then energizes the jaw cylinder 154 which extends the piston rod 156 to open the jaws 142, 144. The controller 84 again energizes the level positioning servomotor 204 to lower the arm 140 so that the rollers 152 of the jaws 142, 144 are positioned level with the polishing block B. The jaw cylinder 154 is then operated to retract the piston rod 156 and close the jaws 142, 144 so that the rollers engage the periphery of the polishing block B. The controller 84 then energizes the level positioning servomotor 204 to raise the robot arm 140 and energizes the circumferential positioning servomotor 224 to position the polishing block B above the second station. If it is desired to invert the polishing block B before placing it on the second station, the controller 84 energizes the rotary actuator 176 to rotate the arm 180° about the axis $X_R$. The controller 84 then energizes the level positioning servomotor 204 to lower the polishing block B onto the second station and energizes the jaw cylinder 154 to open the jaws 142, 144.

To pick up a semiconductor wafer W from a first station and move it to a second station, the controller 84 energizes the level positioning servomotor 204 to raise the robot arm 140 and energizes the circumferential positioning servomotor 224 to position the circular robot 100 over the first station. The controller 84 then energizes the vacuum chuck cylinder 166 to move the vacuum chuck 160 radially outward over the semiconductor wafer W. The level positioning servomotor 204 then lowers the robot arm 140 so that the vacuum chuck 160 engages the top of the semiconductor wafer W. The controller 84 then energizes a vacuum pump (not shown) coupled to the vacuum chuck 160 via suitable vacuum lines so that the vacuum chuck grips the semiconductor wafer W. The level positioning servomotor 204 is energized to raise the robot arm 140 and the circumferential positioning servomotor 224 is energized to position the robot arm over the second station. To ensure that the semiconductor wafer W does not collide with other stations, it may be necessary to retract the piston rod 168 of the vacuum chuck cylinder 166 before moving the robot arm 140 from the first station to the second station. The piston rod 168 is then extended to position the semiconductor wafer W over the second station. The controller 84 then energizes the level positioning servomotor 204 to lower the semiconductor wafer W onto the second station and opens a valve (not shown) coupled to the vacuum line to release the semiconductor wafer from the vacuum chuck 160.

Thus, the circular robot 100 is operable to move polishing blocks and semiconductor wafers to and from the stations of the wafer mounting apparatus.

Figure 9:
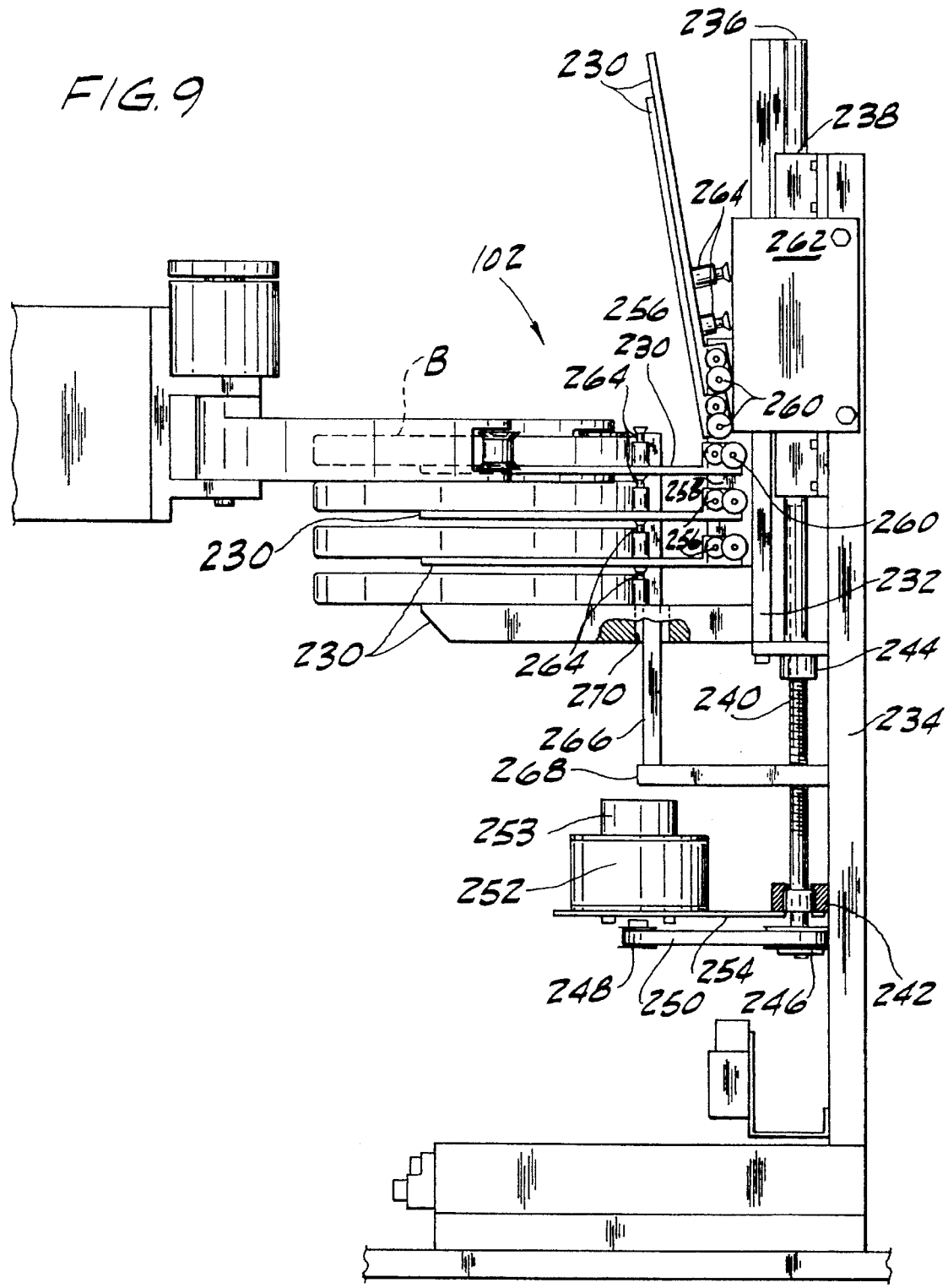
FIG. 9 is a side elevational view of a block rack of the polishing apparatus of FIG. 1 holding a plurality of polishing blocks.
Figure 10:
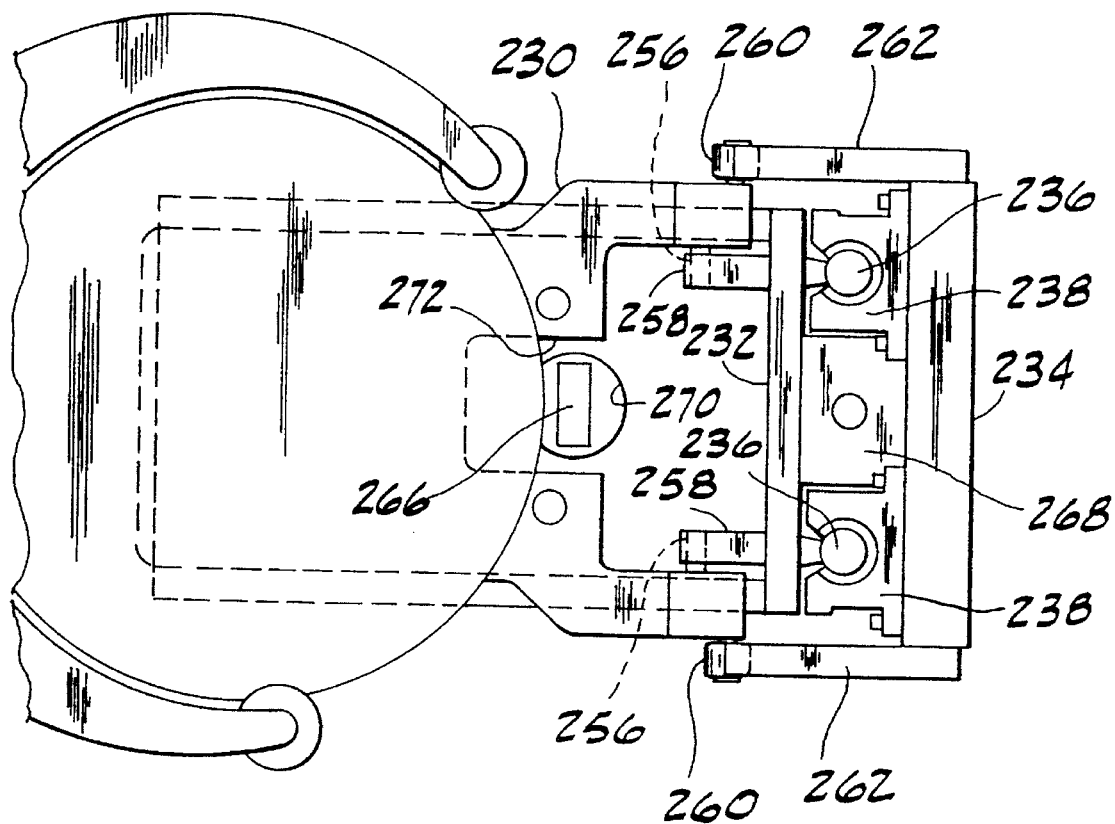
FIG. 10 is a plan view of the block rack of FIG. 9.

Referring to FIGS. 9 and 10, the polishing block rack 102 comprises a plurality of trays 230 for holding a plurality of (preferably six) polishing blocks, one block B per tray. The trays 230 are mounted on a carriage 232 and are adapted to be stacked one on top of the other. The carriage 232 is vertically movable relative to a stationary block rack support 234. The carriage 232 has a pair of generally vertical rails 236 which ride in a corresponding pair of guides 238 secured to the block rack support 234. A generally vertical screw 240 is journaled at its lower end in the rack support 234 via a bearing 242. The screw 240 has a threaded shank extending upward from its lower end into a threaded nut 244 secured to a lower end of the carriage 232. A first pulley 246 is keyed to the screw 240 and coupled to a second pulley 248 by a belt 250. A servomotor 252, secured to the rack support 234 by a motor mount 254, rotates the second pulley 248 to thereby rotate the first pulley 246 and screw 240. Rotation of the screw 240 raises and lowers the carriage 232 and trays 230. Preferably, an encoder 253 is coupled to the shaft of the motor 252 for indexing the screw 240 so that the controller 84 may selectively operate the motor 252 to raise and lower the carriage 232 and trays 230 to desired predetermined levels.

The lowermost tray 230 is securely fastened to the carriage 232. Pins 256 pivotably connect the five uppermost trays (pivot trays) to elongate vertical flanges 258 of the carriage 232 so that each of these pivot trays may swing on their corresponding pins about respective horizontal axes. The pivot trays 230 are adapted to swing on the pins 256 from a generally horizontal block holding position to a canted position. In FIG. 9, the two uppermost trays are shown in their canted positions and the other trays are shown in their block holding positions. Rollers 260 are mounted adjacent an edge of each pivot tray 230 and spaced laterally from the pins 256 (generally to the right of the pins as viewed in FIG. 9). The rollers 260 are engageable with a pair of canting plates 262 secured to the rack support 234. When the carriage 232 is raised from one tray level to another, the rollers 260 of one of the pivot trays 230 engage the canting plates 262, which causes the tray to swing from its block holding position to its canted position. Spacers 264 extending up from upper faces of the trays 230 prevent the trays from swinging (counterclockwise in FIG. 9) below their block holding positions. A generally vertical sensor holder 266 extends upward from a bracket 268 secured to the rack support 234. The alignment bar 266 extends through an aperture 270 in the lowermost tray 230 and openings 272 (FIG. 10) in the five pivot trays and has a sensor (not shown) adjacent its upper end. The sensor senses whether a polishing block B is on a tray (i.e., the uppermost horizontal tray) positioned adjacent the sensor.

The block rack 102 holds a stack of polishing blocks. After the circular robot 100 lifts an uppermost block B off a tray, the controller 84 energizes the motor 252 which turns the screw 240 to raise the carriage 232 a distance corresponding to the vertical spacing between the trays. As the carriage 232 moves upward, the rollers 260 engage the canting plates 262 and the force exerted on the rollers swings the tray 230 away from the next polishing block B so that this next block can be lifted by the circular robot 100. When the carriage 232 reaches a desired level, the controller 84 deenergizes the motor 252.

Figure 11:
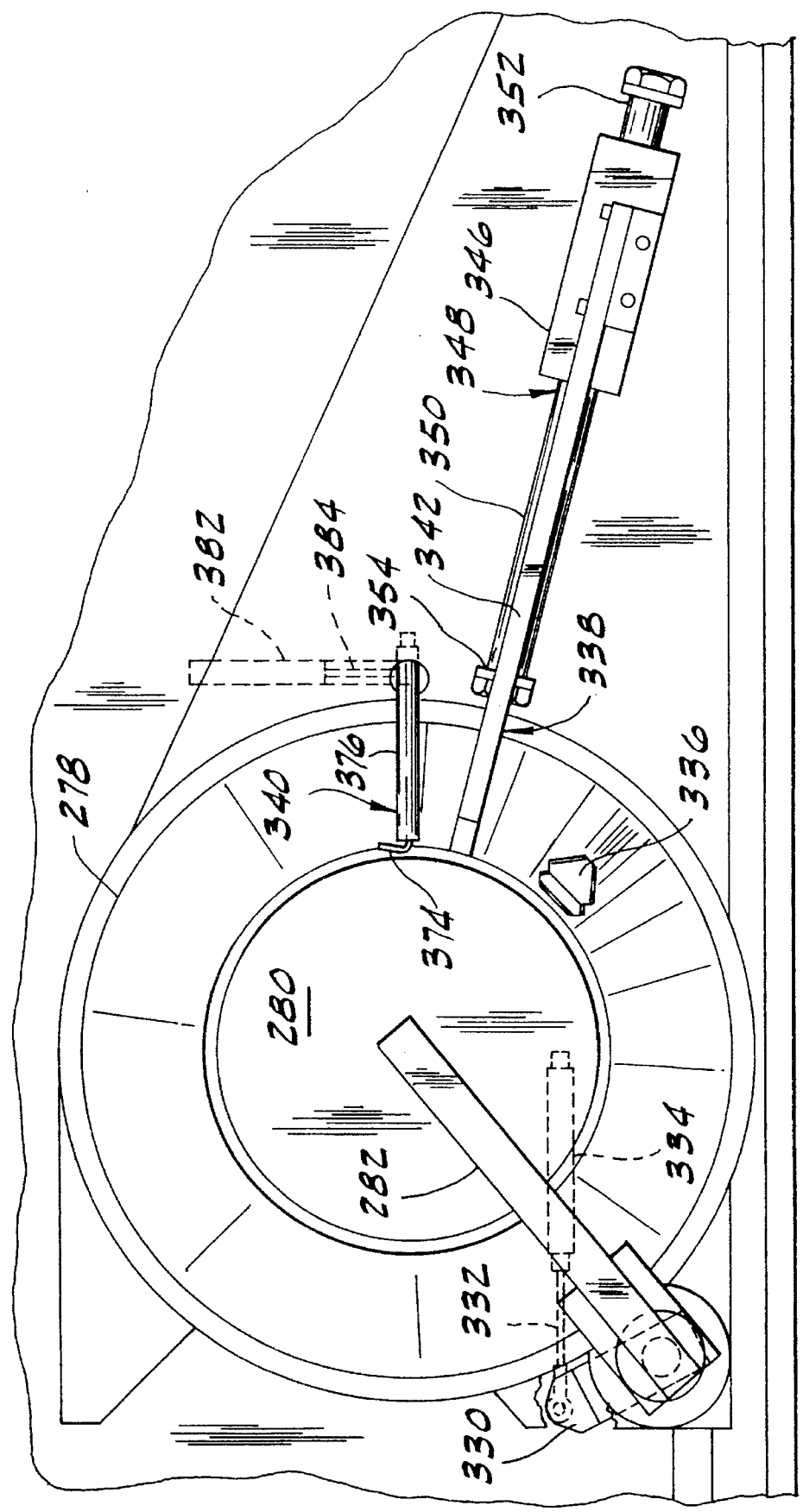
FIG. 11 is a plan view of a wax applicator of the polishing apparatus of FIG. 1.
Figure 12:
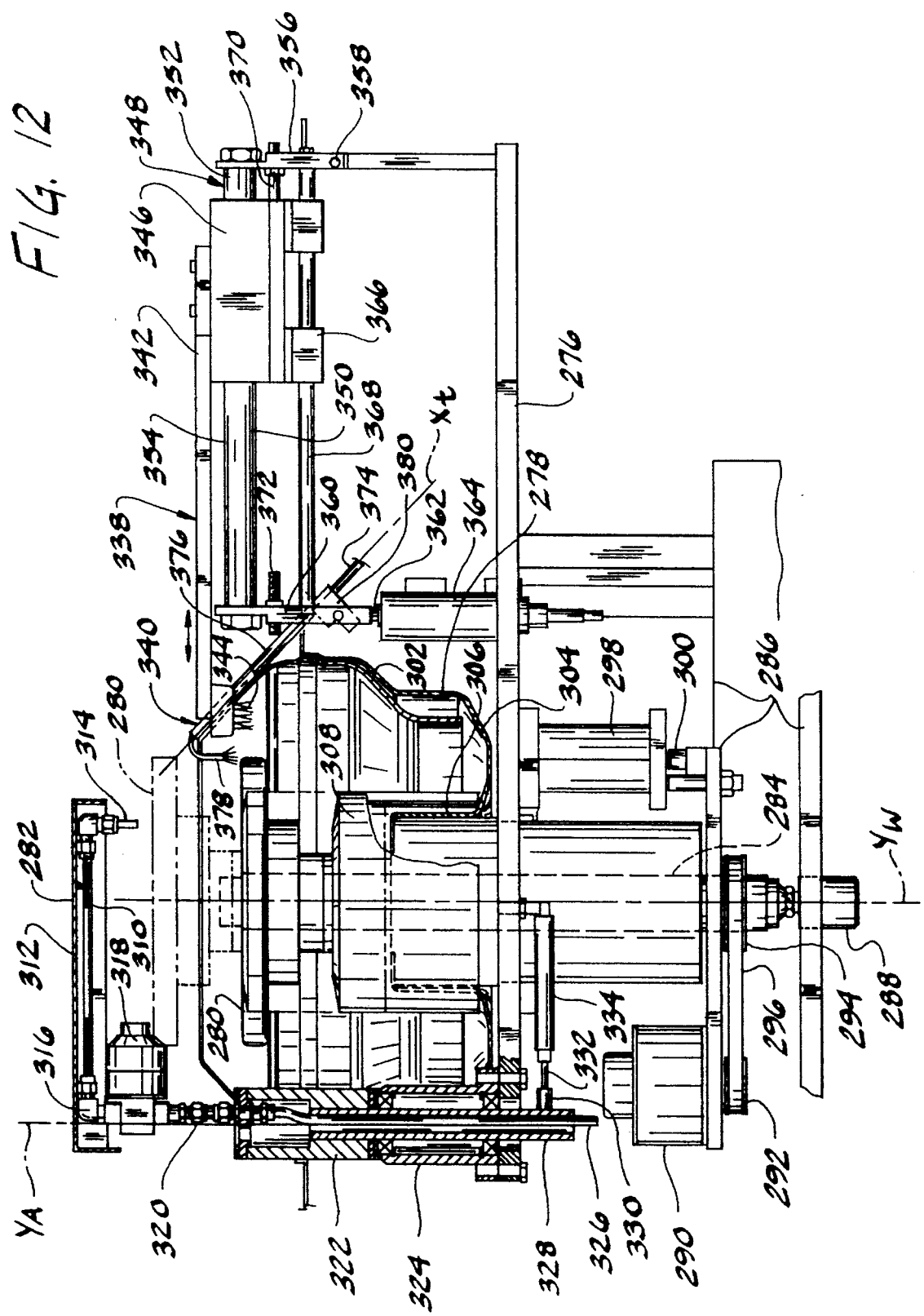
FIG. 12 is a side elevational view of the wax applicator of FIG. 11 with parts broken away to show detail.

Referring to FIGS. 11 and 12, the wax applicator 104 is adapted for coating an upper face (first face) of a polishing block B with a suitable wax bonding agent. It comprises an applicator support structure 276, a generally round bowl 278 secured to the applicator support structure, a horizontal turntable 280, and a wax applicator arm 282. The turntable 280 is secured to an upper end of a vertical shaft 284. The shaft 284 is journaled in the applicator support structure 276 by suitable bearings (not shown) for rotation of the shaft about an axis $Y_W$. The shaft 284 extends downward and is supported at its lower end by a shaft support structure 286 movable relative to the applicator support structure 276. The shaft 284 is journaled in the shaft support structure 286 by a bearing assembly 288.

A servomotor 290 mounted to the shaft support structure 286 turns a first pulley 292 which drives a second pulley 294 via a belt 296. The second pulley 294 is keyed to the shaft 284 and rotates with the shaft. Since the turntable 280 is secured to the shaft 284, operation of the motor 290 spins the turntable. A pneumatic cylinder 298 (turntable cylinder) secured to the applicator support structure 276 has a downwardly projecting piston rod 300 secured to the shaft support structure 286. Actuation of the turntable cylinder 298 raises and lowers the shaft support structure 286, and thereby raises and lowers the shaft 284 and turntable 280. The turntable 280 is vertically moved by the in and out movement of the piston rod from a raised position (shown in phantom in FIG. 12) in which the turntable 280 is positioned above the bowl 278 to a lowered position (shown in solid) within the bowl. Preferably, a vacuum gripper (not shown) is at the center of the turntable 280 for holding the polishing block B on the turntable.

The bowl 278 is generally annular in shape. It has a generally funnel shaped outer portion 302, an annular shaped bottom portion 304 extending radially inwardly of the outer portion, and a cylindrical inner portion 306 extending upward from the bottom portion. A drain and an exhaust port (not shown) are provided in the bottom portion 304 for draining liquid and exhausting gasses from the bowl 278. The inner portion 306 of the bowl 278 has an opening therein for passage of the shaft 284. A cylindrical shroud 308 surrounds the shaft 284 and covers the inner portion 306 of the bowl to prevent debris from entering the opening.

The wax applicator arm 282 comprises a horizontally extending feed tube 310, an elongate shield 312 covering the feed tube, and a pour spout 314 at one end of the feed tube. The feed tube 310 is secured via a tube fitting 316 to a valve 318 adapted for feeding wax to the pour spout 314. The valve 318 is secured by fitting 320 to an upstanding cylindric rotor 322 rotatably coupled to a cylindric support 324. A feed tube 326 extends up through the cylindric support 324 and is coupled to the valve 318 via fitting 320. The cylindric support 324 is secured to the applicator support structure 276. An elongate cylindric member 328 is coaxial with and extends downward from the cylindric rotor 322 through the cylindric support 324. A lever arm 330 (FIG. 11) extends laterally from a lower portion of the cylindric member 328. The lever arm 330 is pin-connected to the piston rod 332 of a pneumatic cylinder 334 whose cylinder is pin-connected to the applicator support structure 276. Actuation of the cylinder 334 rotates the rotor 322 and applicator arm 282 about an axis $Y_A$ to swing the wax applicator arm 282 from an application position to a retracted position. In the application position (FIG. 11) the pour spout 314 is positioned directly over the center of the turntable 280 in line with the axis $Y_W$. In the retracted position (FIG. 12), the wax applicator arm 282 is swung laterally away from the turntable 280 so that it is not in the way when a polishing block B is placed on the turntable 280.

The wax applicator 104 also includes a cleaning spray nozzle 336 (FIG. 11), a cleaning brush 338, and an edge cleaner 340. The cleaning spray nozzle 336 is positioned adjacent the top of the bowl 278 for spraying a suitable wax-solvent solution on an upper face of a polishing block B placed on the turntable 280 for cleaning the polishing block. Preferably, the angle and spray pattern of the spray nozzle 336 are sufficient to spray solution on the entire upper face of the spinning polishing block B.

The cleaning brush 338 is adapted for cleaning the upper face of the polishing block B after the cleaning solution is sprayed. The cleaning brush 338 has an elongate handle 342 with downwardly extending bristles 344 at one end. The other end of the handle 342 is secured to a piston mounting 346 of a rodless cylinder, generally indicated 348. An elongate barrel 350 of the rodless cylinder 348 extends generally radially outward of the bowl 278. It has a outboard end 352 remote from the bowl 278 and an inboard end 354 generally adjacent the bowl. The outboard end 352 is secured to a bracket 356 which is pin-connected at 358 to the applicator support structure 276. The inboard end 354 of the barrel 350 is secured to a bracket 360 which is pin connected to a piston rod 362 of a pneumatic cylinder 364 (brush vertical cylinder). The cylinder 364 is pin connected to the applicator support structure 276. Actuation of the brush vertical cylinder 364 pivots the barrel 350 of the rodless cylinder 348 on the pivot point 358 and raises the inboard end 354 of the barrel to raise the bristles 344 above the polishing block B when the turntable 280 is in its lowered position. Slides 366, secured to the underside of the piston mounting 346, ride on a guide rod 368 connected at its ends to the brackets 356, 360. Actuation of the rodless cylinder 348 moves the piston mounting 346 along the guide rod 368 to move the bristles 344 of the brush 338 laterally across the face of the polishing block B. Preferably, adjustable stops 370, 372 engageable with the piston mounting 346 are secured to the brackets 356, 360 for limiting lateral movement of the mounting and brush 338.

The edge cleaner 340 comprises a tube 374 and a tube sleeve 376. The tube 374 has a straight lower portion whose axis $X_t$ is inclined relative to the bowl and a curved (bent) upper portion defining a nozzle 378 for directing a cleaning solution to the periphery of the polishing block B. The tube sleeve 376 surrounds the straight portion of the tube and is journaled by suitable bearings (not shown) in the applicator support structure 276 for rotation of the sleeve and tube about the axis $X_t$. A lever 380 (FIG. 12) extends laterally from the sleeve 376. A pneumatic cylinder 382 (FIG. 11) is pin-connected to the applicator support structure 276 and its piston rod 384 is pin-connected to the lever 380. In and out movement of the piston rod 384 pivots the tube about the axis $X_t$ between a spray position (FIG. 12) in which the nozzle 378 is pointed at the periphery of the polishing block B to direct cleaning solution to the periphery, and a clearance position (FIG. 11) in which the curved upper portion is pivoted away from the polishing block B to avoid contacting the polishing block B as it is raised and lowered on the turntable 280.

Initially, the turntable 280 is in its raised position for receiving a polishing block B. After the circular robot 100 places the polishing block B on the turntable 280, a vacuum is applied via the vacuum chuck (not shown) of the turntable 280 to hold the block on the turntable 280. The controller 84 then actuates the pneumatic cylinder 298 which lowers the turntable 280 and polishing block B into the bowl 278. The controller 84 energizes the motor 290 to spin the turntable 280 and polishing block B. A cleaning solution is then sprayed via the cleaning spray nozzle 336 onto the polishing block B to clean the upper surface of the block (e.g., dissolve any wax on the block). After the cleaning solution is sprayed, the controller 84 extends the piston rod 362 of the brush vertical cylinder 364 to raise the inboard end 354 of the barrel 350 and actuates the rodless cylinder 348 to position the bristles 344 of the cleaning brush 338 over the center of the rotating polishing block. The controller 84 then retracts the piston rod 362 of the brush vertical cylinder 364 to press the bristles against the rotating polishing block B and actuates the rodless cylinder 348 to move the brush 338 radially outwardly along the block to remove any debris. The controller 84 then actuates the applicator arm cylinder 334 to swing the applicator arm 282 from its retracted position to its application position and opens the valve 318 to pour fluid wax from the pour spout 314 on the center of the rotating block B. The rotation of the polishing block B (preferably rotated at 100–700 rpm) causes the wax to move radially outward on the upper surface of the block to form a wax coating of uniform thickness (e.g., 5–15 μm). The controller 84 actuates the edge cleaner cylinder 382 to pivot the edge cleaner 340 from its clearance position to its spray position. The edge cleaner 340 then sprays a cleaning solution to remove wax from the rim of the polishing block B and from an outer margin (e.g., 3/8) of its upper face. After the upper face of the polishing block B is coated with wax and the periphery cleaned, the turntable 280 cylinder is actuated to raise the turntable 280 and polishing block. The circular robot 100 then lifts the polishing block B from the turntable 280 and moves it to the polishing block heater 106.

Figure 13:
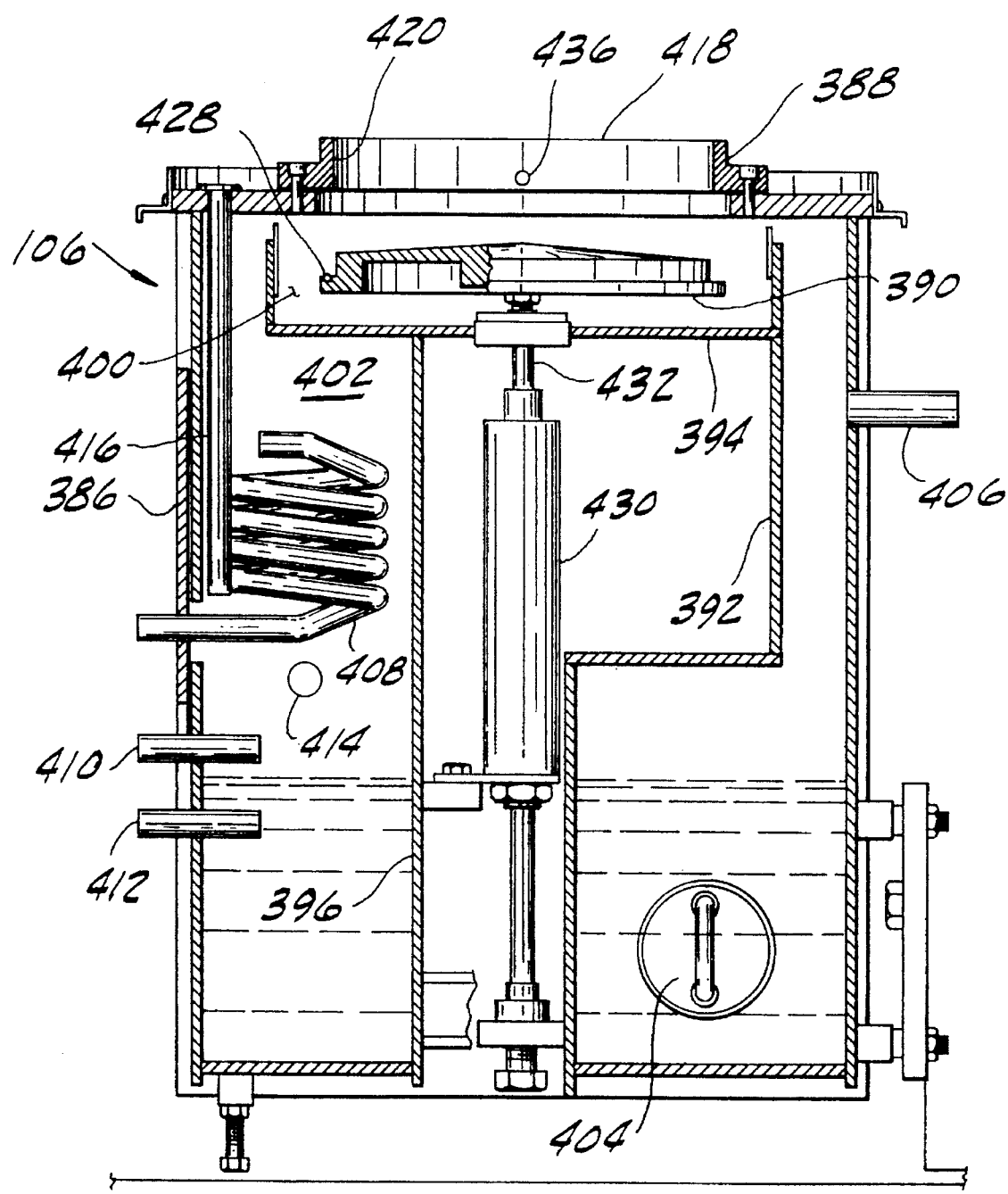
FIG. 13 is a side elevational view in section of a block heater of the polishing apparatus of FIG. 1.
Figure 14:
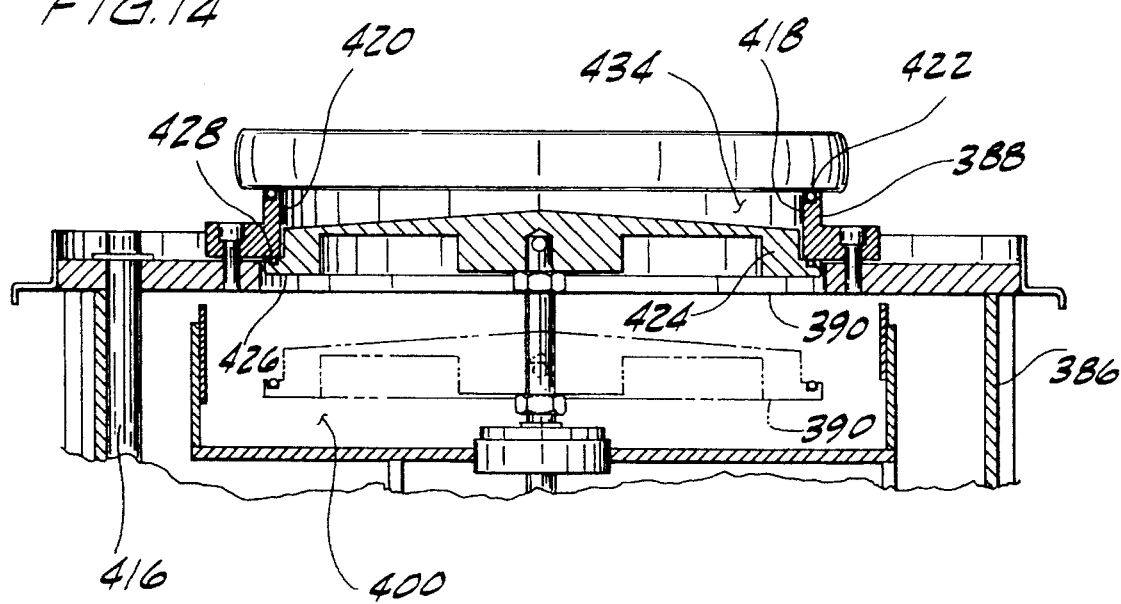
FIG. 14 is an enlarged fragmented sectional view of the block heater of FIG. 13 showing a polishing block on the heater.

Referring to FIGS. 13 and 14, the block heater 106 includes a generally box-shaped enclosure 386, an annular platform 388 secured to the top of the enclosure for receiving a polishing block B, and a plunger 390 under the platform. Partitions 392, 394, 396, within the enclosure define a steam compartment 398, a plunger compartment 400, and a condenser compartment 402. The plunger compartment 400 is in fluid communication with the upper portions of the steam and condenser compartments 398, 402. The lower portions of the steam and condenser compartments 398, 402 are adapted to be filled with water and a fluid line (not shown) connects these compartments so the fluid level in the steam compartment is equal to the fluid level in the condenser compartment.

A steam generator, preferably comprising one or more immersion-type heating elements 404, is within the steam compartment 398 and below the water level. The heating element 404 boils the water in the steam compartment 398 to heat the plunger compartment 400. A pressure relief valve 406 is at the upper portion of the steam compartment 398 for maintaining pressure within the compartments below a predetermined level. A condenser 408 is within the condenser compartment 402 and above the water level for condensing steam generated in the steam compartment 398. High low water level sensors 410, 412, a makeup port 414, and a vent tube 416 are also within the condenser compartment 402. When the low water level sensor 412 senses a water level below a predetermined low level, the controller 84 opens a valve (not shown) coupled to the makeup port 414 to introduce makeup water into the condenser compartment 402. When the high water level sensor 410 senses the water level at a predetermined high level, the controller 84 closes the valve. Thus, the controller 84 maintains the water level between predetermined high and low levels. Preferably, the controller 84 operates the steam generator and condenser 408 to maintain a steady flow of atmospheric steam from the steam compartment 398 through the plunger compartment 400 and to the condenser compartment 402.

The platform 388 of the polishing block heater 106 has a circumferential wall 418 defining an opening 420 in the top of the enclosure 386. Preferably, a first O-ring 422 (FIG. 14) is within an annular recess on the upper surface of the platform 388 to seal against the underside of a polishing block B placed on the platform. The plunger 390 is sized and configured for closing the opening 420. The plunger 390 has a generally cylindric portion 424 and a radial flange 426 around the cylindric portion. The cylindric portion 424 has an outside diameter slightly smaller than the inside diameter of the circumferential wall 418 of the platform 388 and extends into the opening 420 when the plunger 390 is raised. A second O-ring 428 within an annular recess in the radial flange 426 is adapted to seat against the underside of the platform 388. The plunger 390 is raised and lowered in the enclosure 386 by a pneumatic cylinder 430 mounted within the enclosure. The extensible and retractable rod 432 of the cylinder 430 is connected to the underside of the plunger 390 so that it moves the plunger generally along its own axis from a raised position (shown in solid in FIG. 14) to a lowered position (shown in phantom in FIG. 14). In the raised position, the second O-ring 428 seats against the underside of the platform 388. When the plunger 390 is in its raised position and the polishing block B is placed on the platform 388, the underside of the polishing block, the circumferential wall 418 of the platform, and the plunger 390 combine to define a sealed chamber 434 (FIG. 14). A vacuum pump (not shown) communicates with the sealed chamber 434 via a vacuum port 436 (FIG. 13) extending laterally through the circumferential wall 418 of the platform 388 to evacuate the sealed chamber. In its lowered position, the plunger 390 is spaced below the platform 388 and steam is circulated through the opening 420 to the underside of the polishing block B.

Initially, the plunger 390 is in its raised position to prevent steam from passing through the opening 420. After wax is applied to the polishing block B, the circular robot 100 lifts the block from the wax applicator 104 and places it wax-side up on the platform 388. The controller 84 then actuates the cylinder 430 to retract the piston rod 432 and thereby move the plunger 390 to its lowered position. The steam flows to the plunger compartment 400 to heat the underside (second face) of the polishing block B. Because the polishing block B is relatively cool, steam condenses on its underside. The condensing of the steam causes a rapid heat transfer to the polishing block B and wax coating. After a predetermined time sufficient to heat the polishing block B and wax coating to a temperature of approximately 100° C., the controller 84 actuates the cylinder 430 to move the plunger 390 to its raised position and energizes the vacuum pump to evacuate the sealed chamber 434 to about 75 mmHg abs. (75 torr). The drop in pressure in the sealed chamber 434 flashes (i.e., vaporizes) condensation from the underside of the polishing block B. The controller 84 maintains the vacuum for a predetermined time sufficient to remove the condensation (e.g., forty-five seconds) and then opens a valve (not shown) to release the vacuum and increase the pressure in the chamber 434 equal to the ambient pressure of the first cabinet 52. After the vacuum is released, the circular robot 100 removes the heated polishing block B from the polishing block heater 106.

Referring to FIGS. 15–19, the semiconductor wafer delivery station 108 comprises a delivery station support structure, generally indicated 440, a platform, generally indicated 442, a cassette holder 444 for holding a cassette 446 containing a plurality of semiconductor wafers, and a plunger 448 under the platform. The support structure 440 comprises a base 450, a plunger support 452 extending laterally from the base, a first side support 454 extending up from one end (left end as viewed in FIG. 15) of the plunger support, and a second side support 456 extending up from the base.

The cassette holder 444 comprises a bottom plate 458, a rear wall 460, a pair of lips 462 extending up from a forward edge of the bottom plate, and a swing arm 464 pin connected at 466 to the rear wall adjacent the top of the wall. The lips 462 and rear wall 460 limit lateral movement of the cassette 446. A microswitch (not shown) on the swing arm 466 senses whether a cassette is in the cassette holder 444. The cassette holder 444 is secured via a post 468 to a guide block 470.

Figure 16:
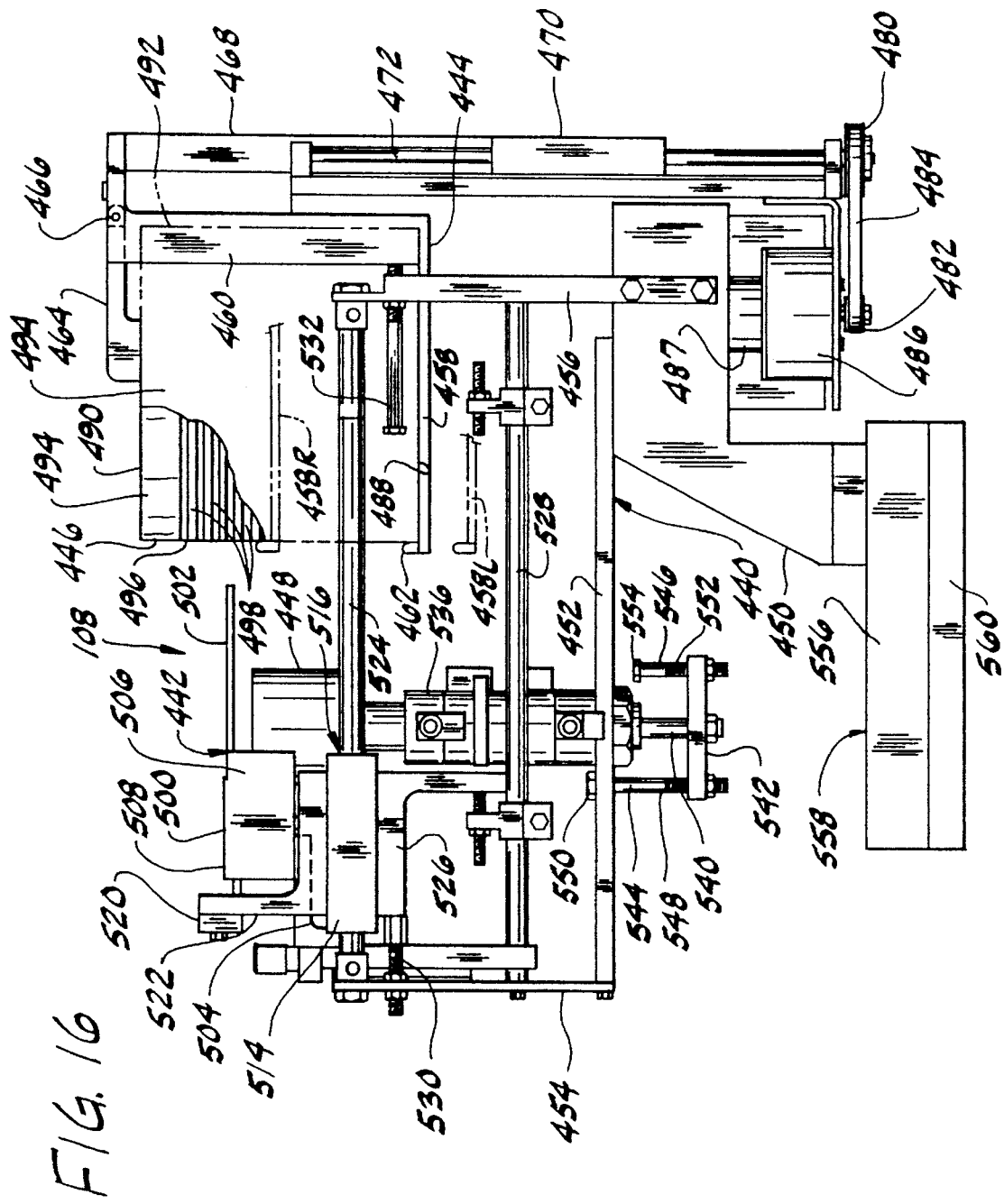
FIG. 16 is a side elevational view of the wafer delivery station of FIG. 15.
Figure 17:
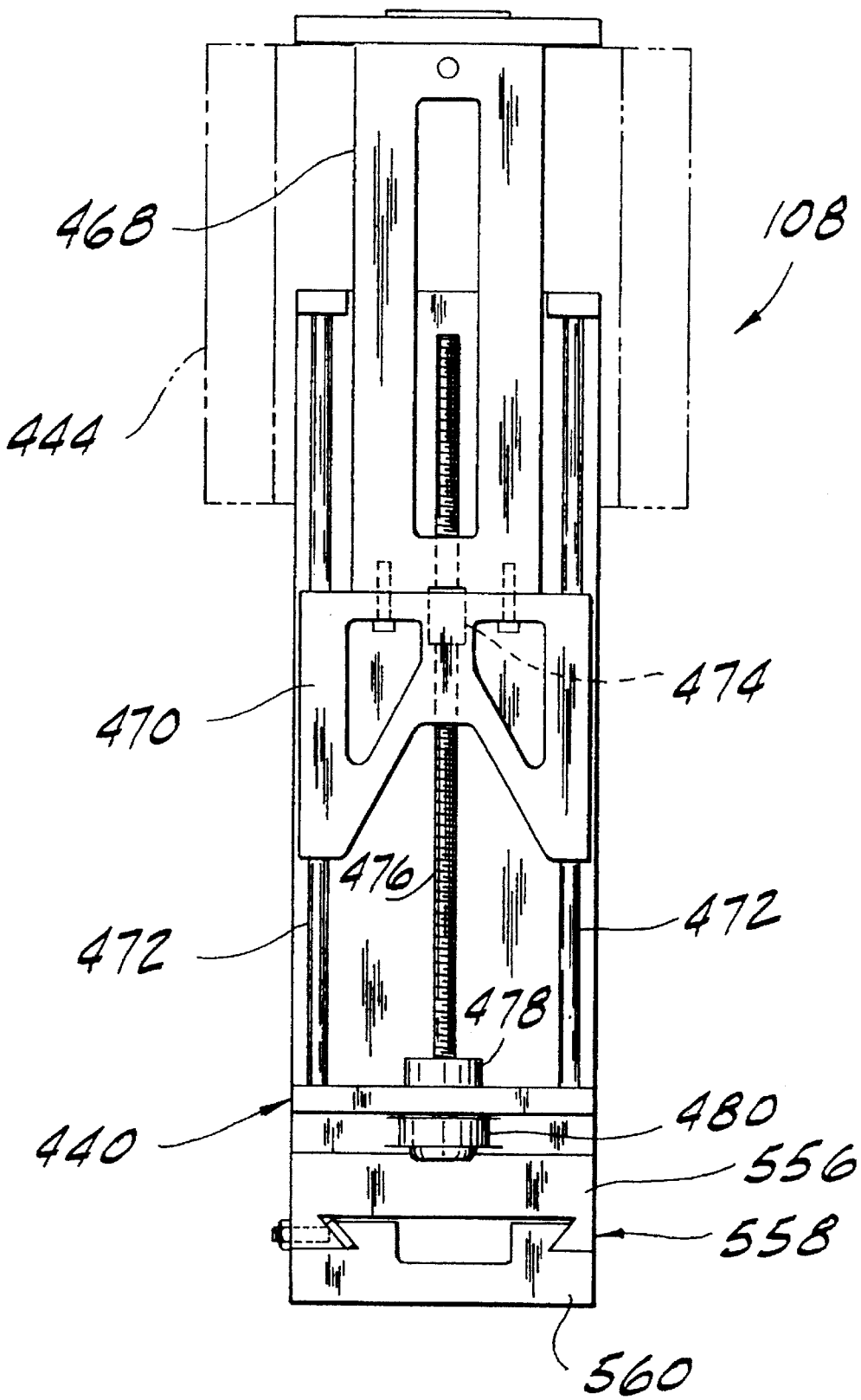
FIG. 17 is a rear elevational view of the wafer delivery station of FIG. 15.
Figure 18:
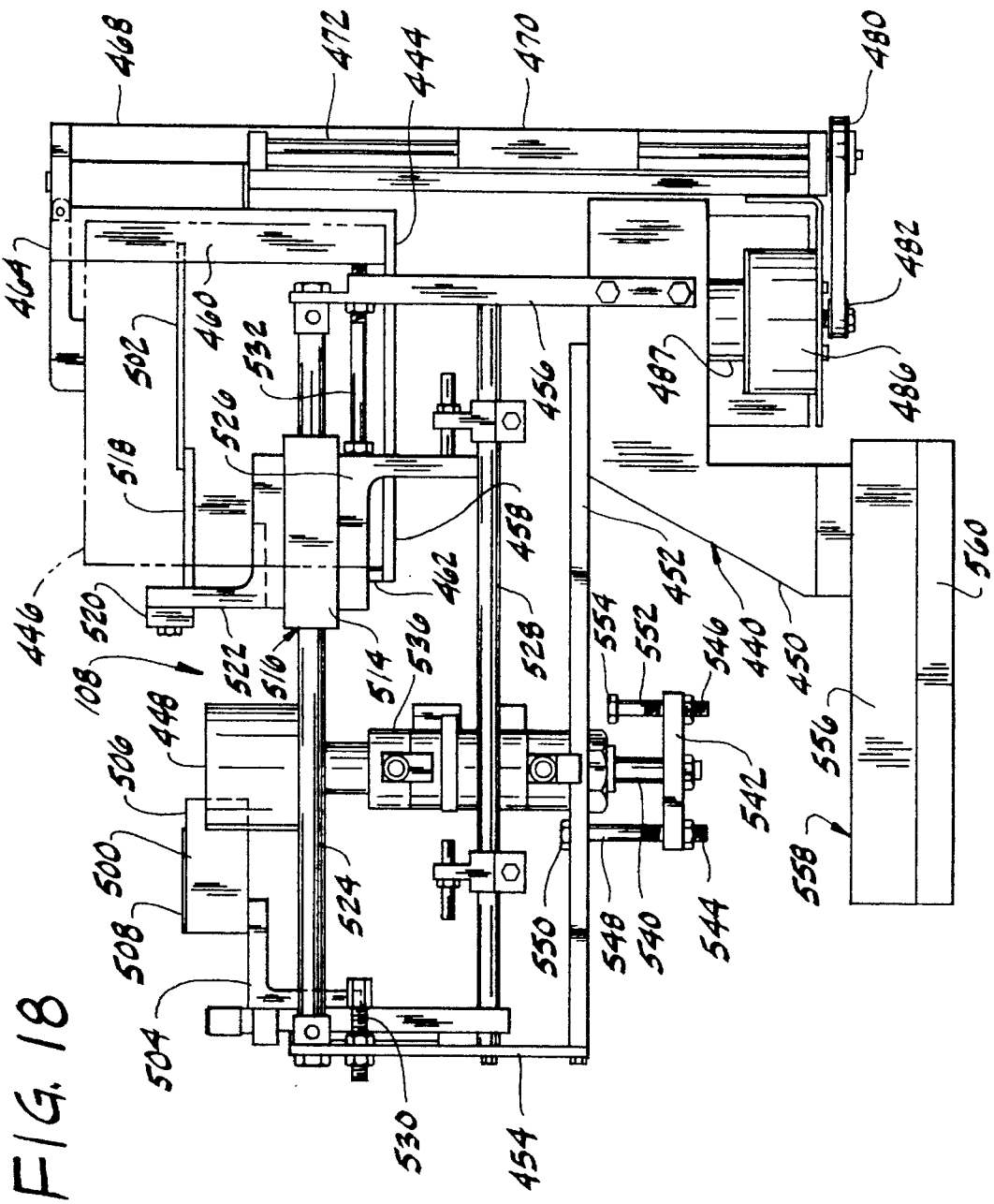
FIG. 18 is a side elevational view similar to FIG. 16 but showing a wafer carrier of the delivery station moved to the right and into a cassette containing a plurality of semiconductor wafers.

The guide block 470 is adapted, via suitable bearings (not shown), for sliding up and down along a pair of generally vertical guide rods 472 which are secured at opposite ends to the delivery station support structure 440 (FIG. 17). Movement of the guide block 470 up and down moves the cassette holder 444 between a raised position and a lowered position. The bottom plate of the cassette holder is shown in FIG. 16 in its raised position at 458R, and in its lowered position at 458L. The guide block 470 has a nut 474 (FIG. 17) affixed thereto in threaded engagement with a vertical screw 476. The screw 476 is mounted at its lower end to the delivery station support structure 440 via a bearing 478 for rotation of the screw about its axis. A first pulley 480 is keyed to the screw 476 and coupled to a second pulley 482 by a belt 484. A servomotor 486, secured to the delivery station support structure 440, rotates the second pulley thereby rotating the first pulley and screw 476. Rotation of the screw 476 raises and lowers the cassette holder 444. Preferably, an encoder 487 is coupled to the shaft of the servomotor 486 for indexing the screw 476 so that the controller 84 may selectively operate the motor to raise and lower the cassette holder 444 to desired levels.

The cassette 446 has a bottom 488, a top 490, a rear wall 492, side walls 494, and an open forward side 496. The opposing inner surfaces of the side walls 494 each have a plurality of laterally extending ribs 498 defining a plurality of wafer receiving grooves. Each rib of one inner surface corresponds with a like rib on the other inner surface and combine to form a pair of ribs adapted for engaging the periphery of a semiconductor wafer W to support the wafer. Preferably, the cassette 446 has twenty-six pairs of ribs 498 for supporting a stack of twenty-five semiconductor wafers.

The platform 442 comprises a stationary stop 500 and a carriage 502 movable on the support structure 440. The stationary stop 500 is generally arcuate in shape. The stationary stop 500 is secured at its underside to a bracket 504 which is secured to the first side support 454 via fasteners (not shown). The stationary stop 500 has a base portion 506 and a lip 508 extending up from a forward side of the base portion (left side as viewed in FIGS. 16 and 18) for engaging the periphery of a semiconductor wafer W. The lip 508 has an arcuate shape generally corresponding to that of the semiconductor wafer W.

Figure 15:
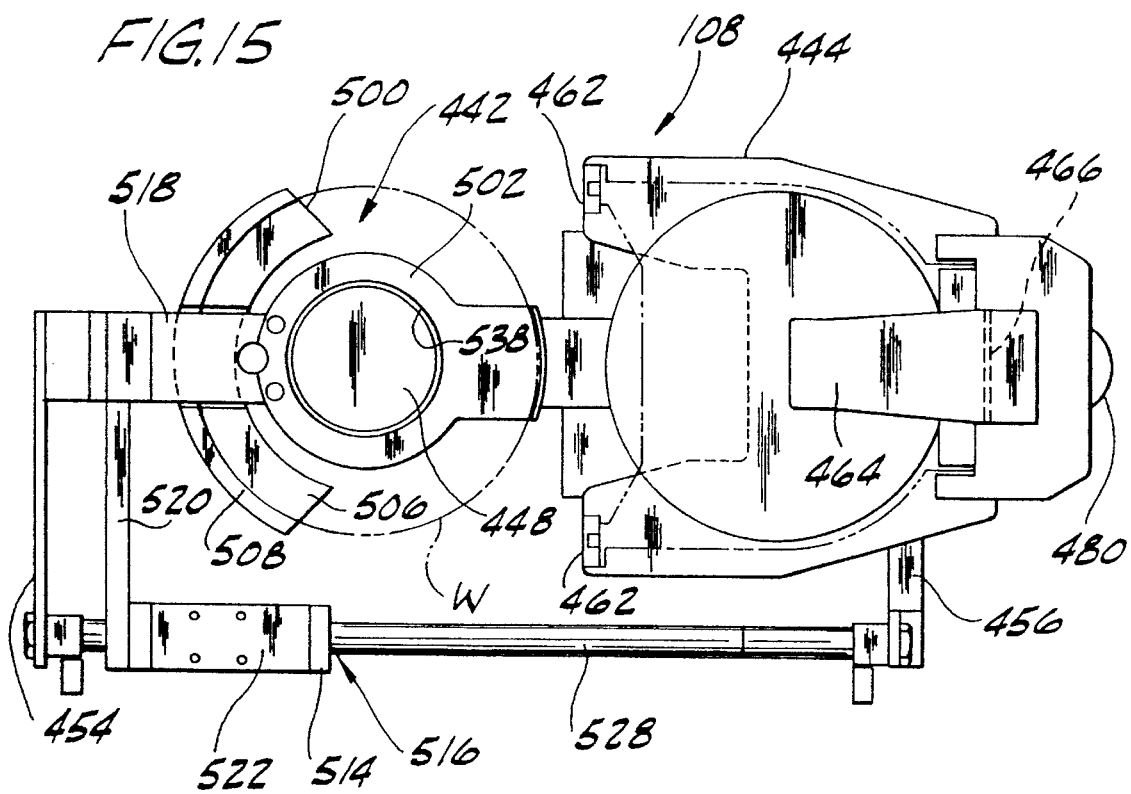
FIG. 15 is a plan view of a semiconductor wafer delivery station of the polishing apparatus of FIG. 1.
Figure 19:
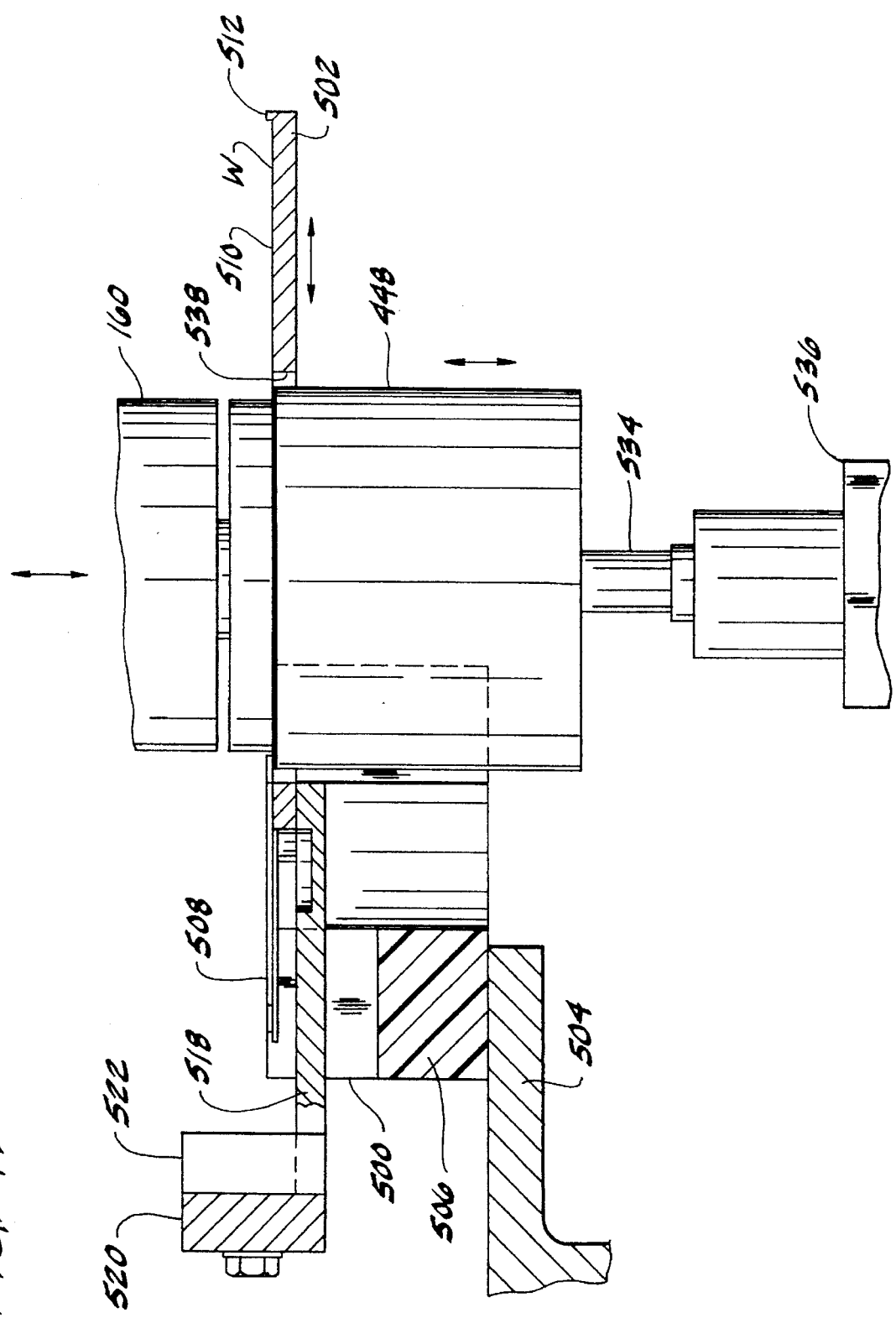
FIG. 19 is an enlarged fragmented side elevational view of the wafer delivery station of FIG. 16 with parts broken away showing a plunger of the delivery station extended to support the underside of a semiconductor wafer when the wafer is engaged by the wafer chuck of the circular robot.

The carriage 502 has a generally planar upper face 510 and a lip 512 (FIG. 19) extending up from a rear edge of the upper face for engaging the periphery of the semiconductor wafer W. The carriage 502 is secured to a piston mounting 514 of a rodless cylinder, generally indicated 516, via carriage support members 518, 520, 522. The piston mounting 514 rides along a barrel 524 of the rodless cylinder 516. The barrel 524 is connected at one end to the first side support 454 and connected at its other end to the second side support 456. A guide bracket 526 extends down from a lower face of the piston mounting 514 and is slidably supported on a guide rod 528 mounted in horizontal position between the first and second side supports 454, 456. First and second carriage limiting stops 530, 532 are secured to the side supports 454, 456 and engageable with the guide bracket 526 for limiting movement of the carriage 502. Actuation of the rodless cylinder 516 moves the carriage 502 from a first (rearward) position (FIG. 18) to a second (forward) position (FIGS. 15, 16, and 19). In the rearward position the carriage 502 is positioned within the wafer holding cassette 446 for engaging a semiconductor wafer W. In the forward position the carriage 502 moves the semiconductor wafer into position on the stationary block 500. The position of the limiting stops 530, 532 may be adjusted to set the range of travel of the carriage 502 (this range may vary depending on the size of the semiconductor wafers in the cassette 446).

The plunger 448 is secured to a first piston rod 534 (FIG. 19) of a pneumatic cylinder 536 (plunger cylinder) mounted to the plunger support 452. Actuation of the plunger cylinder 536 moves the plunger 448 between a lowered position (FIGS. 16 and 18) and a raised position (FIG. 19). In the lowered position, the top of the plunger is spaced below the platform 442. In the raised position, the plunger 448 extends up into a circular opening 538 (FIG. 19) in the carriage 502 and the upper surface of the plunger is substantially flush with the plane of the carriage upper face 510. Preferably, the plunger cylinder 536 has a second piston rod 540 extending down from the cylinder. A limiter support plate 542 is secured adjacent the lower end of the second piston rod 540. First and second plunger limiting stops 544, 546 are secured to the limiter support plate 542. The first limiting stop 544 comprises a first bolt having a first shank 548 extending up from the limiter support plate 542 and through an opening (not shown) in the plunger support 452. A head 550 at the upper end of the first shank 548 engages an upper surface of the plunger support 452 when the plunger 448 is in its lowered position. The second limiting stop 546 comprises a second bolt having a second shank 552 extending up from the limiter support plate 542 and a head 554 at the upper end of the second shank. The head 554 of the second bolt engages the underside of the plunger support 452 when the plunger 448 is in its raised position. The plunger 448 supports the underside of the semiconductor wafer W when the vacuum chuck 160 of the circular robot 100 engages the top side of the semiconductor wafer.

Preferably, the base 450 of the delivery station support structure 440 is secured to an upper member 556 of a dovetail slider, generally indicated 558. A lower member 560 of the dovetail slider 558 is fixed, via suitable structure (not shown) to the support structure (not shown) of the circular robot 100. A dovetail of the upper member 556 mates with a dovetail of the lower member 560 to facilitate sliding of the upper member relative to the lower member. The dovetail slider 558 allows the delivery station 108 to be moved forward and rearward (i.e., toward and away from the rotation axis $Y_R$ of the circular robot 100 (FIG. 5) to adjust the position of the delivery station 108 relative to the circular robot 100.

Initially, the cassette 446 is in its raised position and the carriage 502 is in its forward position. The controller 84 actuates the rodless cylinder 516 to move the carriage 502 to its rearward position and energizes the servomotor 486 to move the cassette holder 444 downward to a position in which the lowest most semiconductor wafer remaining in the cassette rests on the upper face of the carriage 502. The controller 84 then actuates the rodless cylinder 516 to move the carriage 502 forward so that the lip 512 of the carriage 502 engages the periphery of the semiconductor wafer to pull the wafer from the cassette. The rodless cylinder 516 moves the carriage 502 to its forward position where the periphery of the semiconductor wafer W is also engaged by the lip 508 of the stationary stop 500. The controller 84 then actuates the plunger cylinder 536 to move the plunger 448 to its raised position to support the semiconductor wafer W. The vacuum chuck 160 of the circular robot 100 is then lowered to grip the semiconductor wafer W. The circular robot 100 then lifts the semiconductor wafer W and places it in the vacuum press 110.

Figure 20:
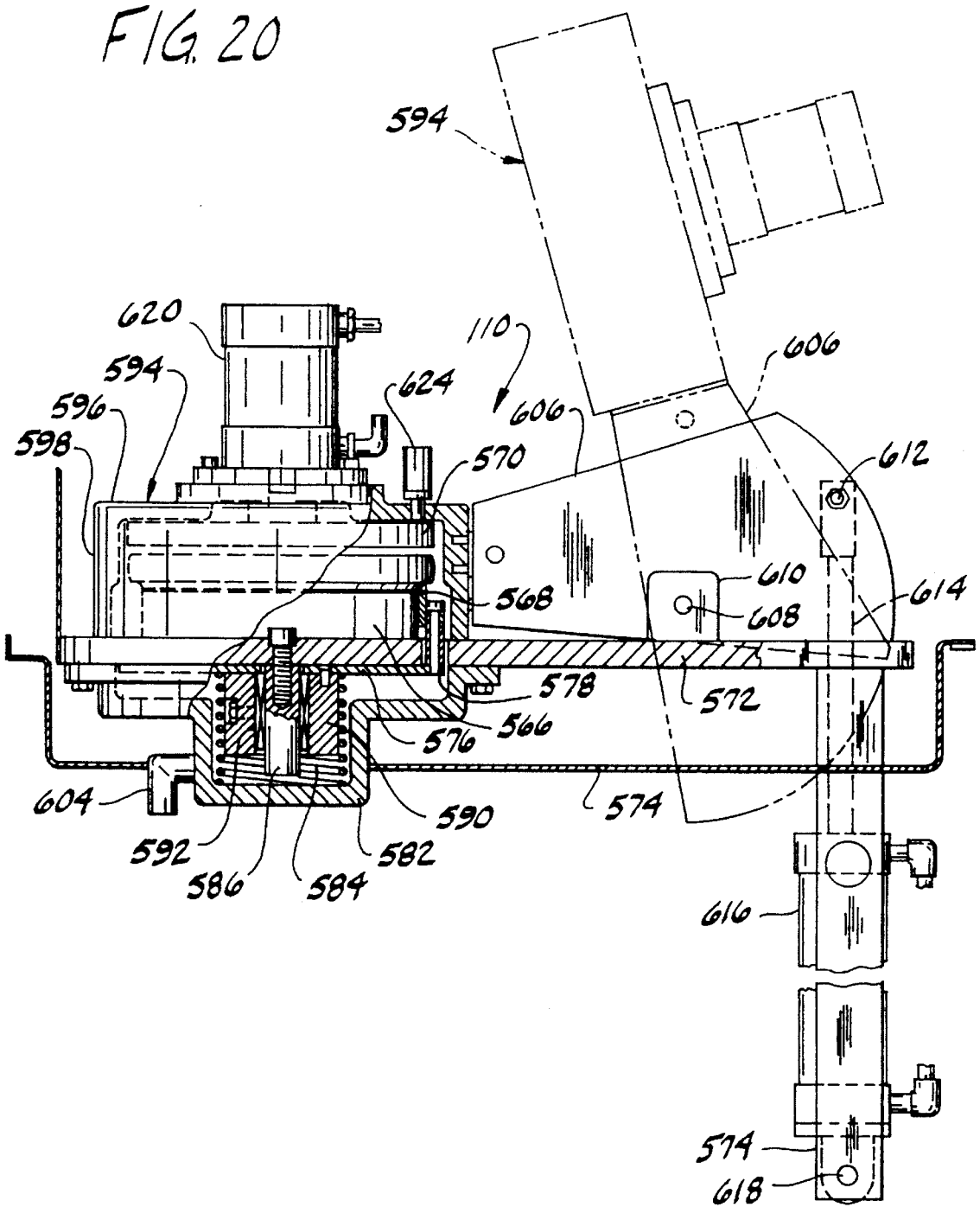
FIG. 20 is a side elevational view of a vacuum press of the polishing apparatus of FIG. 1 with parts broken away to show detail.
Figure 21:
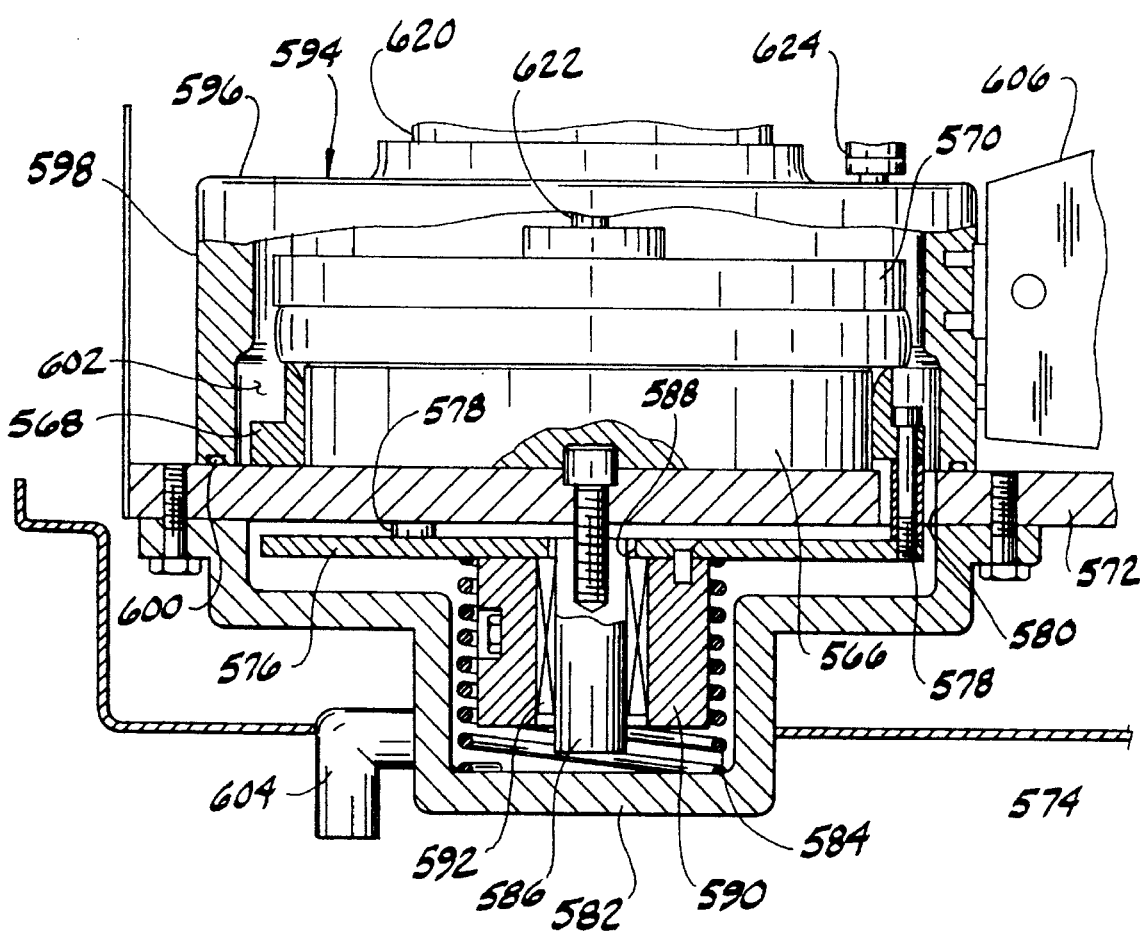
FIG. 21 is an enlarged fragmented sectional view of the vacuum press of FIG. 20, showing a polishing block being pressed against a semiconductor wafer.

Referring to FIGS. 20 and 21, the vacuum press 110, constituting a wafer press station, comprises a disc-shaped wafer pedestal 566, an annular polishing block carrier 568 surrounding the wafer pedestal, and a platen 570 over the wafer pedestal for pressing a polishing block B on the block carrier against a semiconductor wafer W on the wafer pedestal. The wafer pedestal 566 is securely mounted on a base plate 572 which is secured to a press support structure 574. The block carrier 568 is secured to an undercarriage 576 positioned below the base plate 572 by three or more threaded fasteners 578. Each fastener 578 extends downward from the block carrier 568 through a clearance opening 580 in the base plate 572 and to the undercarriage 576. The diameter of the opening 580 is greater than the diameter of the fastener 578 so that the fastener 578 does not engage the base plate 572.

A spring housing 582, secured to the underside of the base plate 572, surrounds the undercarriage 576. A helical compression spring 584 within the spring housing 582 urges the undercarriage 576 and block carrier 568 upward. The block carrier 568 and undercarriage 576 are movable relative to the wafer pedestal 566 from an up position (FIG. 20) to a down position (FIG. 21). Preferably, the spring constant of the spring 584 is sufficient to support the weight of the undercarriage 576, block carrier 568, and a polishing block B placed on the block carrier 568. A downwardly extending cylindric stem 586 is secured at its upper end to the underside of the base plate 572. A clearance opening 588 is provided in the undercarriage 576 for passage of the cylindric stem 586. A sleeve 590 positioned around the cylindric stem 586 is secured to the underside of the undercarriage 576. Bearings 592 are positioned between the cylindric stem 586 and sleeve 590 to permit the sleeve and undercarriage 576 to slide up and down on the stem. The sleeve 590, cylindric stem 586, and bearings 592 prevent canting of the block carrier 568 as the carrier is moved up and down.

An open-bottom hood, generally indicated 594, is configured for enclosing the wafer pedestal 566, block carrier 568, and platen 570. It has an upper wall 596 and a circumferential side wall 598 depending from the upper wall. The side wall 598 is provided with a continuous O-ring seal 600 at its lower edge adapted to seal against the upper surface of the base plate 572. The hood 594 provides an air tight chamber 602 when the seal 600 is seated against the base plate 572. A vacuum line 604 adjacent the spring housing 582 communicates with the chamber 602 to evacuate the chamber when the hood 594 is sealed to the base plate 572. A pivot arm 606 extends laterally from and is secured to the side wall 598. The pivot arm 606 is connected by a pin 608 to tabs 610 (only one of which is shown in FIG. 20) extending up from the base plate 572. The hood 594 is adapted to swing on the pin 608 from a closed position (shown in solid in FIG. 20) to an open position (shown in phantom in FIG. 20). The pivot arm 606 is pin-connected at 612 to a piston rod 614 of a pneumatic cylinder 616 (hood cylinder) pin-connected at 618 to the press support structure 574. The piston rod 614 extends upward from the hood cylinder 616 through an opening (not shown) in the base plate 572. Retraction of the piston rod raises the hood 594 to its open position.

Another pneumatic cylinder 620 (platen cylinder) is mounted to the upper wall 596 of the hood 594. The platen cylinder 620 has a downwardly extending piston rod 622 (FIG. 21) connected to the platen 570 for raising and lowering the platen. Extension of the piston rod 622 moves the platen 570 downward against a polishing block B on the block carriage 568 to press the polishing block B downward against a semiconductor wafer W on the wafer pedestal 566.

Preferably, the semiconductor wafer W is set on the wafer pedestal 566 such that the centroid of the semiconductor wafer will be aligned with the center of the polishing block B when the two are bonded together in the vacuum press 110. This may be accomplished by adjusting the position of the semiconductor wafer W relative to the vacuum chuck 160 of the circular robot 100 when the wafer chuck picks the wafer up from the wafer delivery station 108. The position may be adjusted by adjusting the extension of the piston rod 166 of the vacuum chuck cylinder 166 of the robot arm 140. Alternatively or in addition, the position may be adjusted by moving the upper member 556 of the dovetail slider 558 (FIGS. 16 and 17) of the delivery station 108 relative to its lower member 560 to move the delivery station 108 (and its platform) closer to or farther from the axis $X_R$ of the circular robot 100. Lateral positioning may be adjusted by modifying the circumferential position of the robot arm 140 about its vertical axis $Y_R$ when the vacuum chuck cylinder 166 lifts the wafer from the wafer delivery station 108.

Initially, the hood 594 is in its open position. The circular robot 100 lifts a semiconductor wafer W from the semiconductor wafer delivery station 108 and places the wafer on the wafer pedestal 566. The circular robot 100 then lifts a polishing block B from the block heater 106 and places it wax side down on the block carrier 568. Preferably, the semiconductor wafer W and polishing block B are positioned so that the centroid of the polishing block B directly overlies the centroid of the wafer. The spring force of the spring 584 keeps the polishing block B spaced above the semiconductor wafer W until actuation of the platen cylinder 620. The controller 84 then actuates the hood cylinder 616 to lower the hood 594 to its closed position and to seat the seal 600 against the base plate 572. A vacuum pump (not shown), coupled to the vacuum line 604, is operated by the controller 84 to evacuate the chamber 602. When the pressure in the chamber 602 falls below a predetermined level as sensed by a pressure sensor 624, the controller 84 deenergizes the vacuum pump. Preferably, the chamber 602 is evacuated to a pressure below 10 mm. Hg abs. (10 torr). The platen cylinder 620 is then actuated by the controller 84 to move the platen 570 downward against the polishing block B to press the wax coated face of the polishing block B against the semiconductor wafer W. Preferably, a resilient pad (not shown) is on the wafer pedestal 566 to distribute the pressing force evenly on the wafer W. The wax coating bonds the semiconductor wafer W to the polishing block B. Evacuation of the chamber 602 prevents air bubbles from being entrained between the semiconductor wafer W and wax coating or at least reduces air bubbles to an acceptably insubstantial size and/or degree. After the semiconductor wafer is bonded to the polishing block B, the chamber 602 is vented to the ambient pressure of the first cabinet 52 and the hood 594 is swung to its open position. The polishing block B and semiconductor wafer W are then lifted from the vacuum press 110 by the linear robot 62 and moved to the first temperature regulating spray station 112.

Figure 22:
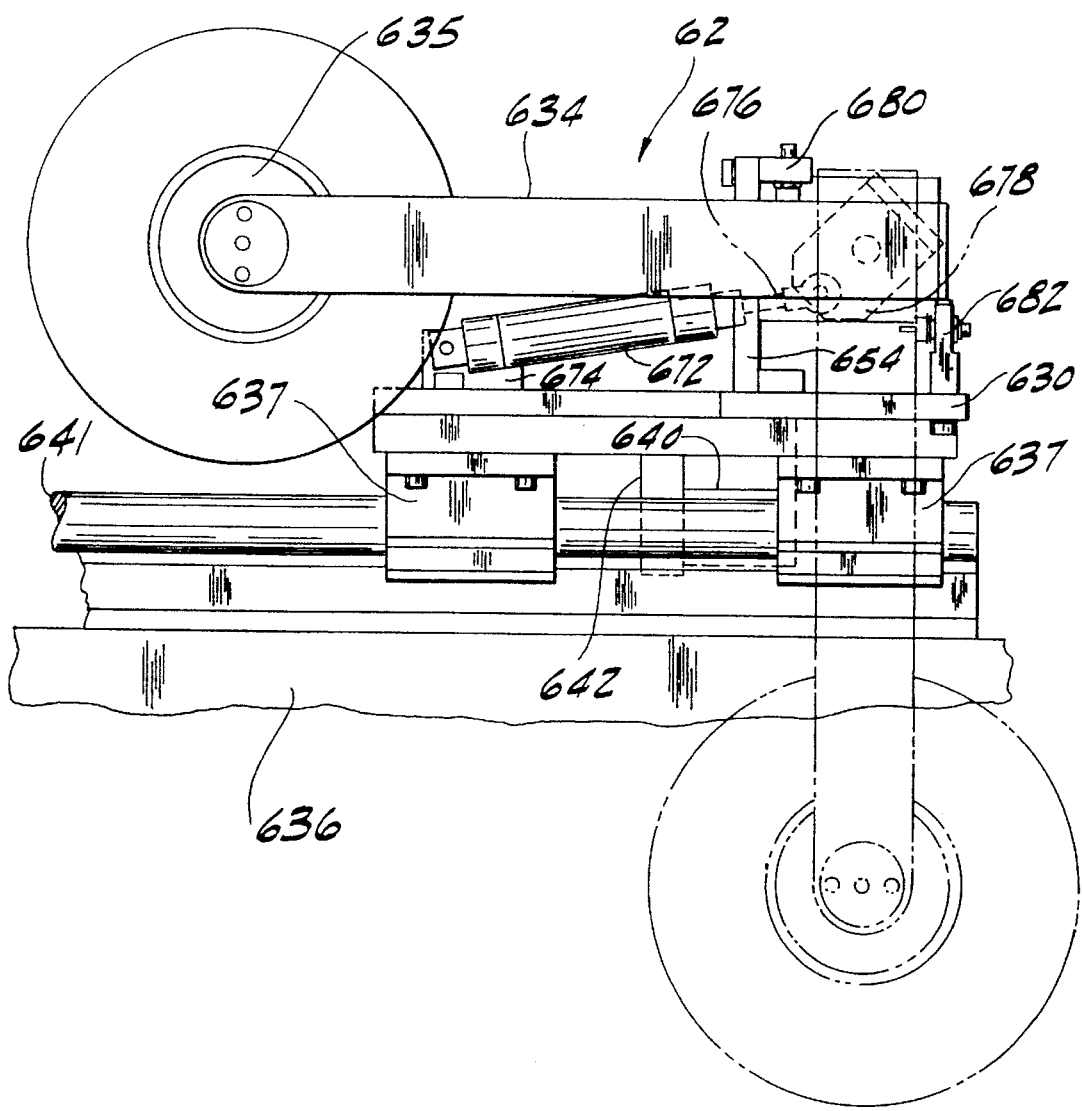
FIG. 22 is a plan view of a linear robot of the polishing apparatus of FIG. 1 showing a vacuum chuck of the linear robot holding a polishing block.
Figure 23:
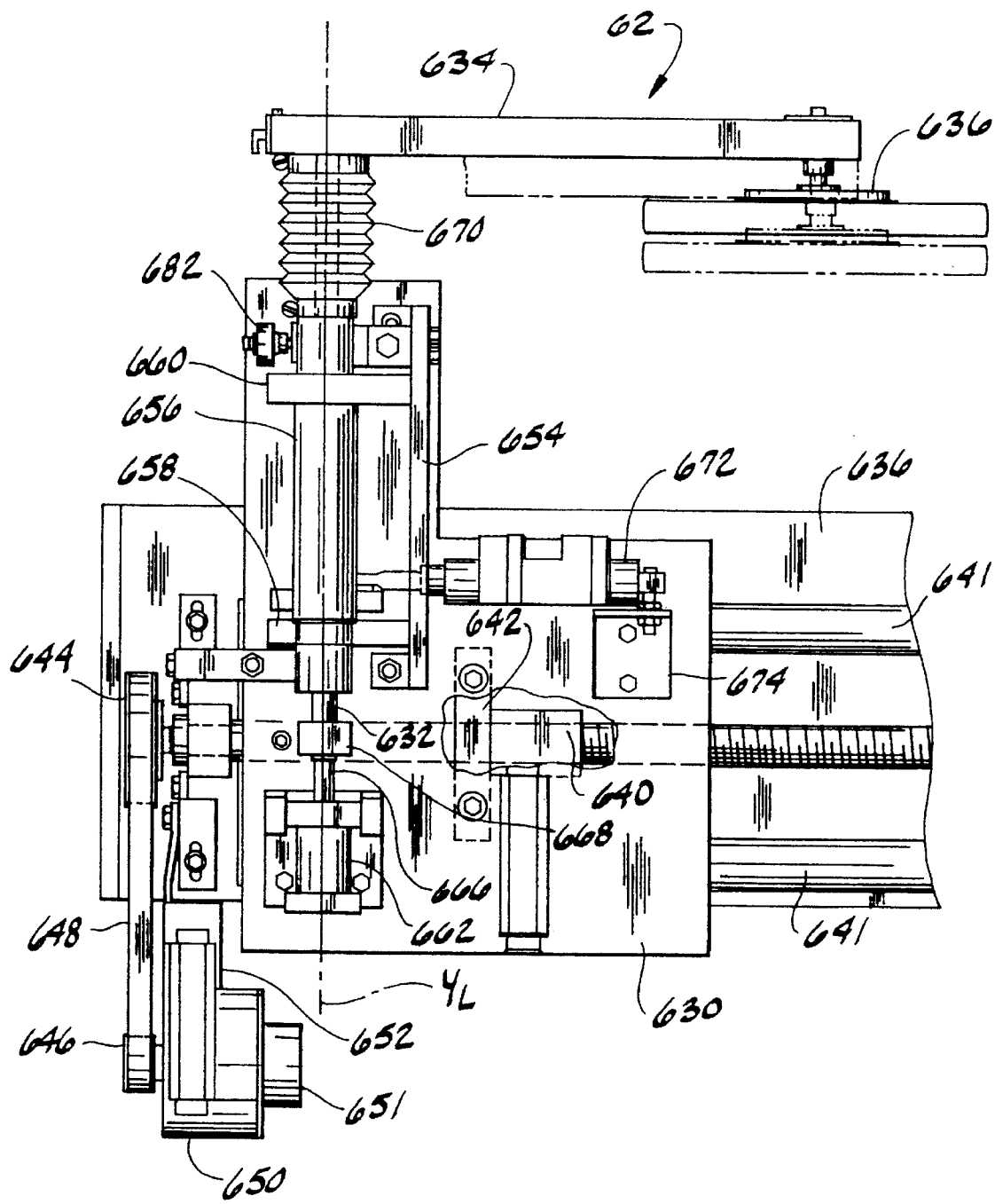
FIG. 23 is a rear side elevational view of the linear robot of FIG. 22 with parts broken away to show detail.
Figure 24:
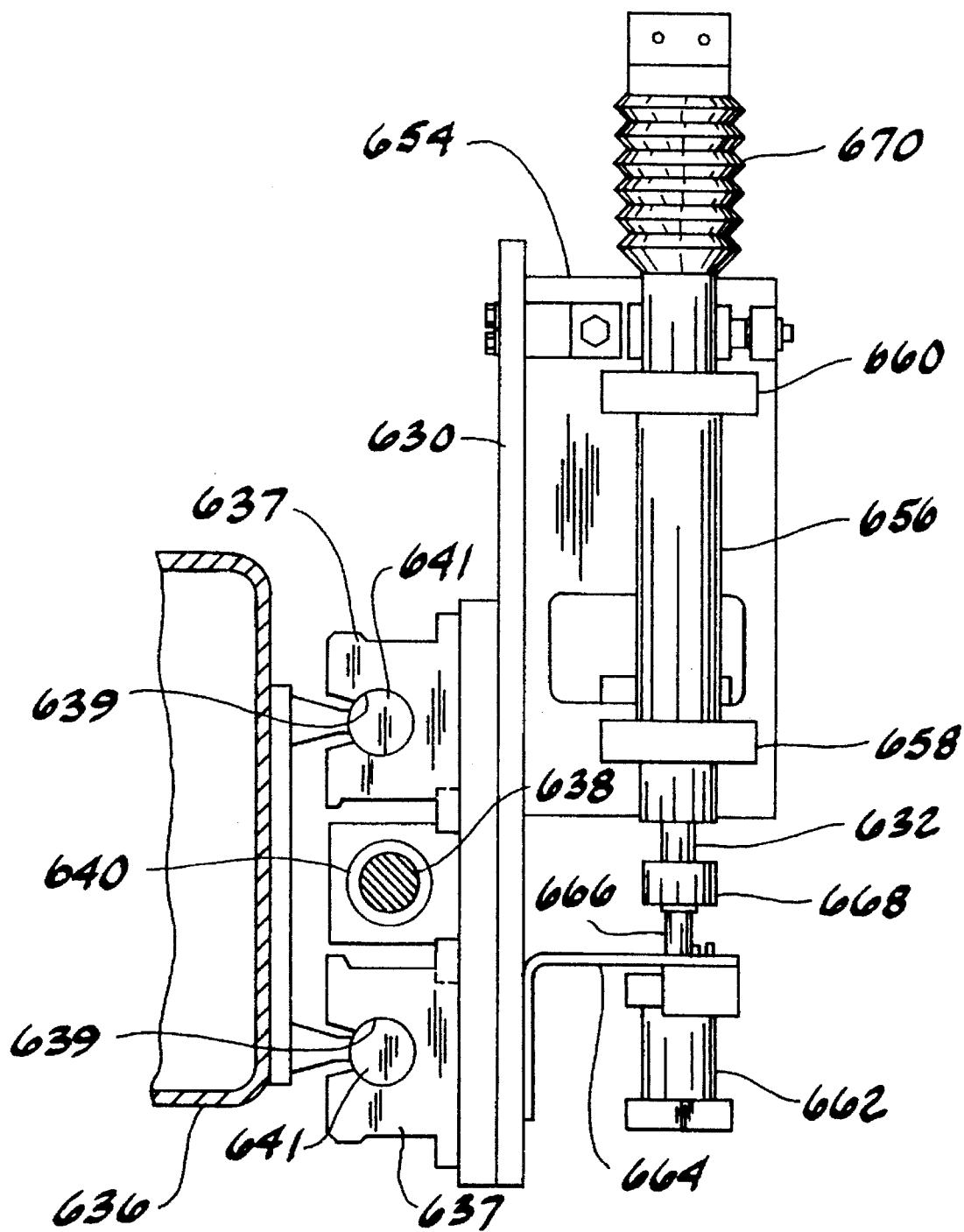
FIG. 24 is an end elevational view of the linear robot of FIG. 22.

Referring to FIGS. 22–24, the linear robot 62 comprises a generally vertical support plate 630, a generally vertical shaft 632 rotatably mounted on the support plate, an arm 634 extending laterally from the top end of the shaft, and a vacuum chuck 635 on the arm for gripping polishing blocks. Slide members 637, secured to the support plate 630, have grooves 639 configured for sliding along a pair of parallel rails 641 secured to an elongate alignment beam 636 (FIGS. 3 and 24). The alignment beam 636 is a structural support for maintaining alignment of and supporting the temperature regulating spray stations 112, 118, 124 and the rough and finish polishing arms 114, 120. It extends substantially the full width of the second cabinet 54 and into the first cabinet 52. An elongate screw 638, parallel to and between the rails 641, is journaled to the alignment beam 636 for rotation about its axis. The rails 641 and screw 638 extend substantially the full width of the second cabinet 54. A threaded block 640 is threaded on the shank of the screw 638 and secured to the support plate 630 by a bracket 642 (FIG. 23). A first pulley 644 (FIG. 23) is keyed to the screw 638 and coupled to a second pulley 646 by a belt 648. A servomotor 650, secured to the alignment beam 636 by a motor bracket 652, rotates the second pulley 646 thereby rotating the first pulley 644 and screw 638. Rotation of the screw 638 about its axis moves the block 640 along the shank of the screw 638 to move the support plate 630 along the rails 641. A sensor 651 is employed to directly or indirectly sense the lateral position of the support plate 630. Preferably, the sensor comprises a shaft encoder coupled to the shaft of the servomotor 650. The controller 84 counts pulses from the encoder responsive to operation of the motor 650 to determine the position of the support plate 630.

A sleeve plate 654 extends from a face of the support plate 630. The sleeve plate 654 supports a cylindric sleeve 656 via bearings 658, 660 for rotation of the sleeve about its axis $Y_L$. The cylindric sleeve 656 is coaxial with and disposed about the shaft 632. It slidably supports the shaft 632 via bearings (not shown) within the sleeve for movement of the shaft up and down relative to the sleeve. The shaft 632 is raised and lowered by a first pneumatic cylinder 662 secured to the support plate 630 by a bracket 664 (FIG. 24). The piston rod 666 of the first cylinder 662 extends upward from the cylinder in line with the shaft 632 and is secured to a connector block 668. The connector block 668 supports the lower end of the shaft 632. Extension of the piston rod 666 moves the shaft 632 upward along its axis $Y_L$ and moves the arm 634 to a raised position (shown in solid in FIG. 23). Retraction of the piston rod 666 moves the shaft 632 downward and moves the arm 634 to a lowered position (shown in phantom in FIG. 23). Preferably, a bellows type boot 670 disposed about an upper portion of the shaft 632 is connected at its lower end to the sleeve 656 and connected at its upper end to the arm 634 for preventing debris from entering into the sleeve.

The arm 634 is also adapted to swing on the axis $Y_L$ from a first orientation (shown in solid in FIG. 22) to a second orientation (shown in phantom in FIG. 22). In the first orientation, the arm 634 is generally parallel to the rails 641. In the second orientation, the arm 634 is generally perpendicular to the rails. Preferably, the arm 634 is in its first orientation when the wafer chuck 635 is positioned over the vacuum press and when the linear robot travels along the rails 641. The arm 634 is moved to its second orientation to place a polishing block B and wafer W on the first temperature regulating spray station 112. Swinging of the arm 634 is caused by rotation of the sleeve 656. The sleeve 656 is rotated about its axis by a second pneumatic cylinder 672 pin connected to a bracket 674 secured to the support plate 630. The piston rod 676 (FIG. 22) of the second cylinder 672 is pin-connected to a lever 678 secured to the sleeve 656. Retraction of the piston rod 676 rotates the sleeve 656 (clockwise as viewed in FIG. 22) to pivot the arm 634 to its first orientation. Extension of the rod 676 rotates the sleeve (counterclockwise as viewed in FIG. 22) to pivot the arm 634 to its second orientation. The second cylinder 676 swings the arm 634 approximately ninety degrees from its first orientation to its second orientation. Preferably, first and second mechanical stops 680, 682 secured to plates 654, 630, respectively, are adapted to limit rotation of the sleeve 656.

After a semiconductor wafer W is wax-mounted to a polishing block B, the controller 84 energizes the servomotor 650 to turn the screw 638 and move the support plate 630 along the rails 641 to a position in which the vacuum chuck 635 directly overlies a polishing block at the vacuum press 110. The controller 84 then actuates cylinder 662 to lower the arm 634 to a position in which the vacuum chuck 635 engages the second (upper) face of the polishing block B, the semiconductor wafer W being secured to the first (lower) face of the polishing block. The controller 84 then activates the vacuum chuck 635 to grip the second face of the polishing block B. The arm 634 is thereafter raised and the screw 638 is turned in the opposite direction to move the support plate 630 back along the rails 641 to a position adjacent the first temperature regulating spray station 112. Upon arrival of the support plate adjacent station 112, the controller 84 actuates cylinder 672 to swing the arm 634 approximately ninety degrees from its first orientation to its second orientation to position the semiconductor wafer W and polishing block B over the first temperature regulating spray station 112. The arm 634 is then moved to its lowered position and the vacuum chuck 635 releases the polishing block B to deposit the polishing block, wafer side-down, on the first spray station 112.

Figure 25:
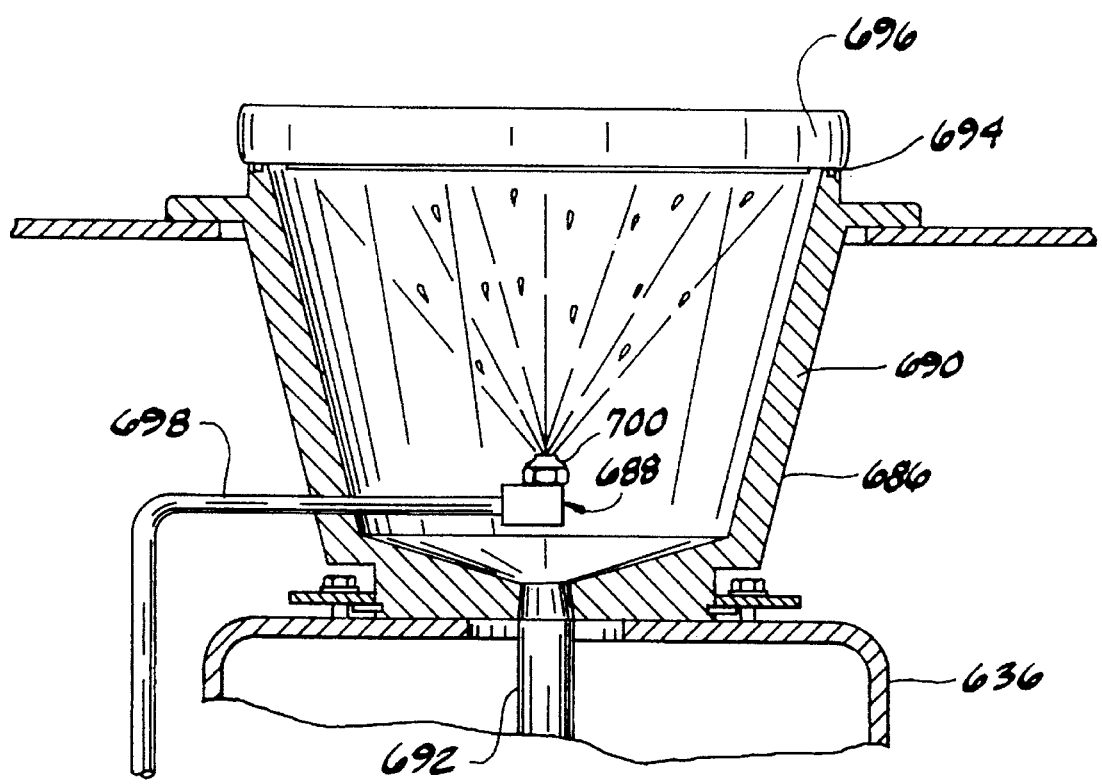
FIG. 25 is a temperature regulating spray station of the polishing apparatus of FIG. 1 showing a sprayer spraying a semiconductor wafer mounted to the underside of a polishing block.

Referring to FIG. 25, the first temperature regulating spray station 112 comprises a sink 686 secured to the alignment beam 636 and a sprayer 688 within the sink. The sink 686 includes a bowl 690 and a drain 692 at the bottom of the bowl. An upper edge 694 of the bowl 690 constitutes a platform for receiving the polishing block B. Preferably, an O-ring seal 696 is provided at the upper edge 694 for sealing against leakage between the bowl 690 and the polishing block B. The sprayer 688 comprises a supply tube 698 extending laterally through the bowl 690 and a spray nozzle 700 adapted to spray the polishing block B and wafer W with a temperature regulating fluid (preferably deionized water). Preferably, the spray of the temperature regulating fluid reduces the temperature of the polishing block B and semiconductor wafer W from the bonding temperature (preferably 85°–100° C.) to substantially the temperature at which the semiconductor wafer is polished by the rough polisher (preferably 50°–70° C. and more preferably 58°–62° C.). The temperature of the fluid may be controlled (e.g., heated or cooled) or it may be groundwater temperature. However, it is to be understood that the temperature of the fluid should remain relatively constant for each semiconductor wafer sprayed.

The second and third temperature regulating spray stations 118, 124 are not shown in detail. However, it is to be understood that all three temperature regulating spray stations are similar, and that the description of the first suffices for a description of the second and third.

After a semiconductor wafer W is mounted to the polishing block B, the linear robot 62 lifts the block and wafer from the vacuum press 110 and places the block wafer side down on the bowl platform 694. The controller 84 then operates the spray station 112 to spray the temperature regulating fluid on the underside (first face) of the polishing block B and on the underside (second face) of the semiconductor wafer W for a predetermined time (e.g., 15–25 seconds). Then the polishing arm of the first (rough) polisher lifts the polishing block B and semiconductor wafer W from the bowl platform 694 and presses the semiconductor wafer against the polishing table of the rough polisher.

Figure 26:
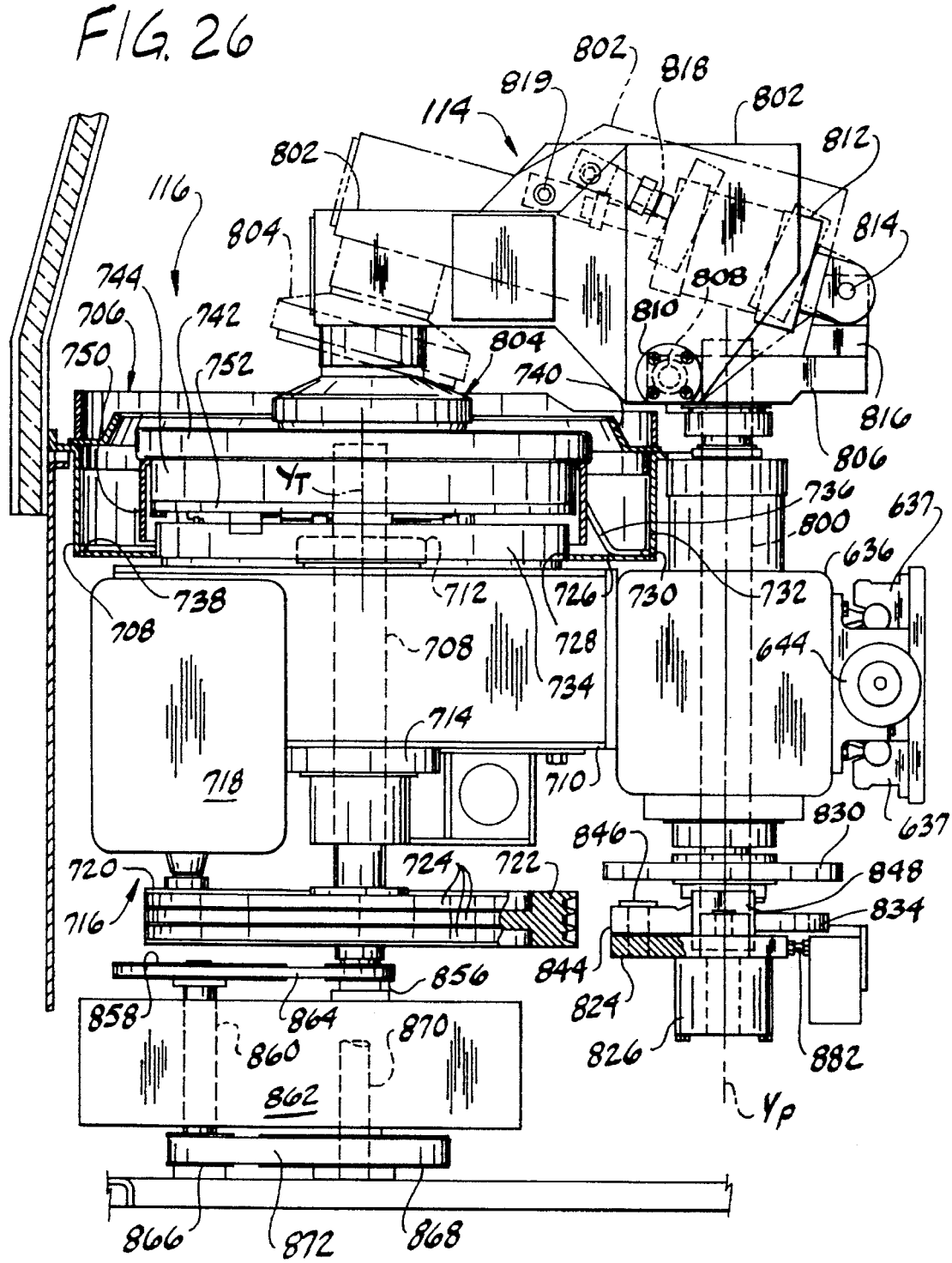
FIG. 26 is a side elevational view of a rough polisher of the polishing apparatus of FIG. 1.

Referring to FIG. 26, the rough polishing table 116 comprises a polishing table assembly, generally indicated 706, an upright hollow shaft 708 (table shaft) secured at its upper end to the table assembly for supporting the table assembly, and a stationary pan 709 for collecting polishing solution runoff from the table assembly. The table shaft 708 is journaled in a box-shaped support 710 via upper and lower bearings 712, 714 for rotation of the polishing table assembly 706 about the axis $Y_T$ of the table shaft. Preferably, the box shaped support 710 is secured to the alignment beam 636. The table shaft 708 is turned by a table drive mechanism, generally indicated 716, comprising a motor 718 (table motor) mounted to the first cabinet 52, a drive pulley 720 keyed to the shaft of the motor, a large driven pulley 722 keyed to the table shaft 708, and three belts 724 trained around the pulleys. Operation of the table motor 718 rotates the table assembly 706 about the axis $Y_T$. Preferably, the table motor 718 is a servomotor with a shaft encoder coupled to the shaft of the motor. The controller 84 uses the encoder to vary the rotational speed of the table assembly 706.

The pan 709 is generally annular in shape and has an annular shaped bottom plate 726 defining an inner edge 728 and an outer edge 730. An outer wall 732 extends upward from the outer edge 730 of the bottom plate and an inner wall 734 extends upward from the inner edge 728. Polishing solutions poured onto the table assembly 706 during polishing run off the periphery of the table assembly and into the pan 709. A drain (not shown) is provided in the pan 709 for draining the collected solutions. Water tubes 736, 738 are also provided in the pan 709 for flushing any particulate material collected in the pan. A sling shield 740 extends up from the pan 709 to deflect spattered polishing solution into the pan.

Figure 27:
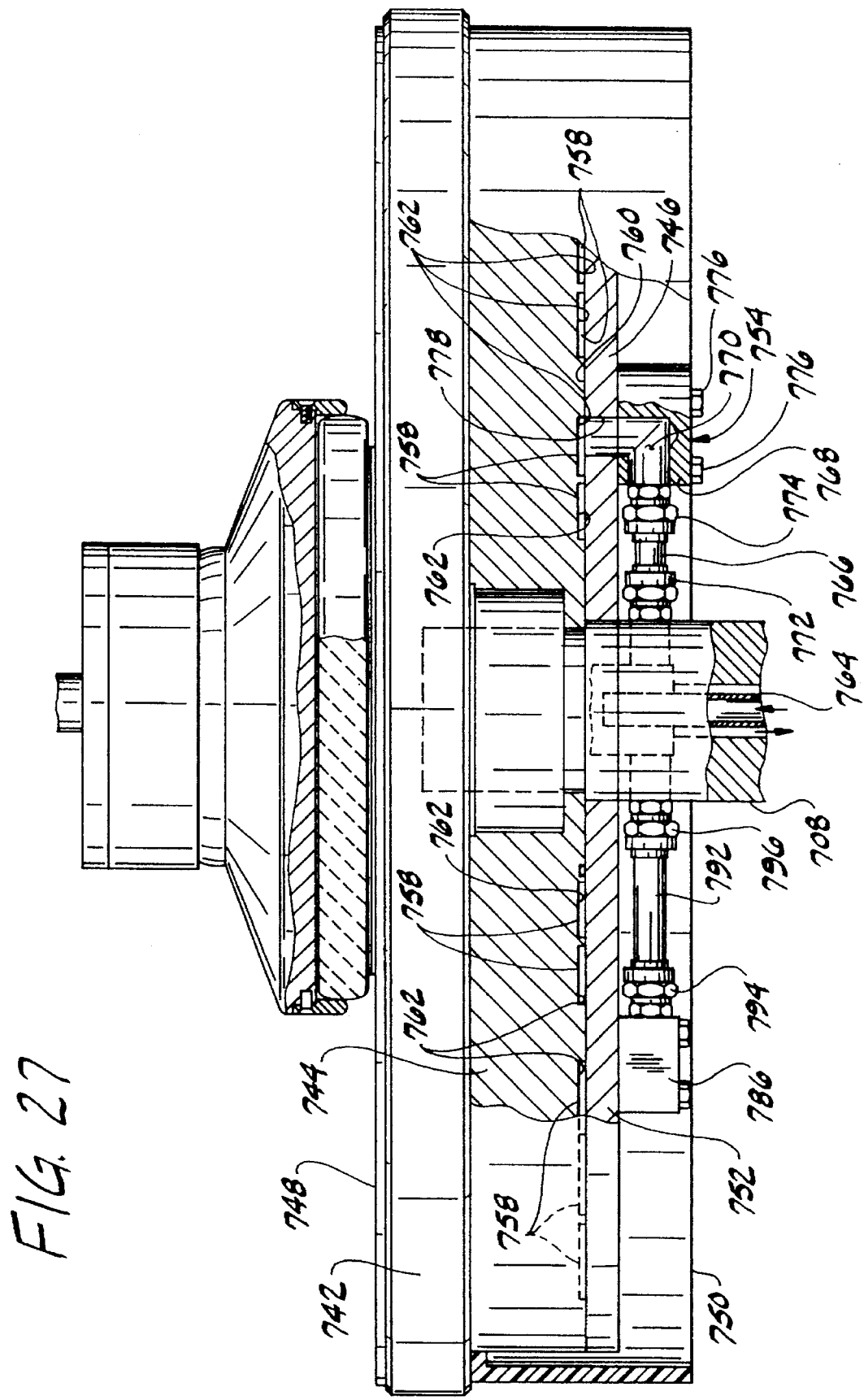
FIG. 27 is an enlarged, fragmented, side elevational view of a polishing table assembly and a chuck assembly of the rough polisher of FIG. 26 with parts broken away to show detail.
Figure 28:
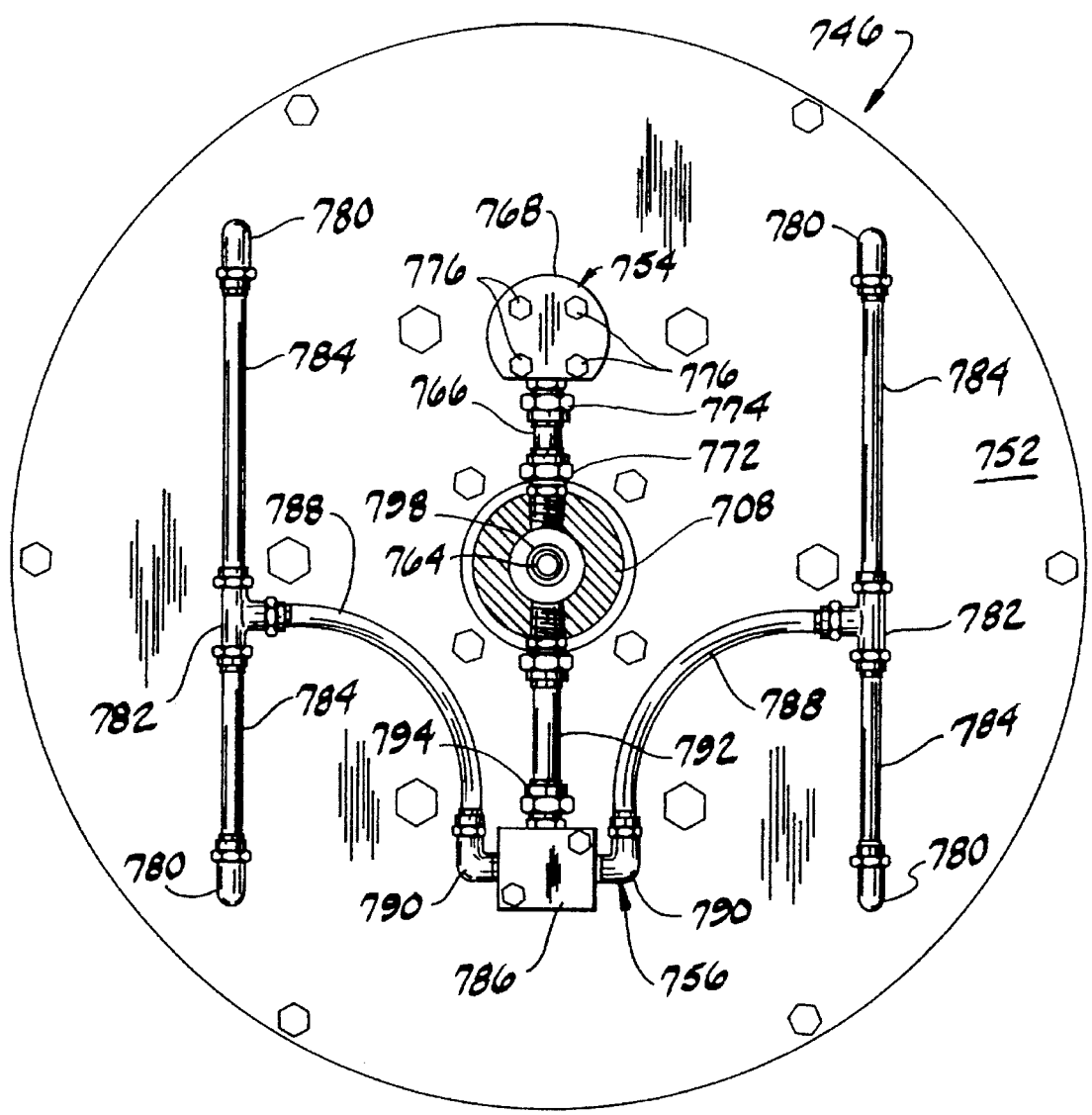
FIG. 28 is a bottom plan view of the polishing table assembly of FIG. 27.

Referring to FIGS. 26–28, the polishing table assembly 706 comprises a ceramic upper table 742, a metal (preferably steel) subtable 744 secured to the underside of the ceramic table, and a temperature regulating system, generally indicated at 746, secured to the underside of the subtable. A replaceable polishing pad 748 (constituting a polishing member) is adhesively secured to the upper surface of the ceramic table. Preferably, this polishing pad 748 of the rough polisher is of a synthetic fiber felt impregnated with a polymeric resin, such as pads commercially available from Rodel, Inc., of Newark, Del., Negasi California Corporation, of Sunnyvale, Calif., and Fujimi Corporation of Elmhurst, Ill. The subtable 744 may be formed by machining a steel plate. The subtable 744 enhances the rigidity of the ceramic table 742. Preferably, an annular skirt 750 depends from the underside of the ceramic table 742 to prevent polishing solution from spattering on the subtable 744 and temperature regulating system 746.

The temperature regulating system 746 comprises a disc-shaped plate 752 secured to the underside of the subtable 744, a fluid injector assembly, generally indicated 754, and a fluid drain assembly, generally indicated 756 (FIG. 28). The fluid injector assembly 754 introduces a temperature regulating fluid (e.g., water) into fluid channels 758 defined by the upper surface 760 of the plate 752 and a series of interconnected grooves 762 (preferably, concentric grooves interconnected by radial grooves) formed in the underside of the subtable 744. The fluid injector assembly 754 comprises an inlet tube 764 extending up through an axial bore in the table shaft 708, a connector tube 766 extending laterally outwardly through a radial bore in the table shaft 708, and an injector block 768 having an internal fluid passageway 770. The connector tube 766 is connected at one end to the table shaft 708 via fitting 772 and connected at its other end to the injector block 768 via fitting 774. The connector tube 766 is in fluid communication with the inlet tube 764 in the table shaft 708. The injector block 768 is secured via threaded fasteners 776 to the jacket plate 752. The internal fluid passageway 770 of the injector block 768 is aligned with an opening 778 through the jacket plate 752. Temperature regulating fluid flowing upward through the inlet tube 764 flows through the connector tube 766 and injector block 768 and into the fluid channels 758. The fluid channels 758 define a tortuous fluid path on the underside of the subtable 744 through which the temperature regulating fluid passes.

The fluid drain assembly 756 includes four tube elbows 780 connected to the underside of the jacket plate 752 and in fluid communication with the fluid channels 758. The four elbows 780 are connected to two T-fittings 782 via tubes 784 and the T-fittings are connected to a drain manifold 786 via curved tubes 788 and fittings 790. A drain connector tube 792 is connected at one end to the drain manifold 786 via fitting 794 and connected at its other end to the table shaft 708 via fitting 796. A discharge passageway 798, defined by the outer surface of the inlet tube 764 and the wall of the axial bore in the table shaft 708, extends down through the table shaft for passage of the drained fluid.

During polishing, the temperature regulating fluid is introduced into the fluid channels 758 via the injector assembly 754 and is drained from the channels via the drain assembly 756. Preferably, the fluid is introduced into the channels 758 at a constant rate and at a constant temperature, preferably in the range of 25°–50° C. Because the fluid flow rate and temperature are constant, the temperature gradient through the subtable 744 and ceramic table 742 (i.e., the temperature differential from the lower surface of the subtable to the upper surface of the ceramic table) remains substantially constant for each polishing cycle performed by the rough polishing table 116. In other words, the temperature gradient through the polishing table assembly 706 during polishing of one semiconductor wafer is the same as the temperature gradient during polishing of subsequently polished semiconductor wafers. By maintaining this constant temperature gradient, the shape of the polishing surface of the table assembly 706 (i.e., the upper surface of the polishing pad 748) remains constant for each of a plurality of serially polished wafers.

Referring to FIGS. 26 and 29–31, the rough polishing arm 114 comprises an upright shaft 800 (polishing arm shaft) extending through the alignment beam 636, an arm member 802 at the upper end of the polishing armshaft, and a chuck assembly, generally indicated 804, mounted to the arm member for gripping polishing blocks (as explained below). The polishing arm shaft 800 is rotatably supported by the alignment beam 636 for rotation about a vertical axis $Y_P$. A support member 806 is secured to the upper end of the shaft 800. Coaxially aligned pins 808 (only one of which is shown in FIG. 26) extend laterally from the support member 806. The arm member 802 is connected to the pins 808 by bearings 810 which enable the arm member 802 to pivot on the pins 808 about a horizontal axis. The arm member 802 is pivoted on the pins 808 by a pneumatic cylinder 812 (arm cylinder) pin connected at 814 to a bracket 816 extending up from the support member 806. The piston rod 818 of the arm cylinder 812 is pin connected at 819 to the arm member 802. Extension of the piston rod 818 moves the arm member 802 and chuck assembly 804 from a lowered position (shown in solid in FIG. 26) to a raised position (shown in phantom in FIG. 26). In the lowered position, a semiconductor wafer W bonded to the underside of a polishing block B held by the chuck assembly 804 is pressed against the rough polishing pad 748. In the raised position, the semiconductor wafer W and polishing block B are spaced above the polishing pad 748.

Preferably, the air pressure in the arm cylinder 812 is variably controlled by the controller 84 so that the pressure at which the semiconductor wafer W is pressed against the polishing pad 748 may be varied. An infrared temperature sensor (not shown) on an upper panel of the first cabinet 52 senses the temperature of the polishing pad 748. Preferably, this temperature sensor is aimed at a portion of the pad most recently contacted by the semiconductor wafer and adjacent the polishing block to monitor the polishing temperature. The controller 84 may control the pressure exerted by the arm cylinder 812 in response to the temperature sensed by the infrared sensor to control the polishing temperature. In other words, if the temperature sensed by the sensor increases, the controller 84 may reduce the pressure of the cylinder 812; if the temperature decreases, the controller 84 may increase the pressure. Thus, the polishing temperature remains constant during polishing.

The rough polishing arm 114 rotates on its axis $Y_P$ from a first position to a second position and then from the second position to a third position. In the first position the chuck assembly 804 is positioned over the first temperature regulating spray station 112. In the second position the chuck assembly 804 is positioned over the rough polishing table 116. In the third position the chuck assembly 804 is positioned over the second temperature regulating spray station 118. During polishing, i.e., when the polishing arm 114 is in its second position, the polishing armshaft 800 oscillates about its axis $Y_P$ to oscillate the chuck assembly 804 back and forth (right to left as viewed in FIG. 3).

Figure 29:
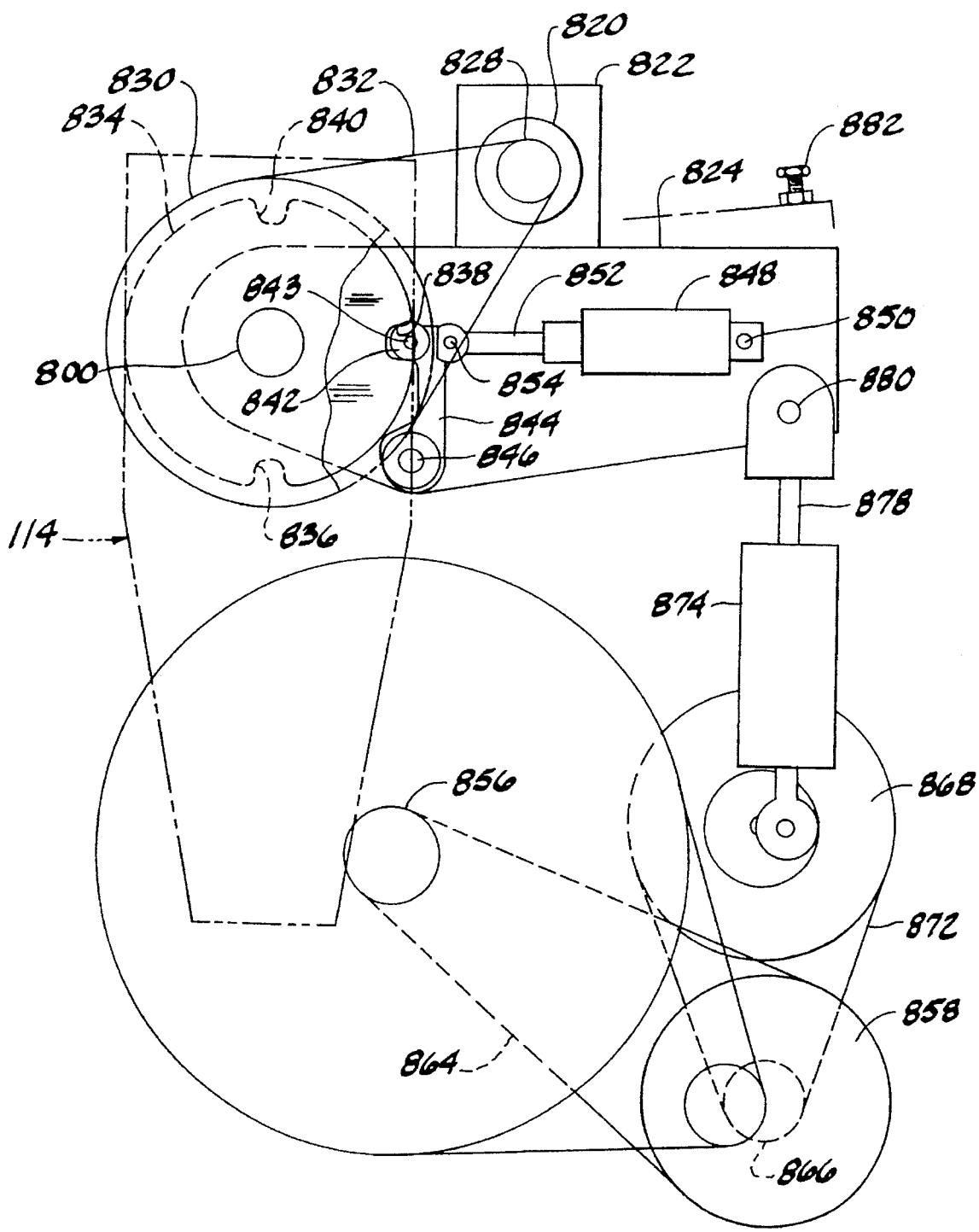
FIG. 29 is a schematic top plan view showing a drive mechanism of the rough polisher of FIG. 26.
Figure 30:
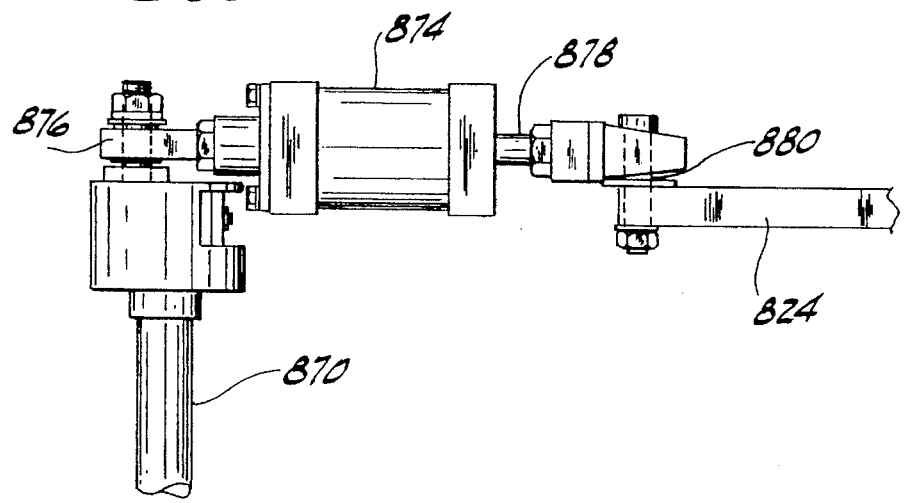
FIG. 30 is a side elevational view of an oscillation cylinder and other components of the drive mechanism of the rough polisher of FIG. 26.
Figure 31:
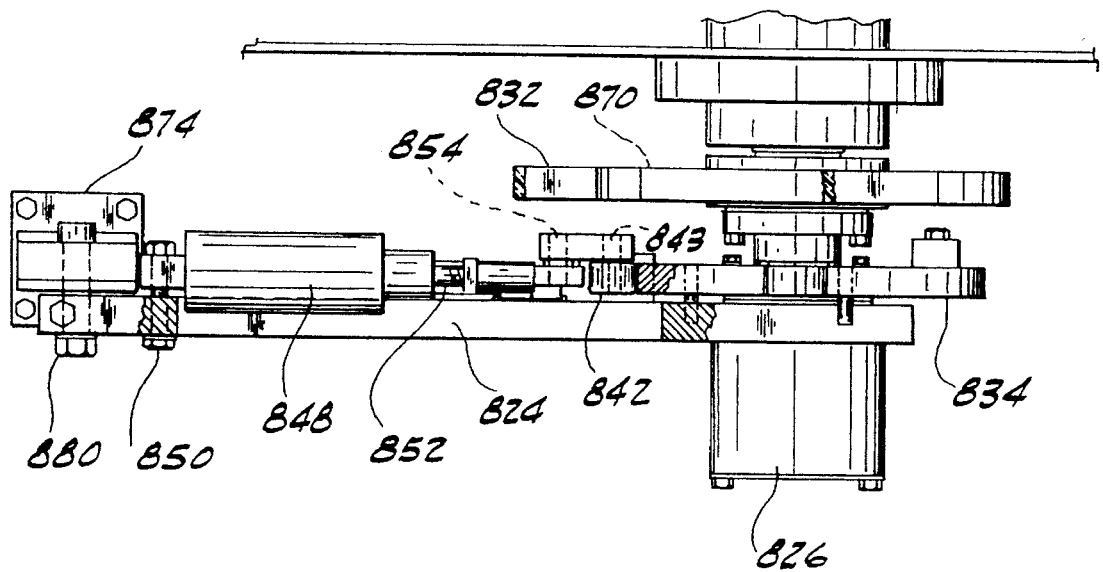
FIG. 31 is a rear elevational view of the mechanism of the rough polisher of FIG. 26.

Referring to FIGS. 29–31 movement of the rough polishing arm 114 to its first, second, or third positions is accomplished by a servomotor 820 (polishing arm motor) controlled by the controller 84. The polishing arm motor 820 is secured via a motor bracket 822 to an oscillation plate 824. The oscillation plate 824 is pivotally connected to the lower end of the polishing arm shaft 800 by a bearing assembly 826. As described below, the oscillation plate 824 is adapted to pivot about the axis $Y_P$ of the polishing arm shaft 800. However, the oscillation plate 824 is releasably fixed in the position shown in FIG. 26 during movement of the rough polishing arm 114 to any of its three positions. A drive pulley 828 is keyed to the shaft of the polishing arm motor 820 and a driven pulley 830 is keyed to the polishing arm shaft 800. A belt 832 is trained around the pulleys 828, 830 to rotate the driven pulley 830 and polishing arm shaft 800 upon operation of the motor 820. The controller 84 in combination with a shaft encoder (not shown) determines the position of the polishing arm shaft 800 as it rotates about the axis $Y_P$. An indexing wheel 834 is keyed to the polishing arm shaft 800 and rotates therewith. The indexing wheel 834 has first, second, and third indexing slots 836, 838, 840. The indexing slots extend radially inwardly from the periphery of the indexing wheel 834. The third indexing slot 840 is positioned approximately 180° from the first indexing slot 836. The second indexing slot 838 is positioned approximately 90° from the first indexing slot 836 and approximately 90° from the third indexing slot 840.

A roller 842, sized to fit in the indexing slots, is pinned to a short pivot arm 844 which is pinned at 846 to the oscillation plate 824. When the polishing arm shaft 800 is moved to one of its first, second, or third positions, one of the indexing slots aligns with the roller 842 which may be pushed into the indexing slot to lock the indexing wheel 834 and polishing arm shaft 800 in fixed position relative to the oscillation plate 824. The roller 842 is moved into and out of engagement with the indexing slots by a pneumatic cylinder 848 (indexing cylinder) pin connected at 850 to the oscillation plate 824. The piston rod 852 of the indexing cylinder 848 is pin connected at 854 to the pivot arm 844. Extension of the piston rod 852 moves the roller 842 into one of the indexing slots and in locking engagement with the indexing wheel 834. Retraction of the piston rod 852 moves the roller 842 out of the indexing slot and out of locking engagement with the indexing wheel 834.

When the rough polishing arm 114 is rotated by the polishing arm motor 820 to its first position, the first indexing slot 836 aligns with the roller 842. When the polishing arm 114 is rotated to its second position, the second indexing slot 838 aligns with the roller 842. When the polishing arm 114 is rotated to its third position, the third indexing slot 840 aligns with the roller 842. Thus, if the polishing arm 114 is in one of its first, second, and third positions, extension of the piston rod 852 locks the polishing armshaft 800 to the oscillation plate 824.

During polishing, the polishing arm is locked in its second position, i.e., the roller 842 is positioned in the second indexing slot 838. Also during polishing, as mentioned above, the polishing armshaft 800 is oscillated about its axis $Y_P$. Oscillation of the polishing arm shaft 800 about the axis $Y_P$ is caused by rotation of the table shaft 708 about the axis $Y_T$. A first oscillation inducing pulley 856 (FIGS. 26 and 29) is keyed to the table shaft 708. A second oscillation inducing pulley 858 is keyed to an upper portion of a shaft 860 journaled in a mounting plate 862. The mounting plate 862 is fixed via suitable structure (not shown) to the box-shaped support 710. A belt 864 is trained around the first and second oscillation inducing pulleys 856, 858 so that rotation of the table shaft 708 rotates shaft 860. A third oscillation inducing pulley 866 is keyed to a lower portion of shaft 860 and a fourth oscillation inducing pulley 868 is keyed to a lower portion of a shaft 870 journaled in the mounting plate 862. A belt 872 is trained around the third and fourth pulleys 866, 868 so that rotation of shaft 860 causes rotation of shaft 870.

A pneumatic cylinder 874 (oscillation cylinder) is rotatably connected to an upwardly projecting stem 876 (FIG. 30) extending up from an upper portion of shaft 870. The piston rod 878 of the oscillation cylinder 874 is pin connected to the oscillation plate 824 via a pin 880. The stem 876 is generally parallel to but eccentric to (offset laterally from) the axis of rotation of shaft 870. During polishing, the oscillation cylinder 874 acts as a fixed length link (i.e., its piston rod 878 is not moved in and out during polishing) coupling the eccentric stem to the oscillation plate 824. Operation of the table motor 718 causes shaft 860 to rotate about its axis. Rotation of shaft 860 about its axis causes the eccentric stem to revolve about the axis of shaft 870 which causes the oscillation plate 824, via the oscillation cylinder 874, to pivotally oscillate about the axis $Y_P$. Because the polishing arm shaft 800 is locked to oscillation plate 824, oscillation of the oscillation plate 824 causes oscillation of the rough polishing arm 114.

As mentioned above, the piston rod of the oscillation cylinder 874 is not moved relative to the cylinder during oscillation of the oscillation plate 824 and polishing arm 114. However, before the polishing arm is moved from its second position to its third position, the piston rod 878 is extended to push the oscillation plate 824 against a stop 882 (FIGS. 26 and 29). The stop 882 establishes a reference position from which the controller 84 and polishing arm motor 820 can base movement of the shaft 800. With the oscillation plate 824 positioned against the stop 882, the rough polishing arm 114 will be properly positioned to lift a polishing block B from the first temperature regulating spray station 112 when in its first position, or to place a polishing block on the second temperature regulating spray station 118 when in its third position.

Figure 32:
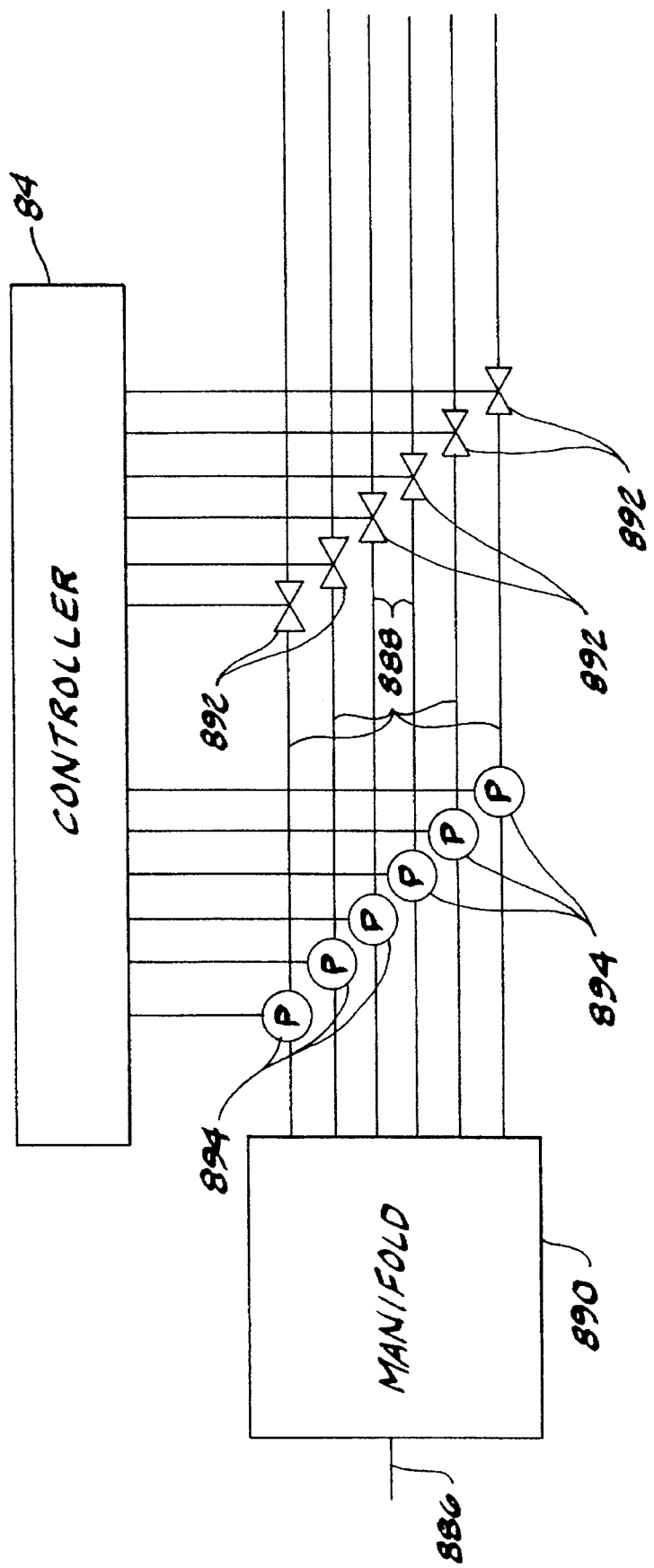
FIG. 32 is a schematic of a slurry feed system of the rough polisher of FIG. 26.

Referring to FIGS. 3 and 32, a slurry feed tube 886 is connected to the arm member 802 of the rough polishing arm 114 for pouring a slurry solution onto the polishing pad 748 as it is rotated. The rotating polishing pad 748 rubs the polishing slurry against the semiconductor wafer to mechanochemically polish the wafer. The slurry feed tube 886 is coupled to a plurality of fluid lines 888 via a manifold 890 (shown schematically in FIG. 32). The controller 84 operates valves 892 and peristaltic pumps 894 associated with the fluid lines 888 for regulating the fluid flow of each line to the slurry feed tube 886. The fluid lines are adapted for delivering different solutions (e.g., polishing solutions and rinsing solutions) through the slurry feed tube 886 to the rough polishing pad 748.

Figure 33:
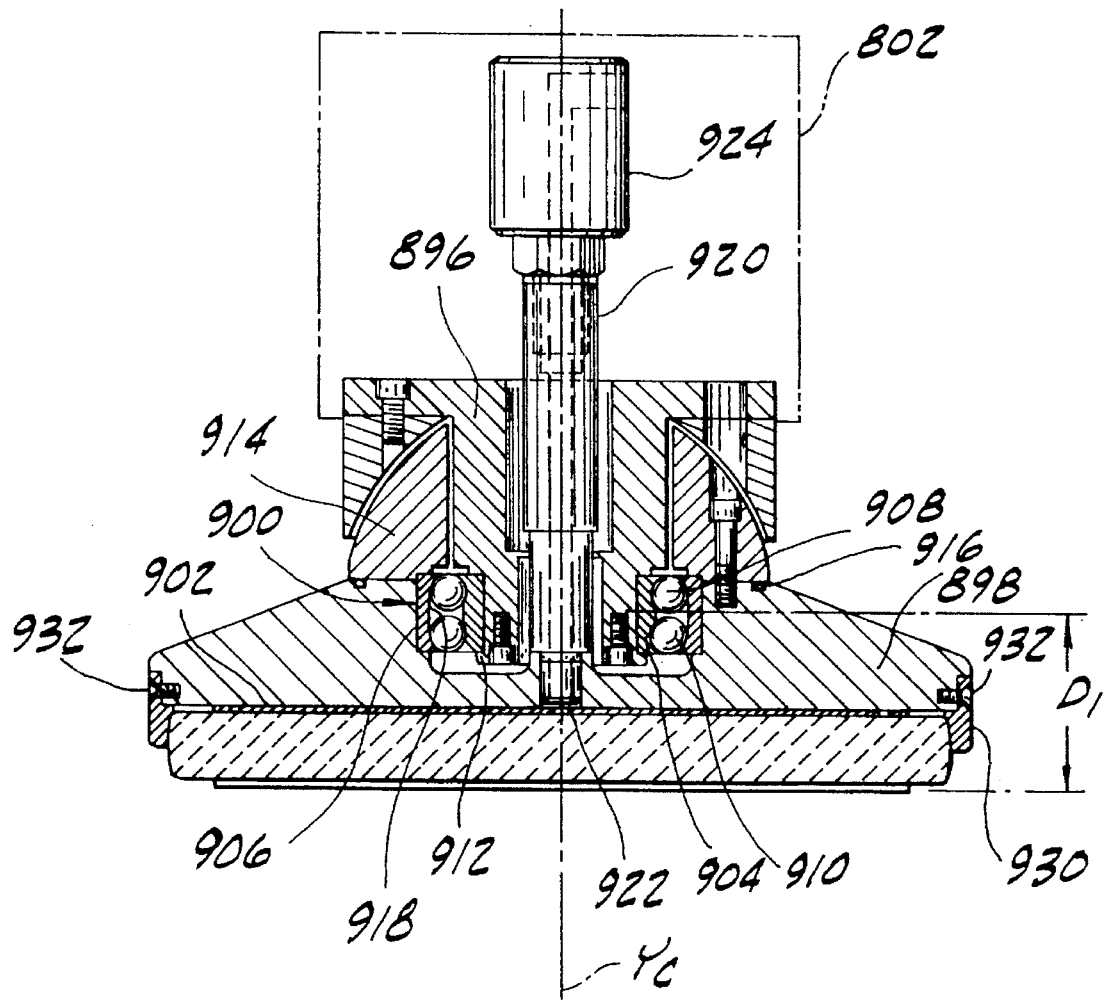
FIG. 33 is an enlarged sectional view taken along a vertical plane of the chuck assembly of FIG. 27 showing a polishing block secured to the underside of the chuck assembly.

Referring to FIG. 33, the chuck assembly 804 comprises a spindle 896 secured to the arm member 802, a platen 898 adapted for rotation on the spindle 896 via a double-row ball bearing assembly, generally indicated 900, and a pressure pad 902 bonded to the underside of the platen 898. The bearing assembly 900 includes an inner race 904, an outer race 906, and upper and lower rows of balls 908, 910 between the races 904, 906. The inner race 904 is secured to the spindle 896 by an annular connector 912 fastened to the lower portion of the spindle 896. The outer race 906 is secured to the platen 898 by a race supporting member 914 fastened to the upper portion of the platen 898. An O-ring 916 is positioned between the race supporting member 914 and the platen 898 to prevent leakage of oil and grease from the bearing assembly 900. Preferably, the outer race 906 has a concave inner surface 918 with a radius of curvature substantially equal to the radial distance from the inner surface 918 to the axis $Y_C$ upon which the platen 898 rotates. The concave inner surface 918 allows the platen 898 to tilt slightly to ensure that the semiconductor wafer is pressed flat against the rough polishing pad 748 to keep the axis $Y_c$ generally parallel to the axis $Y_P$ during polishing.

When a semiconductor wafer W is pressed against the rough polishing table 116, the frictional force of the polishing pad 748 rubbing against the semiconductor wafer W tends to cant the semiconductor wafer, polishing block, and platen 898 relative to the table. To prevent this canting, the bearing assembly 900 is preferably positioned low on the platen 898 (i.e., relatively close to the polishing block). Preferably, the axial distance $D_1$ from an axial midpoint of the bearing assembly 900 to the underside (polish face) of the semiconductor wafer W is less than one-third the diameter of the semiconductor wafer being polished, and more preferably, is less than approximately one-fourth the diameter. Thus, if the semiconductor wafer has a diameter of approximately eight inches, the distance $D_1$ is preferably two inches or less.

A vacuum line 920 extends upward from a vacuum port 922 through the center of the platen 898 and rotates with the platen 898. The vacuum line 920 is connected to a non-rotating vacuum line (not shown) via a rotary vacuum seal coupler 924. The pressure pad 902 is adapted to seal the platen 898 to the polishing block B when a vacuum pump (not shown) pulls a vacuum through the vacuum line 920. The vacuum then holds the polishing block B against the pressure pad 902.

Figure 34:
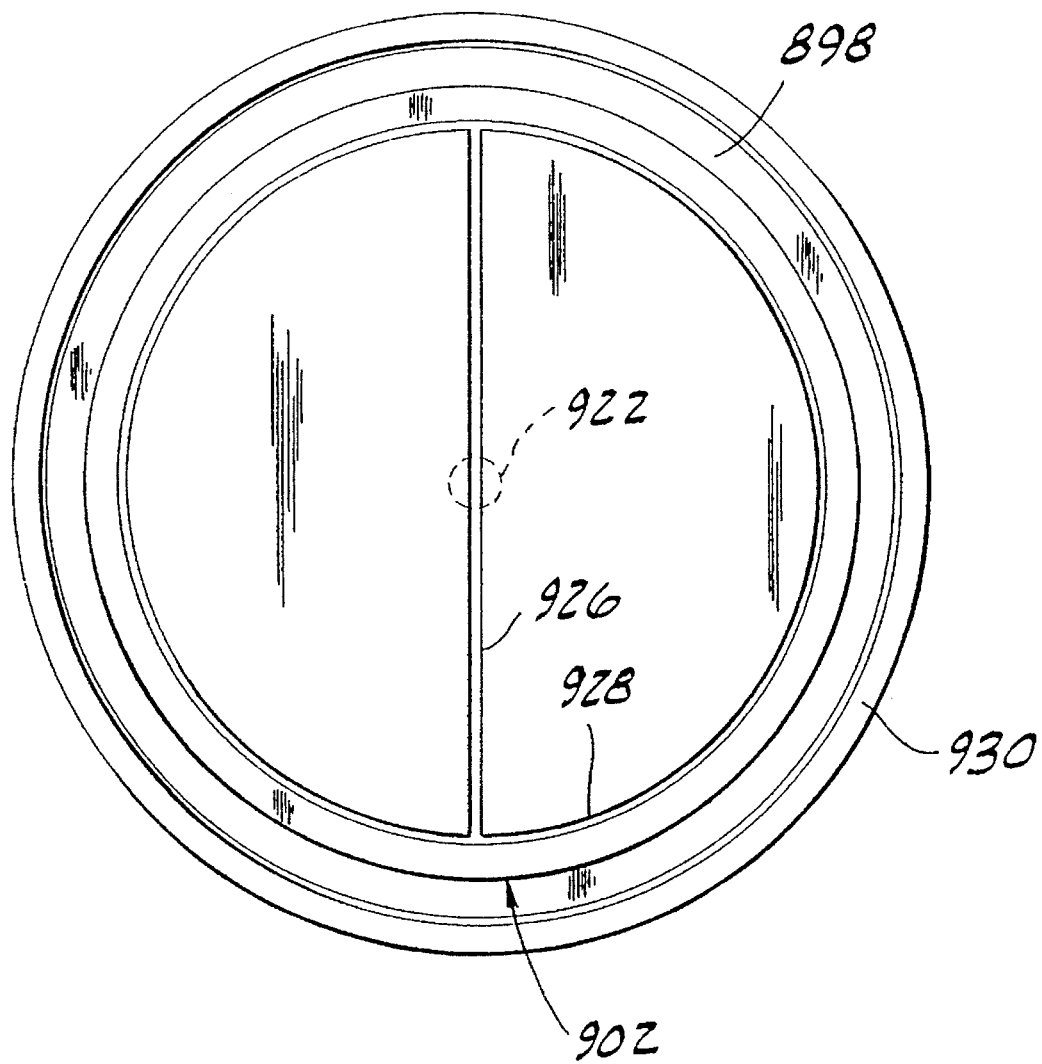
FIG. 34 is a bottom plan view of the chuck assembly of FIG. 33.

Preferably, the pressure pad 902 is made of a resilient closed-cell polymeric material or other suitable resilient material capable of sealing the underside of the platen 898 to the second (upper) face of the polishing block. The pressure pad 902 (FIG. 34) has a radial channel 926 and a circumferential channel 928 in communication with the vacuum port 922. The pressure pad 902 distributes the downward force of the rough polishing arm 114 evenly against the upper face of the polishing block B. Preferably, the center of the pressure pad 902 and centroid of the semiconductor wafer W intersect the axis $Y_C$ and the diameter of the pressure pad 902 is equal to the diameter of the semiconductor wafer bonded to the polishing block B so that the force distribution on the upper face of the polishing block is substantially equal to the force distribution on the lower face of the polishing block. If the force distributions are not substantially equal, the polishing block B may distort (e.g., bow) thus resulting in a polished wafer that may not be sufficiently flat. The pressure pad 902 also acts to thermally insulate the upper (second) face of the polishing block B to prevent heat loss through the upper face during polishing. Any temperature gradient through the polishing block B causes thermal stresses which distort the shape of the block. The thermal insulation properties of the pressure pad 902 helps to minimize the temperature gradient through the polishing block B. An annular lip 930 is secured via screws 932 to the platen 898 and extends downward from the underside of the platen 898. If the vacuum holding the polishing block B against the platen 898 is somehow broken during polishing, the lip 930 prevents the polishing block from spinning off the table.

After a wafer mounted polishing block is placed in the first temperature regulating spray station 112, the controller 84 energizes the polishing arm motor 820 to rotate the polishing arm about axis $Y_P$ to its first position and actuates the indexing cylinder 848 to move the roller 842 into the first indexing slot 836 to lock the polishing arm shaft 800 to the oscillation plate 824. The controller 84 then actuates the polishing arm cylinder 812 which extends the piston rod 818 to pivot the arm member 802 downward so that the chuck assembly 804 engages the upper (unwaxed) face of the polishing block B. The controller 84 then operates a vacuum valve connected to the vacuum pump to pull a vacuum through the chuck assembly 804 so that the chuck assembly grips the polishing block B. The controller 84 then actuates the polishing arm cylinder 812 to pivot the arm member 802 upward to lift the polishing block B off the first temperature regulating spray station 112. The roller 842 is then moved out of the first indexing slot 836, the polishing arm motor 820 is operated to rotate the rough polishing arm 114 to its second position, and the roller 842 is moved into the second indexing slot 838 to lock the polishing arm in its second position.

After the rough polishing arm 114 is moved to its second position, the piston rod 878 of the oscillation cylinder 874 is retracted to move the oscillation plate 824 out of engagement with the stop 882 (moved to the left as viewed in FIG. 26) and the piston rod 818 of the polishing arm cylinder 812 is extended to lower the chuck assembly 804 and press the semiconductor wafer W against the rough polishing pad 748. Next, the controller 84 energizes the table motor 718 to rotate the table about the axis $Y_T$ and to pivotally oscillate the rough polishing arm 114 about the axis $Y_P$. Thus, the semiconductor wafer W is rubbed by the rotating polishing pad 748 as the semiconductor wafer W is moved back and forth on the pad. Rubbing of the polishing pad 748 against the semiconductor wafer W causes the platen 898 of the chuck assembly 804 to rotate on the spindle 896. Preferably, a temperature regulating fluid (e.g., a mixture of water and a suitable rust inhibitor) is introduced through the temperature regulating system 746 at a constant temperature and at a constant flow rate during polishing of each wafer to maintain a constant temperature gradient through the polishing table assembly 706.

During polishing of the semiconductor wafer W by the rough polishing pad 748, the controller 84 controls valves 892 and pumps 894 to pour fluids onto the pad via the slurry feed tube 886. Preferably, a first polishing solution is poured onto the rough polishing pad 748 at a first rate for a first predetermined period and then a second polishing solution is poured onto the pad at a second rate for a second predetermined period. Pouring of the second polishing solution on the polishing pad may be initiated upon termination of pouring of the first polishing solution. Alternatively, pouring of the second solution may be initiated before termination of pouring of the first solution so that there is a period in which the polishing solutions are simultaneously poured onto the polishing pad. Also preferably, the controller 84 operates the polishing arm cylinder 812 to press the wafer against the rough polishing pad 748 at one pressure during polishing with the first solution and at another pressure during polishing with the second solution. In a preferred embodiment, the first solution and polishing pressure are selected to polish the semiconductor wafer at a relatively fast stock removal rate where the thickness of the wafer is reduced relatively rapidly (preferably 2–5 μm/min and more preferably 3–4 μm/min). The second solution and polishing pressure are selected to polish the semiconductor wafer at a stock removal rate which may be significantly less than the stock removal rate with the first solution and polishing pressure. Polishing with the first solution is primarily for stock removal of the wafer. Preferably, the first solution comprises a sodium hydroxide stabilized colloidal silica sol such as those commercially available from E.I. du Pont de Nemours & Company, Nalco Chemical Co. (Naperville, Ill.), and Cabot Corp. (Tuscolo, Ill.). During delivery of the first solution, the semiconductor wafer is preferably pressed against the rough polishing pad 748 at a pressure range of 4–10 psi (preferably 6–8 psi). The second solution preferably comprises an ammonia stabilized colloidal silica sol such as those commercially available from Nalco Chemical Co. and Fujimi Incorporated. After polishing with the second solution, the controller 84 may operate the valves to pour one or more rinsing solutions on the polishing pad for a third predetermined period and the pressure exerted by the polishing arm greatly reduced to rinse the semiconductor wafer.

After the semiconductor wafer W is polished by the rough polishing pad 748, the controller 84 turns the table motor 718 off and actuates the polishing arm cylinder 812 to retract its piston and thereby lift the polishing block B off the polishing pad. The piston rod 878 of the oscillation cylinder 874 is extended to push the oscillation plate 824 against the stop 882. The indexing cylinder 848 is then retracted to disengage the roller 842 from the indexing wheel 834 and the polishing arm motor 820 is operated to rotate the rough polishing arm 114 on the axis $Y_P$ from its second position to its third position where the chuck assembly 804 is positioned over the second temperature regulating spray station 118. The piston rod of the polishing arm cylinder 812 is extended and the vacuum to the chuck assembly 804 is broken to place the polishing block B and semiconductor wafer W on the second temperature regulating spray station 118. The piston rod 818 of the polishing arm cylinder 812 is then retracted to lift the chuck assembly 804 from the polishing block B and the polishing arm motor 820 is operated to move the rough polishing arm 114 to its first position to pick up another polishing block placed on the first temperature regulating spray station 112.

The controller 84 operates the second temperature regulating spray station 118 to spray the temperature regulating fluid on the underside (first face) of the polishing block B and on the underside (second face) of the semiconductor wafer W for a predetermined time (preferably in the range of 15–35 seconds). Then the controller 84 operates the finish polishing arm 120 to lift the polishing block B and semiconductor wafer W from the second spray station 118 and to deliver them to the finish polishing table 122. Preferably, the spray of the temperature regulating fluid at the second temperature regulating spray station 118 reduces the temperature of the polishing block B and semiconductor wafer W from the temperature at which the semiconductor wafer is polished by the rough polisher to substantially the temperature at which the semiconductor wafer is polished by the finish polisher. As with the first spray station 112, the temperature of the fluid may be controlled (e.g., heated or cooled) or it may be groundwater temperature.

The finish polishing arm 120 and finish polishing table 122 are substantially the same as the rough polishing arm 114 and rough polishing table 116. Thus, it is to be understood that a description of the rough polisher 58 is also applicable to the finish polisher 60. The finish polishing table 122, however, has a softer polishing pad, such as those commercially available from Rodel, Inc. (Newark, Del.), Negasi California Corporation, and Fujimi Corporation. Also, a scuffing member (not shown) is provided on the finish polishing table 122 for minimizing matting of the finish polishing pad. The finish polisher 60 polishes the semiconductor wafer at a lower temperature than that of the rough polisher 58 (preferably in the range 33°–44° C. and more preferably 36°–39° C.). Also preferably, the finish polishing arm 120 presses the wafer against the finish polishing table 122 with less pressure than the rough polishing arm 114 presses it against the rough polishing table 116. The finish polisher 60 polishes the semiconductor wafer at a slower stock removal rate than does the rough polisher 58, but produces a smoother polished surface.

Also, as with the rough polisher, the controller 84 controls valves and peristaltic pumps (not shown) to pour fluids onto the polishing pad of the finish polishing table 122. Preferably, a third polishing solution (which may be identical to the first polishing solution poured onto the rough polishing pad) is poured onto the finish polishing pad at a third rate for a third predetermined period. A fourth polishing solution (which may be identical to the second solution) is poured onto the finish polishing pad at a fourth rate for a fourth predetermined period. The controller 84 preferably controls the pressure exerted by the finish polishing arm 120 in response to the temperature of the finish polishing pad as sensed by an infrared sensor (not shown) to control the polishing temperature. If the temperature sensed by the sensor is greater than a predetermined value, the controller 84 operates the finish polishing arm 120 to reduce the pressure and thereby reduce the frictional force between the semiconductor wafer and polishing pad. If the temperature sensed by the sensor is less than a predetermined value, the controller 84 operates the finish polishing arm 120 to increase the pressure and thereby increase the frictional force. In this manner, the controller 84 can prevent the polishing temperature B from deviating substantially during polishing.

Although the valves and peristaltic pumps have been described as delivering two polishing solutions to each polishing table, it is to be understood that a single solution may be delivered to each table or three or more may be delivered simultaneously or sequentially to each table.

Although the machine 50 has been described as having two semiconductor wafer polishers, it is to be understood that the machine could be constructed with a third polisher adjacent the rough polisher 58 (to the right of the rough polisher 58 as viewed in FIGS. 1 and 3) without departing from the scope of this invention. In this modified machine, the third polisher would constitute a rough polisher, polisher 58 would constitute an intermediate polisher or another rough polisher, and polisher 60 would constitute the finish polisher. The linear robot 62 would place a wafer-mounted polishing block B on a fourth temperature regulating spray station adjacent the third polisher and a polishing arm of the third polisher would pivot to lift the polishing block B from this temperature regulating spray station and press it against a polishing table of the third polisher. Thus, the machine may be modified to accommodate three polishers.

The third temperature regulating spray station 124 is similar to the first and second stations. The controller 84 operates the third temperature for spraying the underside of the polishing block B and semiconductor wafer at the completion of polishing. The third temperature regulating spray station 124 cools the polishing block B and wafer from the finish polishing temperature to a temperature suitable for removing the semiconductor wafer from the block (e.g. 25° C.).

Figure 35:
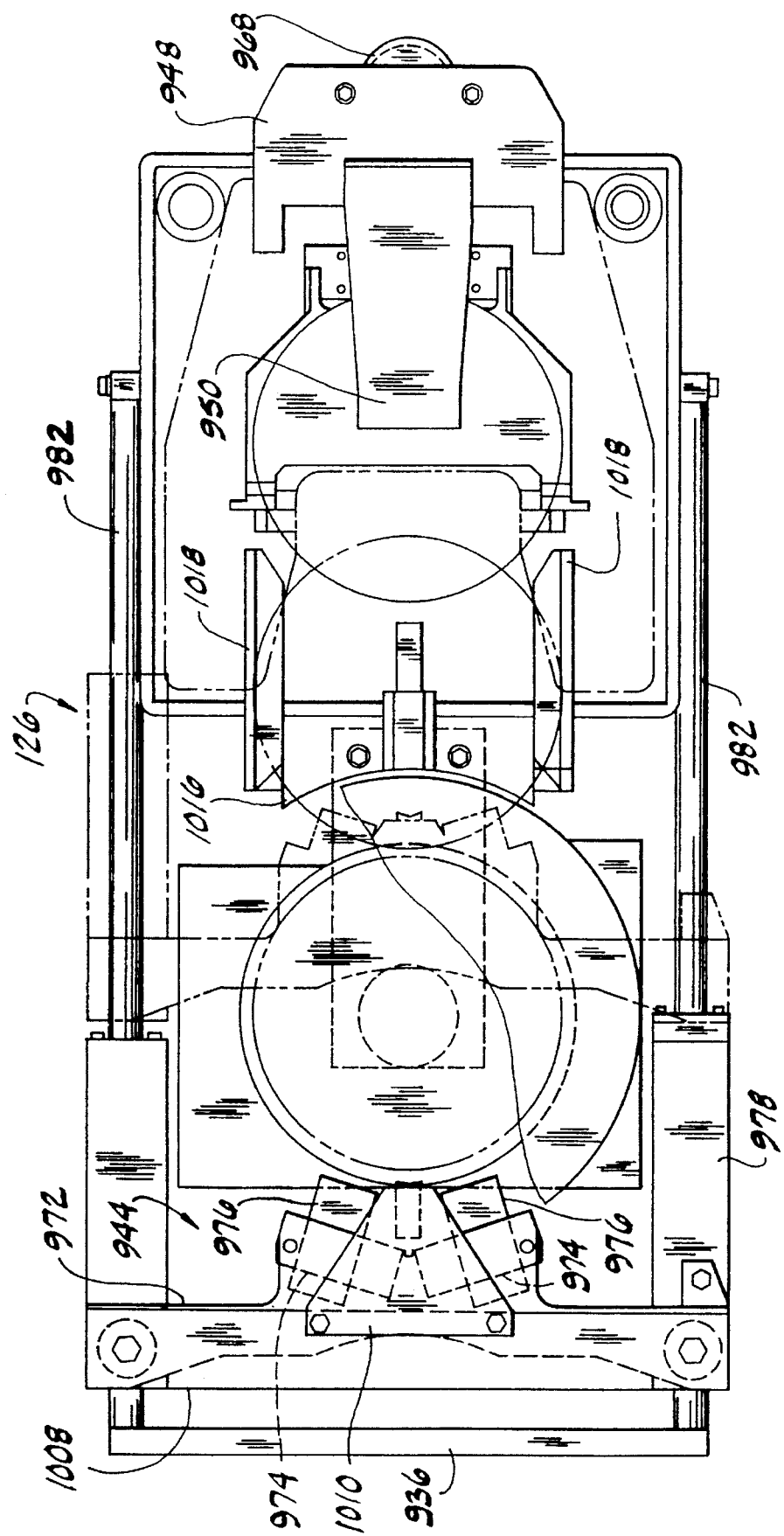
FIG. 35 is a top plan view of a block-wafer separator of the polishing apparatus of FIG. 1.
Figure 36:
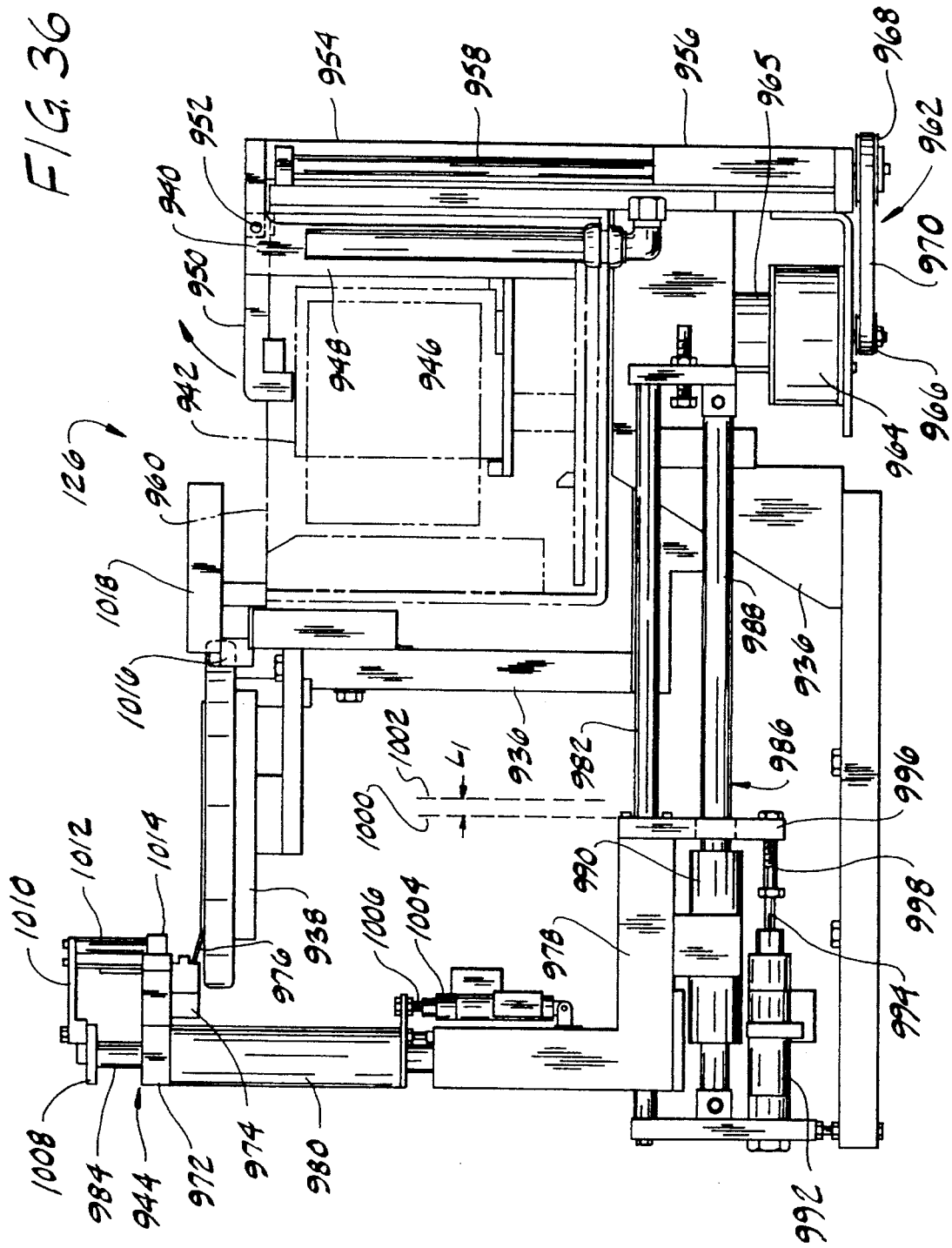
FIG. 36 is a side elevational view of the block-wafer separator of FIG. 35.

Referring now to FIGS. 35 and 36, the block-wafer separator 126 comprises a separator support structure 936, a platform 938 secured to the support structure for holding a polishing block B placed thereon, a cassette holder 940 for holding a cassette 942 adapted to receive a plurality of polished semiconductor wafers, and a pry member, generally indicated 944, adapted for movement relative to the platform for separating a semiconductor wafer W from the polishing block to which it is mounted and delivering it to the cassette.

The cassette holder 940 is similar to the cassette holder 444 of the delivery station 108 and comprises a bottom panel 946, a rear member 948 extending upward from the bottom panel and a swing arm 950 pin connected at 952 to a top portion of the rear member. The swing arm 950 is engageable with the top of the cassette 942 and contains a microswitch which signals the controller 84 when a cassette is in place. The cassette holder 940 is secured via a post 954 to a guide block 956. Like the guide block 470 of the delivery station 108, the guide block 956 is adapted, via suitable bearings (not shown), for sliding up and down along a pair of generally vertical guide rods 958 which are secured at opposite ends to the separator support structure 936. Movement of the guide block 956 up and down moves the cassette holder 940 from a lowered position in which the cassette holder is immersed in a bath 960 to a raised position. Raising of the guide block 956 positions the cassette 942 for receiving polished wafers. Preferably, the cassette 942 is substantially identical to the cassette 446 of the delivery station 108.

Like the delivery station 108, the separator 126 includes a servomotor operated screw drive, generally indicated 962, for raising and lowering the guide block 956. The screw drive 962 comprises a servomotor 964 secured to the separator support structure 936, a first pulley 966 keyed to a shaft of the servomotor, a second pulley 968 keyed to an upwardly extending screw (not shown) rotatably coupled to the separator support structure 936, and a belt 970 trained around the pulleys for rotation of the screw about its axis upon operation of the servomotor. A nut (not shown) in the guide block 956 is threadably coupled to the screw and moves up and down upon rotation of the screw. Preferably, an encoder 965 is provided on the shaft of the servomotor 964 for indexing the screw so that the controller 84 may selectively operate the motor to raise and lower the cassette holder 942 to desired levels.

The pry member 944 comprises a gantry 972, two blade holders 974 fastened to the underside of the gantry, and two blades 976 extending from the blade holders. The pry member 944 is moved over the polishing block B to pry the semiconductor wafer W bonded thereto from the block and push the wafer into the cassette 942. Movement of the pry member 944 is accomplished by a pair of horizontal gantry slides 978 and a pair of vertical gantry slides 980. The horizontal gantry slides 978 are slidable on generally horizontal guide rods 982 secured at opposite ends to the separator support structure 936. The vertical gantry slides 980 are slidable on generally vertical guide rods 984 secured at their lower ends to the horizontal gantry slides 978. The gantry 972 is secured to the upper ends of the vertical gantry slides 980. Movement of the horizontal gantry slides 978 on the horizontal guide rods 982 causes horizontal movement (movement left to right as viewed in FIG. 36) of the vertical guide rods 984, the vertical gantry slides 980 and the pry member 944. Movement of the vertical gantry slides 980 on the vertical guide rods 984 causes vertical movement (movement up and down as viewed in FIG. 36) of the pry member 944.

The aforementioned horizontal movement is caused by a pneumatic rodless cylinder, generally indicated 986. The rodless cylinder 986 has a barrel 988 secured at opposite ends to the separator support structure 936 and a piston mounting 990 movable along the barrel 988. The barrel 988 is generally parallel to the horizontal guide rods 982 and the piston mounting 990 is fastened to an underside of one of the horizontal gantry slides 978. Actuation of the rodless cylinder 986 causes the piston mounting 990 to ride along the barrel 988 and causes the horizontal gantry slides 978 to ride along the horizontal guide rods 982. Horizontal movement is also caused by a horizontally positioned pneumatic cylinder 992 secured to the separator support structure 936 generally below the leftmost end (as viewed in FIG. 36) of the rodless cylinder 986. The piston rod 994 of the horizontally positioned cylinder 992 is generally parallel to the guide rods 982. A leg 996 extends down from one of the horizontal gantry slides 978 and a threaded pin 998 extends laterally from the leg. The piston rod 994 is adapted to push against the pin 998 when the horizontal gantry slides 978 are positioned to the left as viewed in FIG. 36. Extension of the piston rod 994 moves the horizontal gantry slides 978 a short horizontal distance $L_1$ from a first horizontal position (indicated by phantom line 1000) to a second horizontal position (indicated by phantom line 1002). Further horizontal movement of the horizontal gantry slides 978 is caused by the rodless cylinder 986.

Vertical movement of the pry member 944 is accomplished by a vertically positioned pneumatic cylinder 1004 pinned to the horizontal gantry slide 978. The piston rod 1006 of the vertically positioned cylinder 1004 is connected to one of the vertical gantry slides 980. Extension of the piston rod 1006 raises the pry member 944 to a raised position (not shown). Retraction of the piston rod lowers the pry member 944 to a lowered position (FIG. 36).

A cross piece 1008 is secured to and spans the upper ends of the vertical guide rods 984. The cross piece 1008 supports a triangular plate 1010. A pneumatic cylinder 1012 extends down from the triangular plate 1010 and has a pusher member 1014 secured to the end of its piston rod. Upon extension of the piston rod of the cylinder 1012, the pusher member 1014 is adapted to push the semiconductor wafer W into the cassette 942.

Initially the pry member 944 is in its raised position and is positioned adjacent the cassette 942. After completion of polishing, the circular robot 100 lifts the polishing block B and semiconductor wafer W from the third temperature regulating spray station 124. The circular robot 100 then turns the polishing block B over and places it on the platform 938 with the semiconductor wafer W bonded to the upper face of the polishing block. The controller 84 actuates the rodless cylinder 986 to move the horizontal gantry slides 978 forward (to the left as viewed in FIG. 36) to the first horizontal position 1000 and actuates the vertically positioned cylinder 1004 to retract its piston rod 1006 to move the pry member 944 to its lowered position. In this position, the edge of each blade 976 is in contact with the upper surface of the polishing block B and forward of the semiconductor wafer W. The cassette 942 is raised so that a pair of opposing ribs in the cassette 942 is at substantially the same level as the upper surface of the polishing block B. The controller 84 actuates the horizontally positioned cylinder 992 to extend its piston rod 994 to push the horizontal gantry slides 978 rearward to the second horizontal position 1002. This movement forces the blades 976 of the pry member 944 between the semiconductor wafer W and the polishing block B to pry the semiconductor wafer from the polishing block and thereby detach it from the polishing block B. The rodless cylinder 986 is then actuated to move the pry member 944 rearward (to the right as viewed in FIG. 36) and push the detached semiconductor wafer clear of the polishing block B. After the polished semiconductor wafer W is separated from the polishing block B and pushed partially into the cassette 942, the circular robot 100 moves the polishing block to the wax applicator 104 where the wax is cleaned from the polishing block B and a fresh coat of wax is applied to prepare it for another semiconductor wafer. The controller 84 then actuates the vertically positioned cylinder 1004 to extend its piston rod 1006 to move the pry member 944 to its raised position and actuates cylinder 1012 to lower the pusher member 1014 to the level of the semiconductor wafer W. The rodless cylinder 968 is again actuated to move the pry member 944 further rearward to move the pusher member 1014 into engagement with the edge of the semiconductor wafer W and push the wafer onto the aligned pair of ribs of the cassette 942. The cassette holder 940 is then lowered to immerse the cassette 942 in the bath 960.

Preferably, a block edge holder 1016 is positioned rearward of the platform 938 and secured to the separator support structure 936 to prevent rearward movement of the polishing block B as the semiconductor wafer W is rearwardly pushed by the pry member 944. Also preferably, a pair of spaced guide channels 1018 are positioned at opposite ends of the block edge holder 1016 and secured to the separator support structure 936 for guiding the semiconductor wafer W into the cassette 942.

In operation, the machine 50 serially polishes a plurality of semiconductor wafers. A first polishing block is removed from the block rack 102 and moved to the wax applicator 104 where a first face of the block is cleaned and then evenly coated with wax. The circular robot 100 delivers a first semiconductor wafer to the vacuum press 110. After the wax coating is applied to the first polishing block, the circular robot 100 moves the block to the block heater 106 where it is heated to a predetermined temperature. After the first polishing block is heated, the circular robot 100 moves it from the block heater 106 and places it wax-side down on the vacuum press 110. The vacuum press 110 presses the polishing block against the semiconductor wafer so that the wax bonds a first face of the semi-conductor wafer to the first face of the first polishing block.

The linear robot 62 then delivers the first polishing block and first semiconductor wafer from the vacuum press 110 to the first temperature regulating spray station 112. The first temperature regulating spray station 112 sprays a temperature regulating solution on a second (exposed) face of the semiconductor wafer and on the polishing block to reduce the temperature of the polishing block from the bonding temperature to the rough polishing temperature. The rough polishing arm 114 then delivers the first polishing block and first semiconductor wafer to the rough polishing table 116 and holds the second (exposed) face of the first semiconductor wafer against the polishing pad 748 of the rough polishing table 116. After completion of polishing by the rough polisher 58, the rough polishing arm 114 delivers the first polishing block and first semiconductor wafer to the second temperature regulating spray station 118. The second spray station 118 sprays a temperature regulating fluid on the first semiconductor wafer to reduce the temperature of the first polishing block to the finish polishing temperature. The finish polishing arm 120 then delivers the first polishing block and first semiconductor wafer to the finish polishing table 122 and holds the second face (exposed) of the first semiconductor wafer against the finish polishing pad.

After completion of polishing by the second polisher 60, the finish polishing arm 120 delivers the first polishing block and first semiconductor wafer to the third temperature regulating spray station 124. The third temperature regulating spray station 124 sprays a temperature regulating fluid on the first semiconductor wafer to reduce the temperature of the first polishing block to a wafer removal temperature (e.g., 25° C.). The third temperature regulating spray station 124 and the block-wafer separator 126, together with the stations of the mounting apparatus, are circumferentially arranged about the circular robot 100. The circular robot 100 lifts the first polishing block and first semiconductor wafer from the third spray station 124, inverts them and then places them wafer side up on the block-wafer separator 126. The block-wafer separator 126 pries the first semiconductor wafer from the polishing block and pushes it into cassette 942. After removal of the first semiconductor wafer, the circular robot 100 delivers the first polishing block to the wax applicator 104 which cleans the used wax from the first polishing block and places a fresh coating of wax on the block.

Before completion of polishing of the first semiconductor wafer by the rough polisher 58, a second polishing block is delivered to the wax applicator 104 where a first face of the second polishing block is cleaned and then evenly coated with wax. The second block is then heated by the block heater 106 in the same manner and under substantially the same operating conditions as the first polishing block. Before the block heater 106 completes heating of the second polishing block, the circular robot 100 delivers a second semiconductor wafer to the vacuum press 110. After the second polishing block is heated, it is moved to the vacuum press 110 where it is pressed against a first face of the second semiconductor wafer. After the second semiconductor wafer is bonded to the second polishing block, the linear robot 62 moves them to the first spray station 112. Preferably, the second semiconductor wafer and second polishing block are bonded together and moved to the first spray station 112 before completion of polishing of the first semiconductor wafer by the rough polisher 58. With the second semiconductor wafer and second polishing block so positioned, the rough polishing arm 114 delivers the second semiconductor wafer and second polishing block to the rough polishing table 116 immediately after delivering the first semiconductor wafer and first polishing block to the second spray station 118. The second semiconductor wafer is polished in the same manner and under substantially identical conditions as the first semiconductor wafer. The second semiconductor wafer is then removed from the second polishing block and the block is moved to the wax applicator 104 where the used wax is removed and a fresh coat is applied.

A third polishing block is delivered from the block rack 102 to the wax applicator 104 where a first face of the third polishing block is cleaned and then evenly coated with wax. Preferably, wax is applied to the third block before completion of polishing of the first semiconductor wafer by the finish polisher 60. The third block is then heated by the block heater 106 in the same manner and under substantially the same operating conditions as the first and second polishing blocks. Before the block heater 106 completes heating of the third polishing block, the circular robot 100 delivers a third semiconductor wafer to the vacuum press 110. After the third polishing block is heated, it is moved to the vacuum press 110 where it is pressed against a first face of the third semiconductor wafer. The third semiconductor wafer and third polishing block are then moved to the first spray station 112. Preferably, the third semiconductor wafer and third polishing block are bonded together and moved to the first spray station 112 before completion of polishing of the second semiconductor wafer by the rough polisher 58. With the third semiconductor wafer and third polishing block so positioned, the rough polishing arm 114 delivers them to the rough polishing table 116 immediately after delivering the second semiconductor wafer and second polishing block to the second temperature regulating station. The third semiconductor wafer is polished in the same manner and under substantially identical conditions as the first and second semiconductor wafers. The third semiconductor wafer is then removed from the third polishing block. The third polishing block is then moved to the wax applicator 104 where the used wax is removed and a fresh coat is applied.

A fourth polishing block is coated with wax and a fourth semiconductor wafer is bonded thereto in the same manner and under substantially identical conditions as the previous three blocks and wafers. Preferably, wax is applied to the fourth polishing block before completion of polishing of the first semiconductor wafer. The fourth semiconductor wafer is then polished in the same manner as the previous three semiconductor wafer and then removed from the fourth polishing block. The fourth block is then moved to the wax applicator 104 where the used wax is removed and a fresh coat of wax applied.

After the first semiconductor wafer is removed from the first polishing block, the first block is moved to the wax applicator 104 where the used coat of wax is removed and a fresh coat of wax is applied. The first block is then heated as before and pressed against a fifth semiconductor wafer so that a first face of the fifth semiconductor wafer opposes the first face of the first polishing block. The fifth semiconductor wafer is then polished in the same manner as the previous four semiconductor wafers. Preferably, the fifth semiconductor wafer is bonded to the first polishing block before completion of polishing of the third semiconductor wafer by the second polisher.

The wafer mounting and polishing steps are repeated for every semiconductor wafer in the cassette of the wafer delivery station 108. When the last semiconductor wafer is removed from the cassette 446 of the wafer delivery station 108, the controller 84 will energize the status lights 90, 92 (FIGS. 1 and 2) to signal an operator to replace the empty cassette with a full cassette. The status lights 90, 92 are also energized when the cassette 942 of the block-wafer separator 126 is full to signal an operator to replace the full cassette with an empty cassette. After the four polishing blocks are in service, the machine may serially polish any number of semiconductor wafers in a steady-state mode in which wafers are serially polished under nearly identical operating conditions without interruption of the machine. When all available wafers have been fed to the machine 50, the operator initiates a "clear machine" cycle which causes the four polishing blocks to be cleaned at the wax applicator 104 and then returned by the circular robot 100 to the block rack 102. After removal from the block rack 102, the polishing blocks are not returned to the rack until the "clear machine" cycle has been initiated. Because the polishing blocks need not be removed from the machine 50, the risk of a block being chipped or soiled or replaced with an uncalibrated polishing block is minimized.

Although the machine 50 has been described as using four polishing blocks, it is to be understood that more blocks or fewer blocks may be used without departing from the scope of this invention. Preferably, the number of polishing blocks are selected to minimize waiting between any of the wafer mounting and polishing steps. It is also desirable to minimize the duration between completion of rough polishing of one semiconductor wafer and initiation of polishing of the next; if this duration is too long, then the temperature of the rough polishing pad 748 will fall below its desired operating temperature. If too few polishing blocks are used, then the rough polisher 58 will complete polishing of one semiconductor wafer before the next polishing block is delivered to the spray station 112. Since the duration of the rough polishing step is typically the longest step performed by the machine, more polishing blocks should be used if this duration is shortened and fewer polishing blocks should be used if this duration is increased.

Because every station of the machine repeats its operation for each polishing block and/or each semiconductor wafer, the operating conditions of the machine do not vary substantially from one wafer to the next. For example, each polishing block is heated to a temperature $T_h$ (e.g., 85°–100° C.) by the block heater 106, a semiconductor wafer is then bonded thereto, the two are then sprayed at the spray station 112, and the semiconductor wafer is then polished by the rough polisher 58. The duration of each of these steps does not vary from wafer to wafer. Thus, polishing of each semiconductor wafer by the rough polisher is initiated a fixed duration $t_{b-p}$ (e.g., 90 seconds) after the semiconductor wafer is bonded to its corresponding polishing block and initiated a fixed duration $t_{h-p}$ (e.g., 2 minutes) after the polishing block is heated to the temperature $T_h$. Each semiconductor wafer is polished by the rough polisher 58 for a duration $t_{p2}$ (e.g., 3–7 minutes) at a polishing temperature $T_{p1}$ (e.g., 50°–70° C.) and polished by the finish polisher for a duration $t_{p2}$ (e.g., 2–5 minutes) at a polishing temperature $T_{p2}$ (e.g., 33°–44° C.). Moreover, the duration between completion of consecutive operations is preferably equal for all stations of the machine. For example, the duration $t_a$ between completion of consecutive heating steps (i.e., the duration between completion of heating of one polishing block to completion of heating of the next polishing block) is preferably equal to the duration $t_b$ between completion of consecutive block-wafer bonding steps and equal to the duration $t_c$ between completion of consecutive rough polishing steps.

Although the operating conditions of the machine 50 do not vary from wax mounting and polishing of one semiconductor wafer to another, it is to be understood that there may be slight variances. Preferably, however, the durations (e.g., $t_a$, $t_b$, $t_c$) do not vary by more than one second from wafer/block to wafer/block. Also preferably, the temperatures of the polishing blocks, at least at the onset of polishing, do not vary by more than 1° C.

Since the operating conditions of the machine 50 do not vary substantially from the wax mounting and polishing of one semiconductor wafer to that of another, the semiconductor wafers successively polished during uninterrupted operation of the machine have essentially the same flatness characteristics. In other words, if one of the polished wafers is flat, the other polished wafers will also be flat; if one of the polished wafers deviates somewhat in flatness (e.g., slightly convex or slightly concave) the other polished wafers will deviate in substantially the same manner.

Although the machine has been described as polishing semiconductor wafers to the same flatness characteristics, it is to be understood that it does so only after the machine 50 has been operating without interruption for a certain period (e.g., a sufficient period to polish three wafers) so that each station is brought to its stable operating conditions. After this period, successively polished wafers will be polished to the same flatness characteristics.

Because of the uniformity of flatness characteristics of successively polished wafers, adjustments may be made to the machine 50 to uniformly affect the flatness characteristics of subsequently polished wafers. Preferably, the adjustment is made based on the results of flatness measurements made on a randomly selected polished semiconductor wafer. For example, after the machine 50 is brought to stable operating conditions, some wafers are polished under these operating conditions and placed in the cassette 942. Next, one or more of the polished wafers are removed at random from the cassette 942 of the block-wafer separator 126. The flatness characteristics (e.g., Total Thickness Variation (TTV) and/or Site Total Indicated Reading (STIR)) of the randomly selected wafers are measured to determine if the wafers are within desired flatness specifications or if the wafers are excessively concave or convex. To reduce the convexity or concavity of subsequently polished wafers, for example, the shape of the rough polishing pad 748 may be modified.

Figure 37:
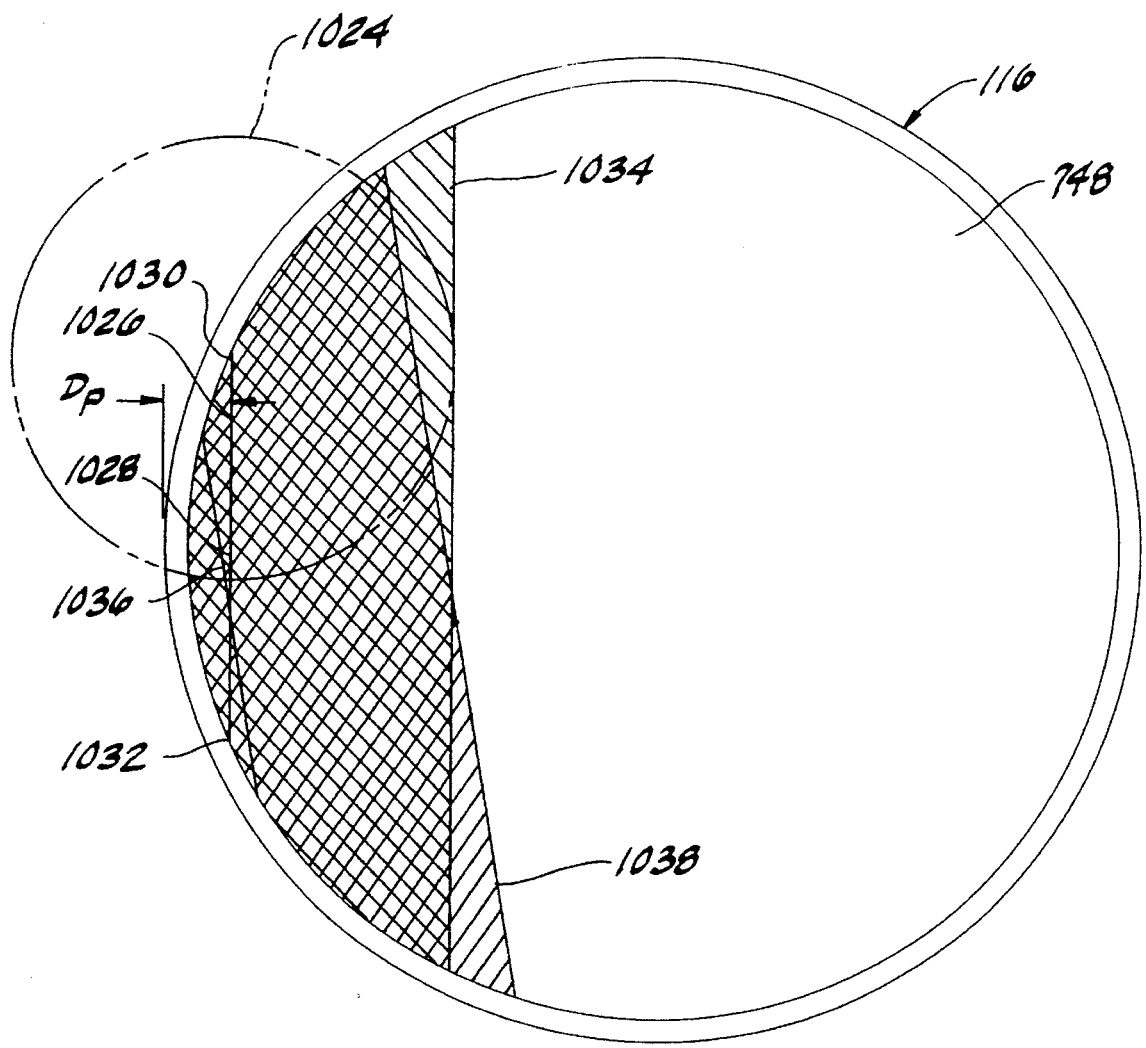
FIG. 37 is a schematic of a polishing pad of the table assembly of FIG. 27 being abraded by an abrading member in a manner for reducing concavity of the polishing pad.

If the measured wafers are excessively convex, then the convexity of subsequently polished wafers may be reduced by reducing the concavity of the rough polishing pad 748 used to polish the wafers. Preferably, the concavity of the polishing pad is decreased while the rough polishing table 116 is not in operation. The concavity may be decreased with an abrading member 1024 (FIG. 37). Preferably, the abrading member 1024 comprises an abrasive cloth adhesively secured to a flat, disc-shaped block. The cloth may be a coarse (e.g., less than 80-grit) aluminum-oxide sheet, and the block may be ceramic, steel, or some other suitable rigid material. The abrading member is manually rubbed against the polishing pad 748 (FIG. 37) with the center of the abrading member traveling along a first chord 1026 whose midpoint 1028 is spaced a distance $D_p$ (e.g., ⅞") from the periphery of the polishing pad. The distance $D_p$ is preferably equal to the width of the unused portion of polishing pad during polishing. Preferably, the abrading member is rubbed along the first chord 1026 with three generally equal pressure strokes. With each stroke, the center of the abrading member moves along the first chord 1026 from a first end 1030 of the chord to a second end 1032 and then back to the first end. These three strokes form a first abraded region 1034 whose width at its widest point is substantially equal to the radius of the abrading member plus the distance $D_p$. The rough polishing table 116 is then turned approximately 10° and the abrading member is rubbed against the polishing pad 748 along a second chord 1036 in the same manner as rubbed against the first chord 1026 to form a second abraded region 1038. The polishing pad 748 is rubbed every 10° in this same manner all around the polishing pad to abrade the outer portion of the polishing pad. Rubbing the abrading member against the polishing pad 748 in this manner reduces the concavity of the pad. Thus, semiconductor wafers polished with this modified polishing pad will be less convex than the measured wafers.

Figure 38:
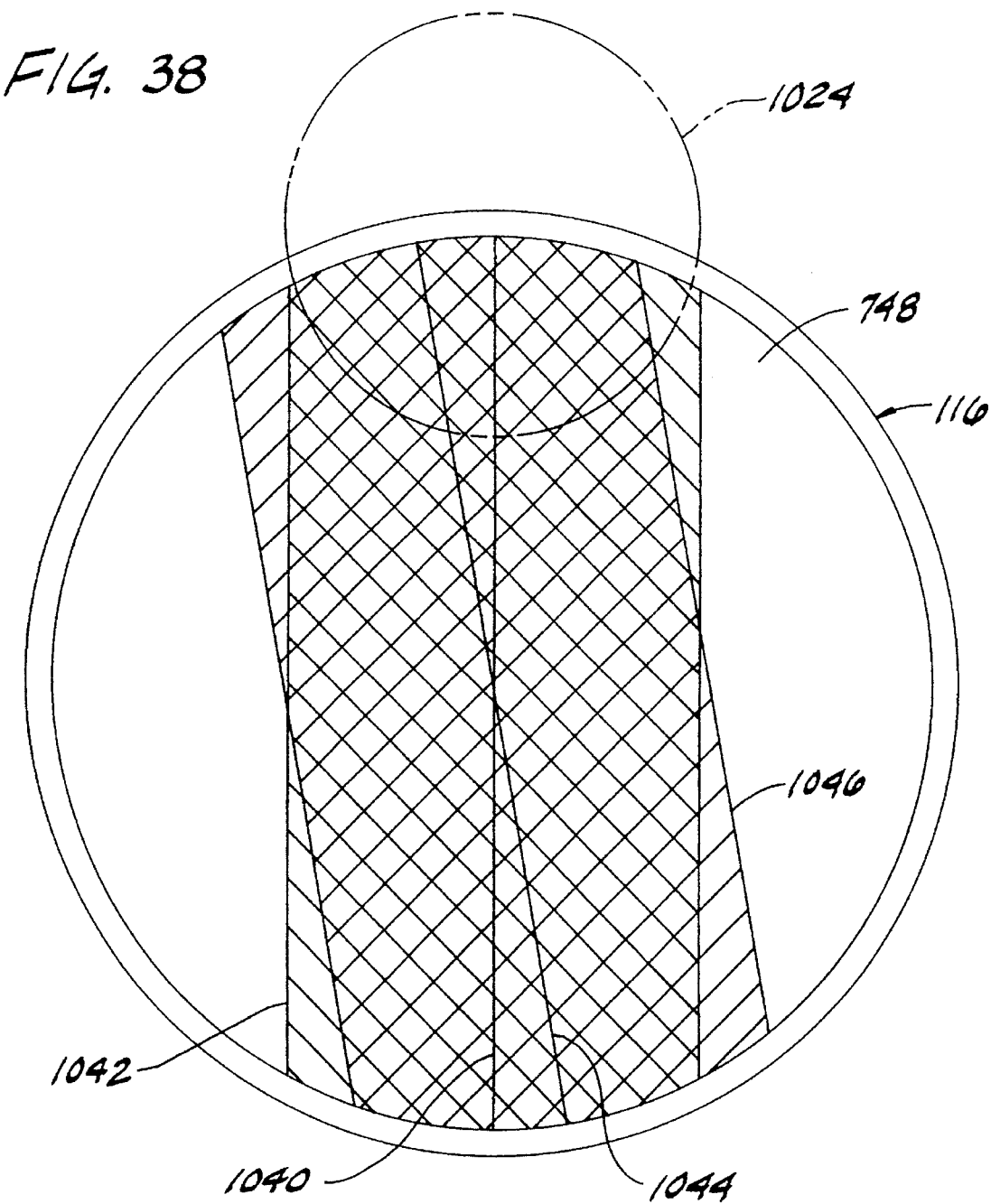
FIG. 38 is a schematic similar to FIG. 37 showing the polishing pad being abraded by the abrading member in a manner for reducing convexity of the polishing pad.

If the measured wafers are excessively concave, then the concavity of subsequently polished wafers may be reduced relative to the measured wafer by reducing the convexity of the rough polishing pad 748. The convexity of the rough polishing pad 748 may be decreased by manually rubbing the abrading member 1024 diametrically across the polishing pad with the center of the abrading member traveling along a first diameter 1040 of the polishing pad (FIG. 38). Preferably, the abrading member is rubbed along the first diameter 1040 with three generally equal pressure strokes. These three strokes form an abraded region 1042 whose width is substantially equal to the diameter of the abrading member 1024. The rough polishing table 116 is then turned approximately 10° and the abrading member is rubbed against the polishing pad 748 along a second diameter 1044 to form an abraded region 1046. The polishing pad 748 is rubbed every 10° in this same manner all around the polishing pad to abrade the polishing pad. Because the rubbing motion overlaps more in the central portion of the polishing pad than in the outer portion, the rubbing reduces the convexity of the polishing pad. Thus, semiconductor wafers polished with this modified polishing pad will be less concave than the measured wafers.

After the polishing pad 748 is reshaped, the machine 50 is operated under the same operating conditions as before to polish semiconductor wafers. By modifying the shape of the rough polishing pad 748, the flatness of the subsequently polished wafers will be greater than the measured wafers. The measuring and abrading procedures may be repeated to bring the subsequently polished wafers within the desired flatness specifications. Thus, because of the precise repeatability of the operating characteristics of each station of the machine, adjustments may be made to the machine to produce highly flat semiconductor wafers.

The ability to precisely and uniformly control the operating characteristics of the machine 50 allows the machine to polish at rapid rates and still produce flat wafers. In particular, the machine 50 is capable of serially polishing semiconductor wafers at a throughput in excess of ten wafers per hour, while producing polished wafers each having a Total Thickness Variation of less than 1 μm. Also, these polished wafers have a Site Total Indicated Reading of less than ½ μm for any 20 mm×20 mm local site.

Although the machine has been described as having several stations circumferentially arranged about a circular robot, it is to be understood that the stations could alternatively be arranged in a linear arrangement and a linear robot could move the blocks and semiconductor wafers between the stations.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for polishing semiconductor wafers comprising:
    a housing;
    a wax mounting apparatus within the housing for wax mounting a first face of a semiconductor wafer to a first face of a polishing block;
    a first semiconductor wafer polisher within the housing for polishing a second face of the semiconductor wafer, the second face of the semiconductor wafer being opposite the first face of the semiconductor wafer;
    a first transfer mechanism within the housing for delivering the polishing block and semiconductor wafer from the mounting apparatus to adjacent the first semiconductor wafer polisher; and
    a controller for controlling operation of the mounting apparatus, the first semiconductor wafer polisher, and the first transfer mechanism.

2. Apparatus as set forth in claim 1 wherein said semiconductor wafer mounting apparatus comprises:
    a wax applicator for applying wax to the first face of the polishing block; and
    a second transfer mechanism adapted for delivering the polishing block to the wax applicator.

3. Apparatus as set forth in claim 2 wherein said semiconductor wafer mounting apparatus further comprises a wafer press station, said second transfer mechanism being operable to deliver the semiconductor wafer to the wafer press station and for delivering the polishing block to the wafer press station after wax is applied to the first face of the polishing block, the wafer press station having a press adapted for pressing the first face of the semiconductor wafer against the first face of the polishing block.

4. Apparatus as set forth in claim 3 wherein said semiconductor wafer mounting apparatus further comprises a semiconductor wafer holder adapted for removing the semiconductor wafer from a stack of semiconductor wafers.

5. Apparatus as set forth in claim 4 wherein said second transfer mechanism is operable to deliver the semiconductor wafer from the wafer holder to the wafer press station.

6. Apparatus as set forth in claim 4 wherein said second transfer mechanism comprises a vacuum chuck for releasably engaging one of the first and second faces of the semiconductor wafer, said second transfer mechanism being operable to remove the semiconductor wafer from the wafer holder after the vacuum chuck engages said one of the first and second faces of the semiconductor wafer, said wafer holder comprising a platform for holding the semiconductor wafer and a movable plunger adapted to engage the other of said first and second faces of the semiconductor wafer when the vacuum chuck engages the semiconductor wafer to support the semiconductor wafer against the vacuum chuck.

7. Apparatus as set forth in claim 2 wherein said semiconductor wafer mounting apparatus further comprises a heater adapted for heating a second face of the polishing block after wax is applied to the first face of the polishing block, the second transfer mechanism being adapted for delivering the polishing block from the wax applicator to the heater.

8. Apparatus as set forth in claim 7 wherein the wax applicator and heater are circumferentially arranged about said second transfer mechanism.

9. Apparatus as set forth in claim 2 wherein said semiconductor wafer mounting apparatus further comprises a heater adapted for heating a second face of the polishing block after wax is applied to the first face of the polishing block, the heater comprising a steam generator for heating the second face of the polishing block to thereby heat wax on the first face of the polishing block, and means for vaporizing condensation formed on the second face of the polishing block.

10. Apparatus as set forth in claim 2 wherein said second transfer mechanism comprises a pair of jaws adapted for grasping the polishing block.

11. Apparatus as set forth in claim 10 wherein said second transfer mechanism further comprises a vacuum chuck for releasably holding the semiconductor wafer.

12. Apparatus as set forth in claim 1 further comprising a first temperature regulating station adjacent the first semiconductor wafer polisher, said first transfer mechanism being operable to deliver the polishing block and semiconductor wafer to the first temperature regulating station after the semiconductor wafer has been wax mounted to the polishing block.

13. Apparatus as set forth in claim 12 wherein said first temperature regulating station comprises a first sprayer for spraying a first temperature controlling fluid on the second face of the semiconductor wafer for controlling the temperature of the semiconductor wafer and polishing block before the second face of the semiconductor wafer is polished by the first semiconductor wafer polisher.

14. Apparatus as set forth in claim 12 further comprising a second station adjacent the first semiconductor wafer polisher, the first semiconductor wafer polisher comprising a first polishing arm and a first rotatable polishing member adjacent the first polishing arm, the first polishing arm being adapted for transferring the polishing block and semiconductor wafer from the first temperature regulating station and holding the second face of the semiconductor wafer against the first polishing member during polishing of the semiconductor wafer by the first polishing member and for thereafter delivering the polishing block and semiconductor wafer to the second station.

15. Apparatus as set forth in claim 14 further comprising:
a second semiconductor wafer polisher adjacent the second station;
a third station adjacent the second semiconductor wafer polisher;
the second semiconductor wafer polisher comprising a second polishing arm and a second rotatable polishing member adjacent the second polishing arm, the second polishing arm being adapted for transferring the polishing block and semiconductor wafer from the second station and holding the second face of the semiconductor wafer against the second polishing member during polishing of the semiconductor wafer by the second polishing member and for thereafter delivering the polishing block and semiconductor wafer to the third station.

16. Apparatus as set forth in claim 1 further comprising a block-wafer separator for removing the semiconductor wafer from the polishing block after the semiconductor wafer is polished by the first wafer polisher, the block-wafer separator comprising a platform for holding the polishing block, a cassette generally adjacent the platform adapted for receiving a plurality of semiconductor wafers, and a pry member adapted for movement relative to the platform for separating the semiconductor wafer from the polishing block and delivering it to the cassette, the controller controlling movement of the pry member.

17. Apparatus as set forth in claim 1 wherein the housing comprises a first cabinet and a second cabinet adjacent the first cabinet, said mounting apparatus being contained within the first cabinet and the first semiconductor wafer polisher being contained within the second cabinet.

18. Apparatus for wax mounting a first face of a semiconductor wafer to a first face of a polishing block comprising:
a semiconductor wafer holder for holding the semiconductor wafer;
a wax applicator adapted for applying wax to the first face of the polishing block;
a press adapted for pressing the first face of the semiconductor wafer against the first face of the polishing block;
a transfer mechanism mounted to rotate for delivering the polishing block to the wax applicator, for delivering the polishing block to the press after wax is applied to the first face of the polishing block, and for delivering the semiconductor wafer from the wafer holder to the press;
a controller for controlling operation of the transfer mechanism; and
the wafer holder, wax applicator, and press being positioned at angularly spaced locations around said transfer mechanism.

19. Apparatus as set forth in claim 18 further comprising a heater adapted for heating a second face of the polishing block after wax is applied to the first face of the polishing block, the transfer mechanism being adapted for delivering the polishing block from the wax applicator to the heater before delivering the polishing block to the press.

20. Apparatus as set forth in claim 18 wherein said transfer mechanism comprises a pair of jaws adapted for releasably grasping the polishing block, and a vacuum chuck for releasably engaging one of the first and second faces of the semiconductor wafer.

21. Apparatus as set forth in claim 20 wherein said transfer mechanism is adapted for removing the semiconductor wafer from the wafer holder after the vacuum chuck engages said one of the first and second faces of the semiconductor wafer, the wafer holder comprising a platform for holding the semiconductor wafer and a movable plunger adapted to engage the other of said first and second faces of the semiconductor wafer when the vacuum chuck engages the semiconductor wafer.

22. Apparatus as set forth in claim 18 wherein the wafer holder comprises a support, a cassette on the support configured for holding a stack of semiconductor wafers, and a carriage adapted for movement relative to the support for removing the semiconductor wafer from the cassette, the carriage being movable from a first position for engaging the semiconductor wafer in the cassette to a second position for holding the semiconductor wafer away from the cassette.

23. Apparatus as set forth in claim 22 wherein said transfer mechanism includes a vacuum chuck adapted for releasably engaging one of the first and second faces of the semiconductor wafer when the carriage holds the semiconductor wafer in the second position, said transfer mechanism being adapted for removing the semiconductor wafer from the wafer holder after the vacuum chuck engages the semiconductor wafer.

24. Apparatus as set forth in claim 23 wherein the wafer holder further comprises a movable plunger adapted to engage the other of said first and second faces of the semiconductor wafer when the vacuum chuck engages the semiconductor wafer.

25. Apparatus as set forth in claim 18 wherein said transfer mechanism is adapted for inverting the polishing block before delivering the polishing block to the press.

26. Apparatus as set forth in claim 18 further comprising a rack adapted for holding a plurality of polishing blocks, said transfer mechanism being adapted for removing the polishing block from the rack.

27. Apparatus for polishing a semiconductor wafer mounted to a polishing block comprising:

first and second semiconductor wafer polishers for polishing the semiconductor wafer;

a first station adjacent the first semiconductor wafer polisher adapted for holding the semiconductor wafer and polishing block;

a second station adjacent both the first and second semiconductor wafer polishers adapted for holding the semiconductor wafer and polishing block;

a third station adjacent the second semiconductor wafer polisher adapted for holding the semiconductor wafer and polishing block;

the first semiconductor wafer polisher including a first polishing arm and a first rotatable polishing member adjacent the first polishing arm, the first polishing arm being adapted for removing the semiconductor wafer and polishing block from the first station and holding the semiconductor wafer against the first polishing member during polishing of the semiconductor wafer by the first polishing member and for thereafter delivering the semiconductor wafer and polishing block to the second station;

the second semiconductor wafer polisher including a second polishing arm and a second rotatable polishing member adjacent the second polishing arm, the second polishing arm being adapted for removing the semiconductor wafer and polishing block from the second station and holding the semiconductor wafer against the second polishing member during polishing of the semiconductor wafer by the second polishing member and for thereafter delivering the semiconductor wafer and polishing block to the third station.

28. Apparatus as set forth in claim 27 wherein the first station is a first temperature regulating station comprising a first sprayer for spraying a first temperature regulating fluid on the semiconductor wafer for controlling the temperature of the semiconductor wafer and polishing block before the semiconductor wafer is polished by the first semiconductor wafer polisher.

29. Apparatus as set forth in claim 28 wherein the second station is a second temperature regulating station comprising a second sprayer for spraying a second temperature controlling fluid on the semiconductor wafer for controlling the temperature of the semiconductor wafer and polishing block before the semiconductor wafer is polished by the second semiconductor wafer polisher.

30. Apparatus as set forth in claim 27 further comprising a cabinet for containing the first and second polishing arms, the first and second polishing members, and the first and second stations.

31. Apparatus for polishing semiconductor wafers comprising:

a polishing member rotatable about a first axis;

a chuck adapted to releasably hold a polishing block, a semiconductor wafer being bonded to a first face of the polishing block;

a polishing arm supporting the chuck and adapted to press a polish surface of the semiconductor wafer against the polishing member as the polishing member is rotated for polishing the semiconductor wafer;

the chuck having a spindle connected to the polishing arm, a platen, and a bearing assembly operatively connecting the platen to the chuck for rotation of the platen about a second axis, the chuck being adapted to releasably grip the polishing block with a second face of the polishing block opposing the platen, the polishing block and semiconductor wafer rotating with the platen about the second axis during polishing, the second axis being generally parallel to the first axis, the chuck being configured for holding the polishing block such that an axial distance $D_1$ from an axial midpoint of the bearing assembly to the polish surface of the semiconductor wafer is less than approximately one-fourth the diameter of the semiconductor wafer.

32. Apparatus as set forth in claim 31 further comprising a generally disc-shaped pressure pad of resilient material interposed between the platen and the second face of the polishing block and adapted to distribute a pressing force of the polishing arm and chuck against the second face of the polishing block, the pressure pad being coaxial with the semiconductor wafer and having a diameter substantially equal to the diameter of the semiconductor wafer.

33. A method of wax mounting a semiconductor wafer to a polishing block having first and second opposite faces comprising:

applying a wax coating to the first face of the polishing block;

heating the second face of the polishing block with steam thereby to heat the wax coating on the first face of the polishing block;

vaporizing condensation formed on the second face of the polishing block; and bringing the semiconductor wafer into contact with the wax coating on the first face of the polishing block whereby the semiconductor wafer is bonded to the polishing block by the wax coating.

34. A method as set forth in claim 33 wherein the step of vaporizing condensation formed on the second face of the polishing block comprises forming a vacuum on the second face of the polishing block to vaporize condensation formed on the second face.

35. A method as set forth in claim 33 wherein the second face of the polishing block in part defines a sealed chamber, the step of vaporizing condensation formed on the second face of the polishing block comprising evacuating the chamber.

36. A method of polishing semiconductor wafers comprising:

(a) securing a semiconductor wafer to a polishing block so that a first face of the semiconductor wafer opposes a first face of the polishing block;

(b) polishing a second face of the semiconductor wafer with a rotating polishing member, the semiconductor wafer being between the polishing block and polishing member during polishing, the polishing block being approximately at a polishing temperature $T_{P1}$ during polishing;

(c) controlling the temperature of the polishing block at least immediately prior to initiation of the polishing step so that the polishing block temperature at the onset of polishing is approximately equal to the temperature $T_{P1}$;

(d) serially repeating steps (a)–(c) for a plurality of semiconductor wafers so that the semiconductor wafers are polished one after the other by the polishing member.

37. A method as set forth in claim 36 further comprising:

(e) measuring flatness characteristics of a selected one of the semiconductor wafers after it is polished by the polishing member;

(f) modifying the shape of the polishing member based on the results of the flatness measurements so made such that semiconductor wafers subsequently polished by the modified polishing member have greater flatness than the selected semiconductor wafer;

(g) polishing another semiconductor wafer with the modified polishing member, said another semiconductor wafer being secured to a polishing block during polishing by the modified polishing member, the polishing block temperature being approximately equal to the temperature $T_{P1}$ at the onset of polishing of said another semiconductor wafer;

(h) serially repeating step (g) for a second plurality of semiconductor wafers so that the semiconductor wafers of the second plurality are polished one after the other by the modified polishing member.

38. A method as set forth in claim 37 wherein flatness characteristics of the selected semiconductor wafer are measured by determining whether the selected semiconductor wafer is convex or concave, and wherein the shape of the polishing member based on the flatness measurements so made is modified by decreasing the concavity of the polishing member if the selected semiconductor wafer is convex and decreasing the convexity of the polishing member if the selected semiconductor wafer is concave.

39. A method as set forth in claim 36 wherein securing the semiconductor wafer to the polishing block comprises wax mounting the semiconductor wafer to the polishing block.

40. A method as set forth in claim 36 wherein controlling the temperature of the polishing block comprises spraying a temperature controlling fluid on the semiconductor wafer.

41. A method as set forth in claim 36 wherein controlling the temperature of the polishing block comprises heating a second face of the polishing block, the second face of the polishing block being opposite the first face of the polishing block.

42. A method as set forth in claim 36 further comprising maintaining the temperature of the polishing member at approximately the temperature $T_{P1}$ during polishing of the semiconductor wafer by the rotating polishing member.

43. A method as set forth in claim 42 wherein $T_{P1}$ is at least 50° C.

44. A method as set forth in claim 42 wherein $T_{P1}$ is at least 58° C.

45. A method as set forth in claim 36 wherein the polishing block temperature at the onset of polishing is within 1° C. of the temperature $T_{P1}$.

46. A method as set forth in claim 36 wherein polishing of each of said plurality of semiconductor wafers by the rotating polishing member is initiated a fixed time interval $t_{b-p}$ after the semiconductor wafer is secured to the polishing block.

47. A method of polishing semiconductor wafers comprising:

(a) heating a polishing block to a temperature approximately equal to a temperature $T_h$;

(b) securing a semiconductor wafer to the polishing block so that a first face of the semiconductor wafer opposes a first face of the polishing block;

(c) polishing a second face of the semiconductor wafer with a polishing member, the polishing of the semiconductor wafer by the polishing member being initiated a fixed duration $t_{b-p}$ after the semiconductor wafer is secured to the polishing block;

(d) removing the semiconductor wafer from the polishing block;

(e) serially repeating steps (a)–(d) for a plurality of semiconductor wafers.

48. A method as set forth in claim 47 wherein the polishing of the semiconductor wafer by the rotating polishing member is initiated a fixed time interval $t_{h-p}$ after the polishing block is heated to a temperature approximately equal to the temperature $T_h$.

49. A method as set forth in claim 48 wherein the time interval $t_{h-p}$ is greater than the time interval $t_{b-p}$.

50. A method of polishing a plurality of semiconductor wafers comprising:

applying a coat of bonding agent to a first face of a first polishing block;

bonding a first semiconductor wafer to the first polishing block, a first face of the first semiconductor wafer opposing the first face of the first polishing block;

polishing a second face of the first semiconductor wafer with a rotating polishing member;

removing the first semiconductor wafer from the first polishing block after completion of polishing of the second face of the first semiconductor wafer by the polishing member;

applying a coat of bonding agent to a first face of a second polishing block before completion of polishing of the second face of the first semiconductor wafer by the polishing member;

bonding a second semiconductor wafer to the second polishing block before completion of polishing of the second face of the first semiconductor wafer by the polishing member, a first face of the second semiconductor wafer opposing the first face of the second polishing block;

polishing a second face of the second semiconductor wafer with the rotating polishing member;

removing the second semiconductor wafer from the second polishing block after completion of polishing of the second face of the second semiconductor wafer by the polishing member;

applying a coat of bonding agent to a first face of a third polishing block before completion of polishing of the second face of the first semiconductor wafer by the polishing member;

bonding a third semiconductor wafer to the third polishing block before completion of polishing of the second face of the second semiconductor wafer by the polishing member, a first face of the third semiconductor wafer opposing the first face of the third polishing block;

polishing a second face of the third semiconductor wafer with the rotating polishing member;

removing the third semiconductor wafer from the third polishing block after completion of polishing of the second face of the third semiconductor wafer by the polishing member;

removing the coat of bonding agent from the first face of the first polishing block and then applying a second coat of bonding agent to the first face of the first polishing block before completion of polishing of the second face of the third semiconductor wafer by the polishing member;

bonding a fourth semiconductor wafer to the first polishing block before completion of polishing of the second face of the third semiconductor wafer by the polishing member, a first face of the fourth semiconductor wafer opposing the first face of the first polishing member;

polishing a second face of the fourth semiconductor wafer with the rotating polishing member.

51. A method as set forth in claim 50 wherein the first, second and third wafers are consecutively polished by the polishing member.

52. A method as set forth in claim 50 wherein each semiconductor wafer is polished by the polishing member for a fixed duration $t_{p1}$.

53. A method as set forth in claim 52 wherein the duration $t_{p1}$ is less than seven minutes.

54. A method as set forth in claim 50 wherein the first, second and third wafers are consecutively bonded to their corresponding polishing blocks, and consecutively polished by the polishing member.

55. A method as set forth in claim 54 wherein the second wafer is bonded to the second polishing block a duration $t_b$ after the first wafer is bonded to the first polishing block, and the polishing member completes polishing of the second wafer a duration $t_c$ after it completes polishing of the first wafer, the duration $t_b$ being approximately equal to the duration $t_c$.

56. A method of polishing semiconductor wafers comprising:

(a) securing a semiconductor wafer to a polisher;

(b) polishing a face of the semiconductor wafer with a rotating polishing member of the polisher;

(c) serially repeating steps (a) and (b) for a plurality of semiconductor wafers so that the semiconductor wafers are polished one after the other by the polisher;

(d) measuring flatness characteristics of at least one of the plurality semiconductor wafers after it is polished by the polishing member;

(e) modifying the shape of the polishing member based on the measured flatness characteristics such that semiconductor wafers subsequently polished by the modified polishing member have improved flatness.

57. A method as set forth in claim 56 wherein flatness characteristics of said at least one semiconductor wafer are measured by determining whether the selected semiconductor wafer is convex or concave, and wherein the step of modifying the shape of the polishing member based on the measured flatness characteristics comprises the step of decreasing the concavity of the polishing member if said at least one semiconductor wafer is convex and decreasing the convexity of the polishing member if said at least one semiconductor wafer is concave.

58. A method as set forth in claim 57 wherein the polishing member is generally circular in shape, and wherein the step of decreasing the concavity of the polishing member comprises the steps of:

rubbing an abrading member against the polishing member with the center of the abrading member travelling along a first chord having a midpoint on the polishing member;

rubbing the abrading member against the polishing member with the center of the abrading member travelling along a second chord having a midpoint spaced angularly of the midpoint of the first chord by a predetermined amount;

rubbing the abrading member against the polishing member with the center of the abrading member travelling along third and other chords, each of said third and other chords having a midpoint spaced angularly from the midpoint of the immediately preceding chord by said predetermined amount.

59. A method as set forth in claim 58 wherein the midpoint of each of said chords is located a distance $D_P$ from the periphery of the polishing member, the distance $D_P$ being approximately equal to a width of the polishing member which is unused during polishing.

60. A method as set forth in claim 59 wherein said predetermined amount is approximately 10°.

61. A method as set forth in claim 57 wherein the polishing member is generally circular in shape, and wherein the step of decreasing the convexity of the polishing member comprises the steps of rubbing an abrading member across the polishing member with the center of the abrading member travelling generally along diametrical lines angularly spaced from each other by a predetermined amount.

62. A method as set forth in claim 61 wherein said predetermined amount is approximately 10°.

63. Apparatus as set forth in claim 1 further comprising means for substantially isolating the wax mounting apparatus from airborne particulates generated by the polisher.

64. Apparatus as set forth in claim 63 wherein the housing comprises a first cabinet containing the wax mounting apparatus and a second cabinet containing the polisher, the first and second cabinets being adjacent to one another and having an opening for passage of the polishing block and semiconductor wafer mounted thereon between the first and second cabinets without leaving the housing.

65. Apparatus as set forth in claim 64 wherein said means for substantially isolating the wax mounting apparatus from airborne particulates comprises means for creating a pressure differential between the first and second cabinets whereby air flows from the first cabinet to the second cabinet for isolating the first cabinet from the airborne particulates in the second cabinet.

66. Apparatus as set forth in claim 65 wherein said pressure differential creating means comprises at least one fan mounted for pressurizing the first cabinet to a greater pressure than the second cabinet.

67. A method of polishing a plurality of semiconductor wafers comprising the steps of:

serially applying coats of a bonding agent to first faces of the polishing blocks;

serially bonding the semiconductor wafers to the polishing blocks, the semiconductor wafers having first faces opposing the first faces of the polishing blocks;

serially polishing second faces of the semiconductor wafers, each polishing block and semiconductor wafer being polished consecutively;

serially removing the semiconductor wafers from the polishing blocks after completion of polishing;

serially removing the wax from each polishing block after removal of the semiconductor wafer therefrom, the polishing block having completed one cycle of operation of the apparatus upon removal of the semiconductor wafer;

the step of serially bonding the semiconductor wafers to the polishing blocks comprising the step of bonding the semiconductor wafers to one of the polishing blocks prior to completion of polishing of the immediately preceding semiconductor wafer mounted to the immediately preceding polishing block;

the step of serially bonding the semiconductor wafers to the polishing blocks comprising the step of serially bonding a second of the semiconductor wafers to one of the polishing blocks following removal of a first of the semiconductor wafers previously bonded to said one polishing block, said step of bonding the second semiconductor wafer being completed prior to completion of polishing of the semiconductor wafer mounted on the polishing block which said one polishing block immediately precedes.

* * * * *